(12) United States Patent
Inaba et al.

(10) Patent No.: US 11,062,770 B2
(45) Date of Patent: Jul. 13, 2021

(54) MEMORY DEVICE

(71) Applicant: KIOXIA CORPORATION, Tokyo (JP)

(72) Inventors: Tsuneo Inaba, Kamakura Kanagawa (JP); Atsushi Kawasumi, Fujisawa Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/910,826

(22) Filed: Jun. 24, 2020

(65) Prior Publication Data

US 2021/0090645 A1    Mar. 25, 2021

(30) Foreign Application Priority Data

Sep. 19, 2019    (JP) .............................. JP2019-170699

(51) Int. Cl.
*G11C 11/00* (2006.01)
*G11C 13/00* (2006.01)
*G11C 11/16* (2006.01)

(52) U.S. Cl.
CPC .......... *G11C 13/003* (2013.01); *G11C 11/161* (2013.01); *G11C 11/1659* (2013.01); *G11C 11/1673* (2013.01); *G11C 11/1675* (2013.01); *G11C 13/0004* (2013.01); *G11C 13/004* (2013.01); *G11C 13/0069* (2013.01); *G11C 2013/0054* (2013.01); *G11C 2013/0092* (2013.01)

(58) Field of Classification Search
CPC . G11C 13/003; G11C 11/161; G11C 11/1659; G11C 11/1673
USPC .......................................................... 365/163
See application file for complete search history.

(56) References Cited

U.S. PATENT DOCUMENTS

| 8,054,675 | B2 | 11/2011 | Xi et al. | |
|---|---|---|---|---|
| 10,325,638 | B2 | 6/2019 | Inaba | |
| 2014/0056055 | A1 | 2/2014 | Ikeda et al. | |
| 2014/0173174 | A1* | 6/2014 | Frickey | G11C 16/3418 711/103 |
| 2014/0269085 | A1* | 9/2014 | Lasser | G11C 16/3418 365/185.18 |
| 2017/0032838 | A1* | 2/2017 | Park | G11C 13/0002 |
| 2017/0236568 | A1 | 8/2017 | Rho | |

FOREIGN PATENT DOCUMENTS

WO    2013076935 A1    5/2013

* cited by examiner

*Primary Examiner* — Vu A Le
(74) *Attorney, Agent, or Firm* — Holtz, Holtz & Volek PC

(57) ABSTRACT

According to an embodiment, a memory device includes a first memory cell and a second memory cell each including a variable resistance element and a switching element, and includes a read and write circuit. The circuit is configured to perform, as a first access, a write operation or a read operation on the first memory cell, and make a second access after the first access. As the second access, data is written into or read from the second memory cell, under a condition based on a type of the first access.

21 Claims, 34 Drawing Sheets

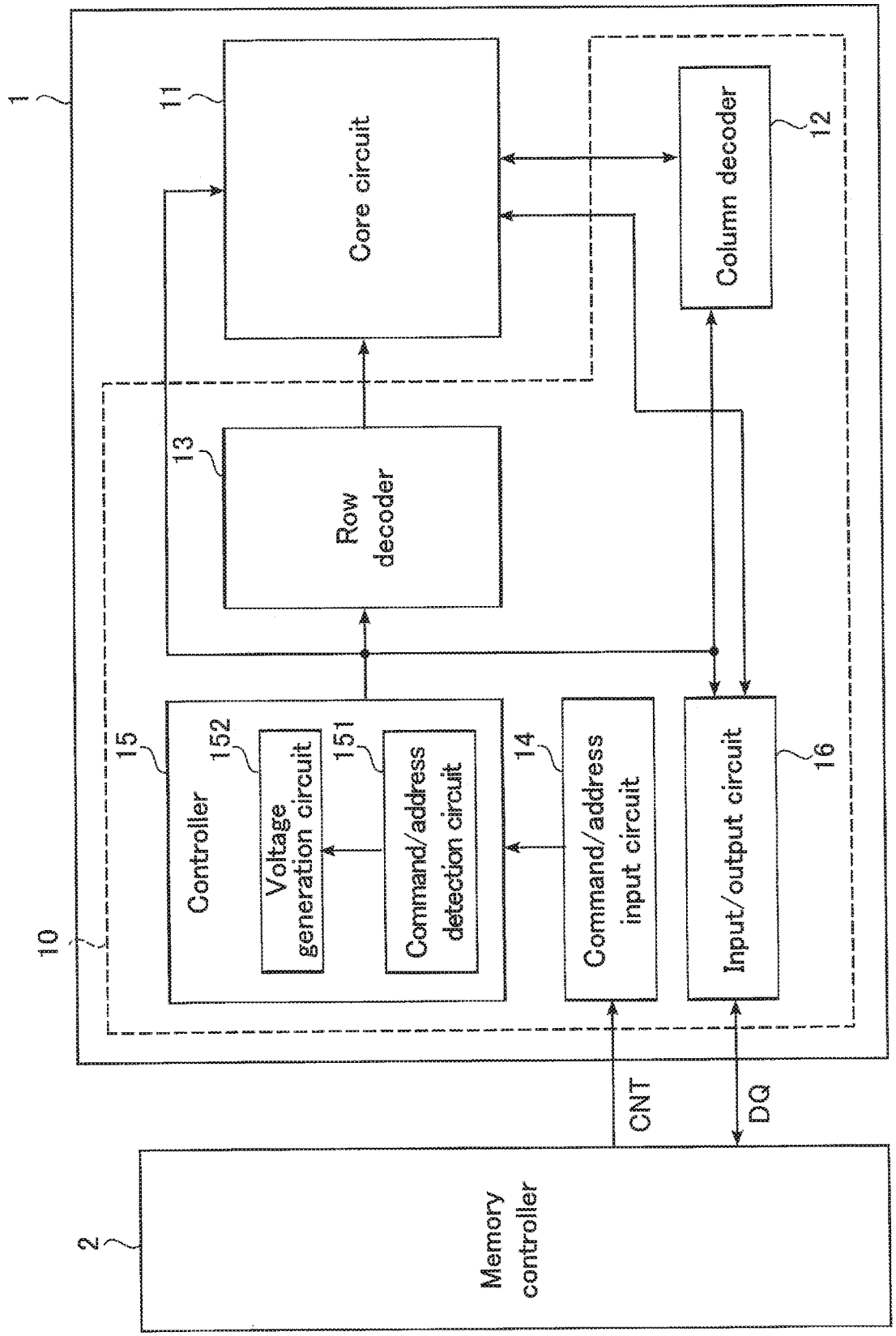
F I G. 2

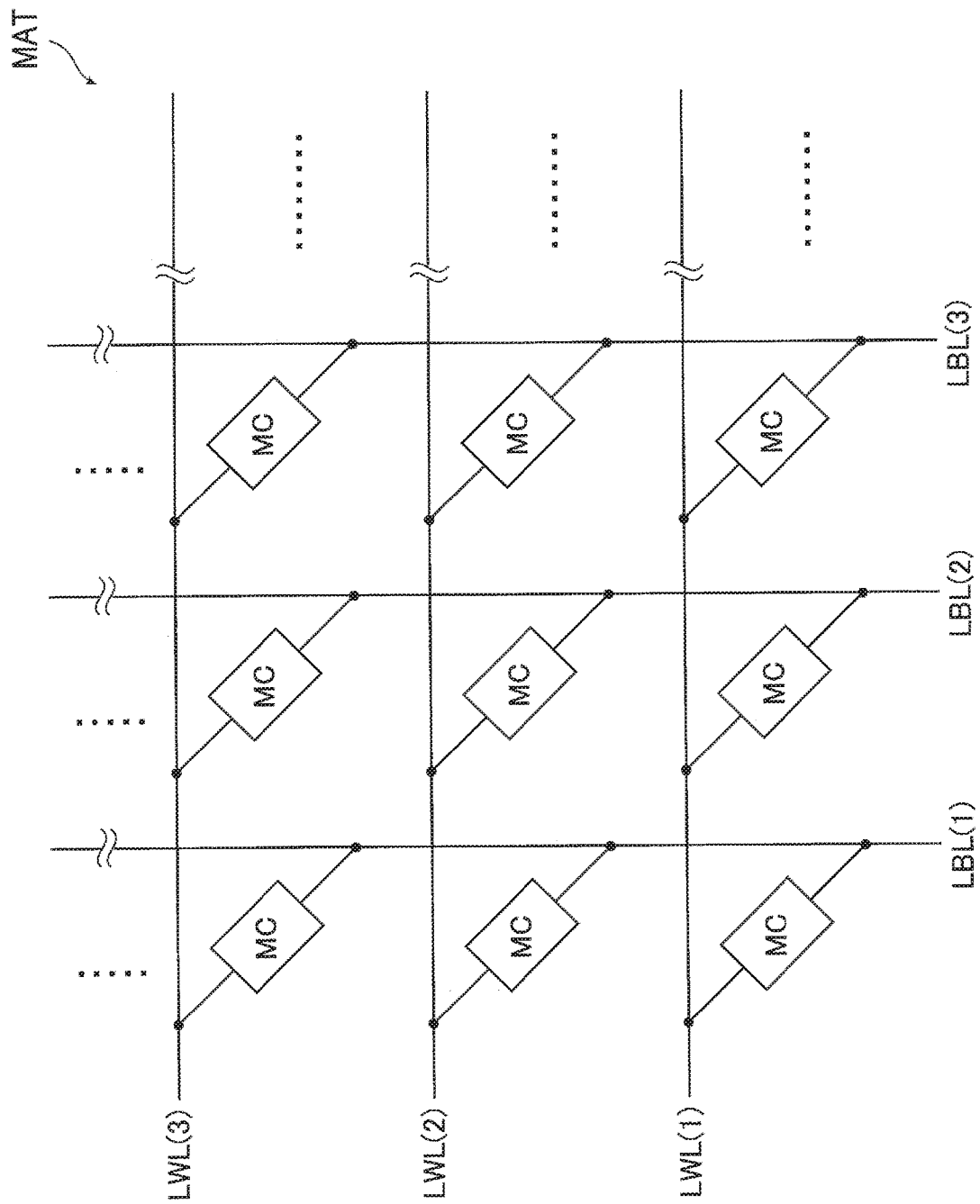
F I G. 5

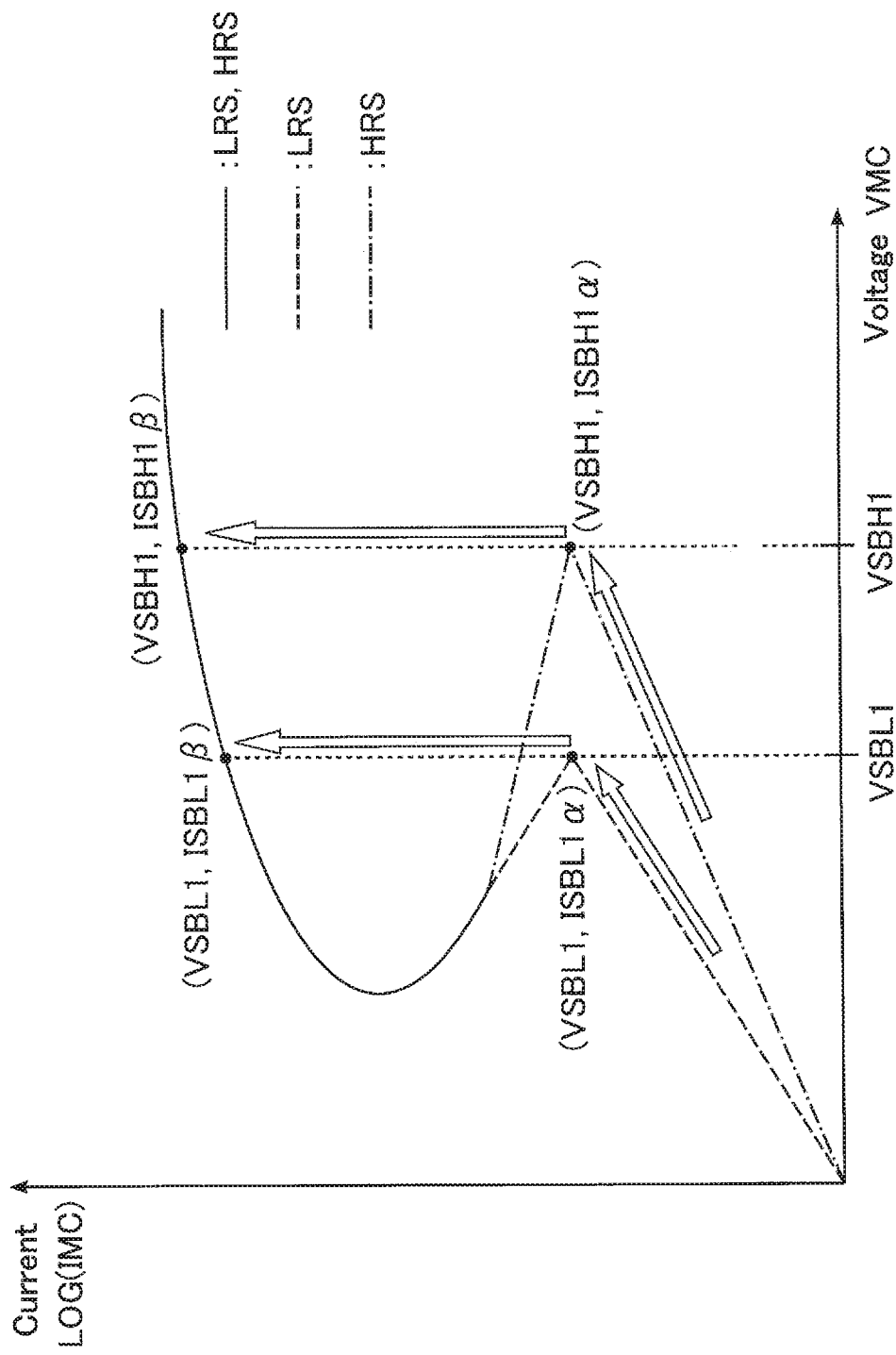
F I G. 6

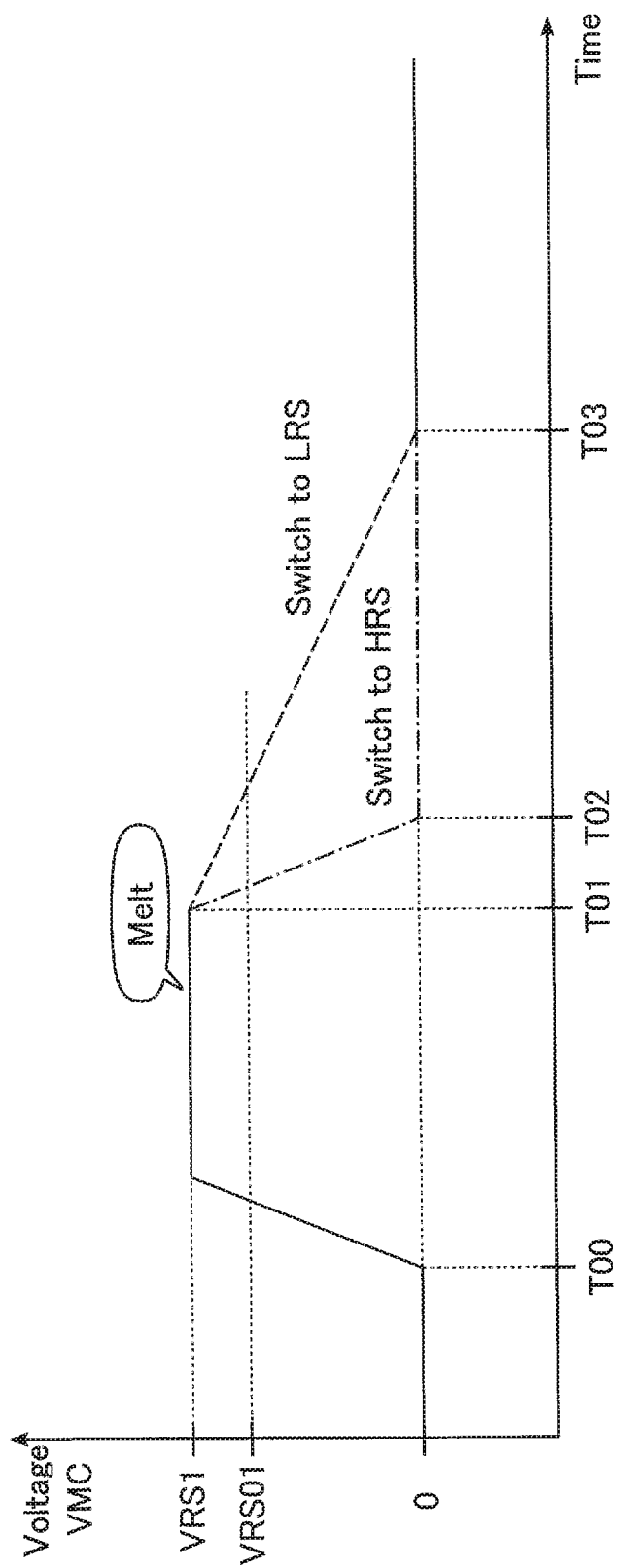
F I G. 7

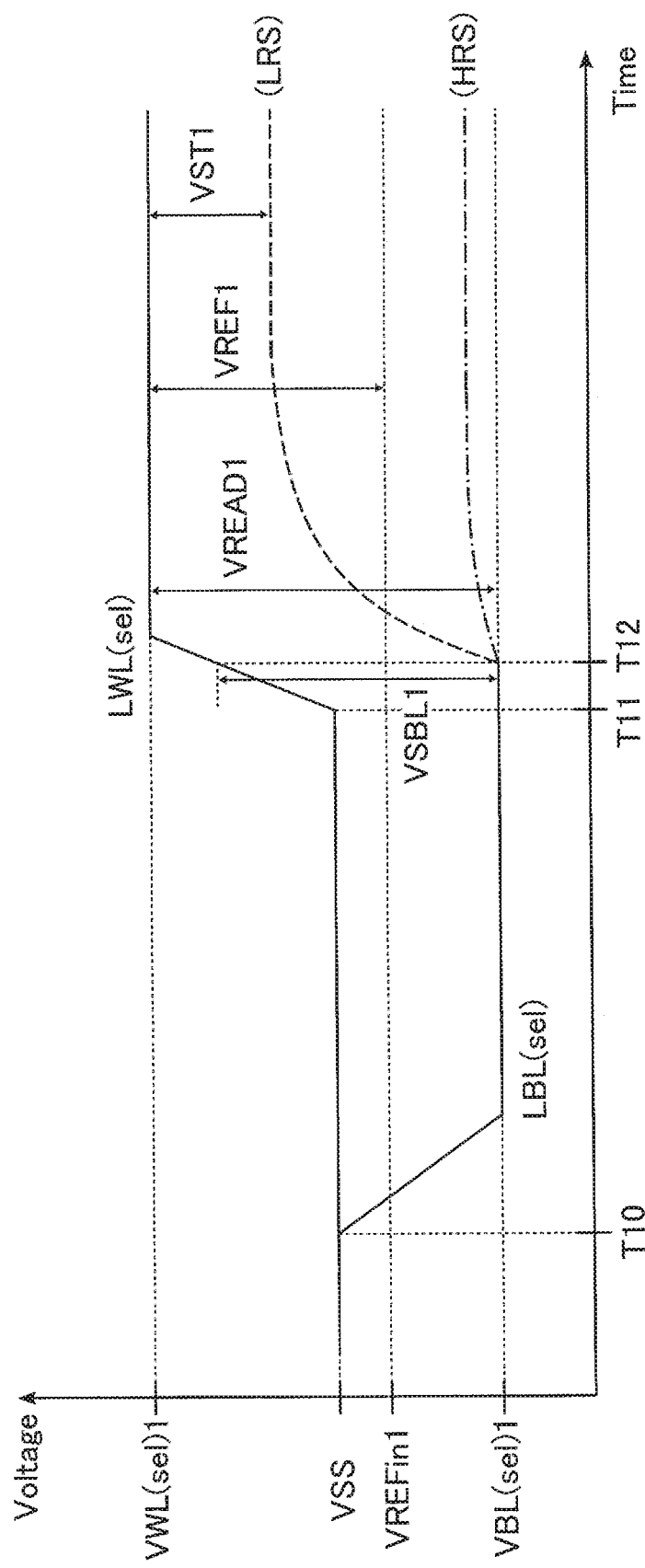
F I G. 10

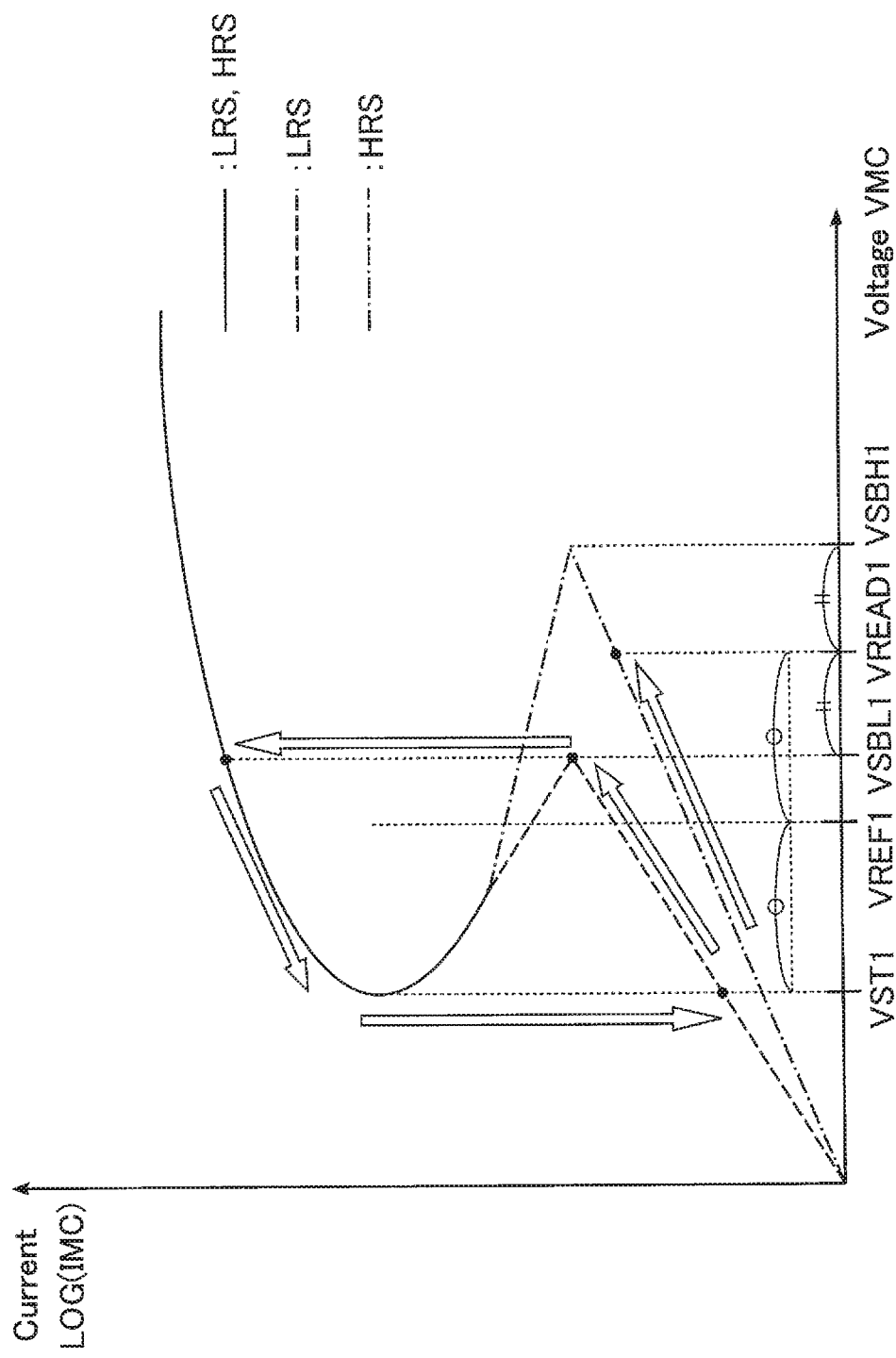
F I G. 11

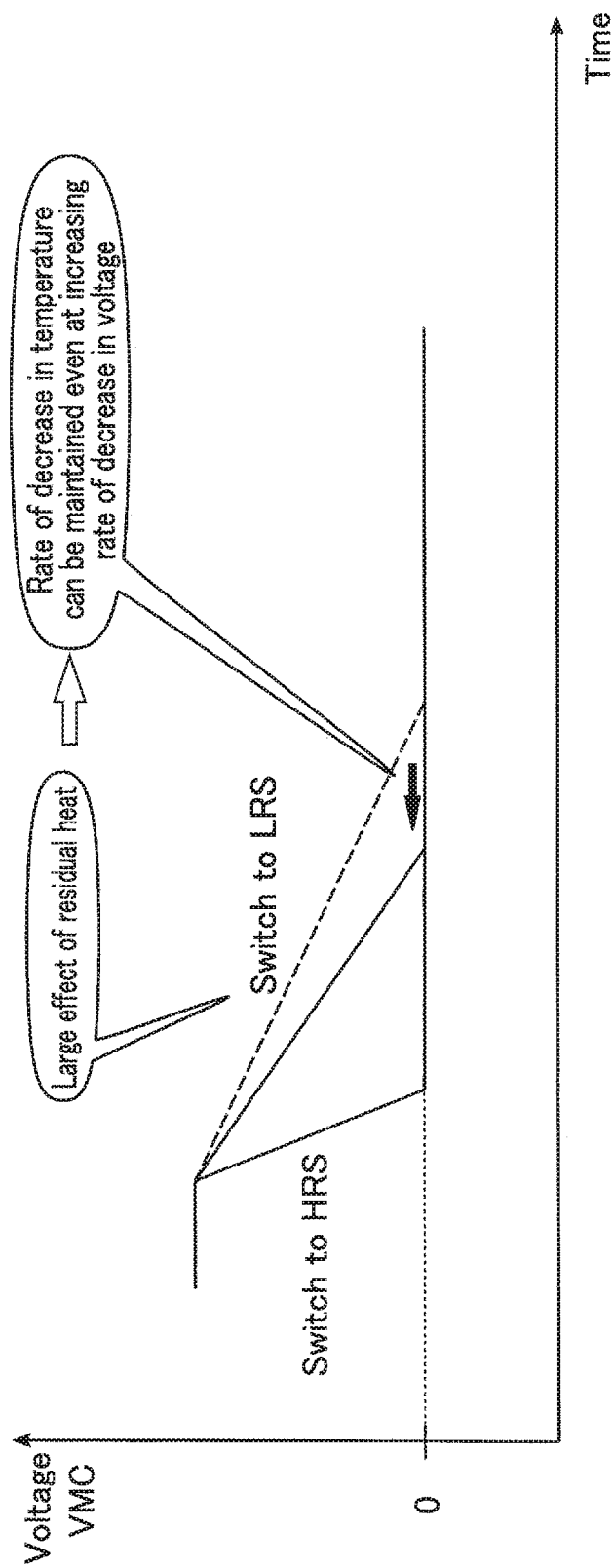
F I G. 14

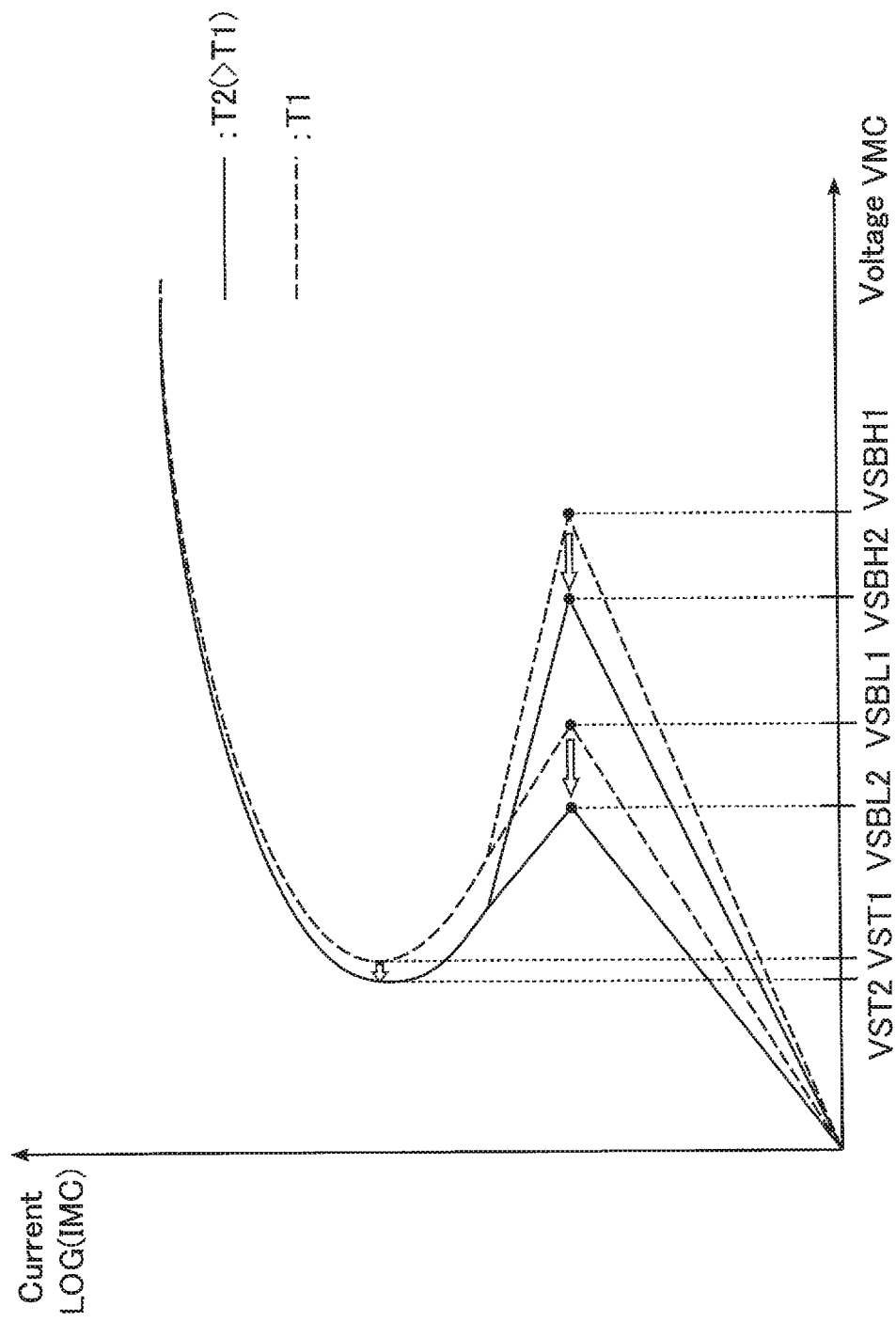
F I G. 15

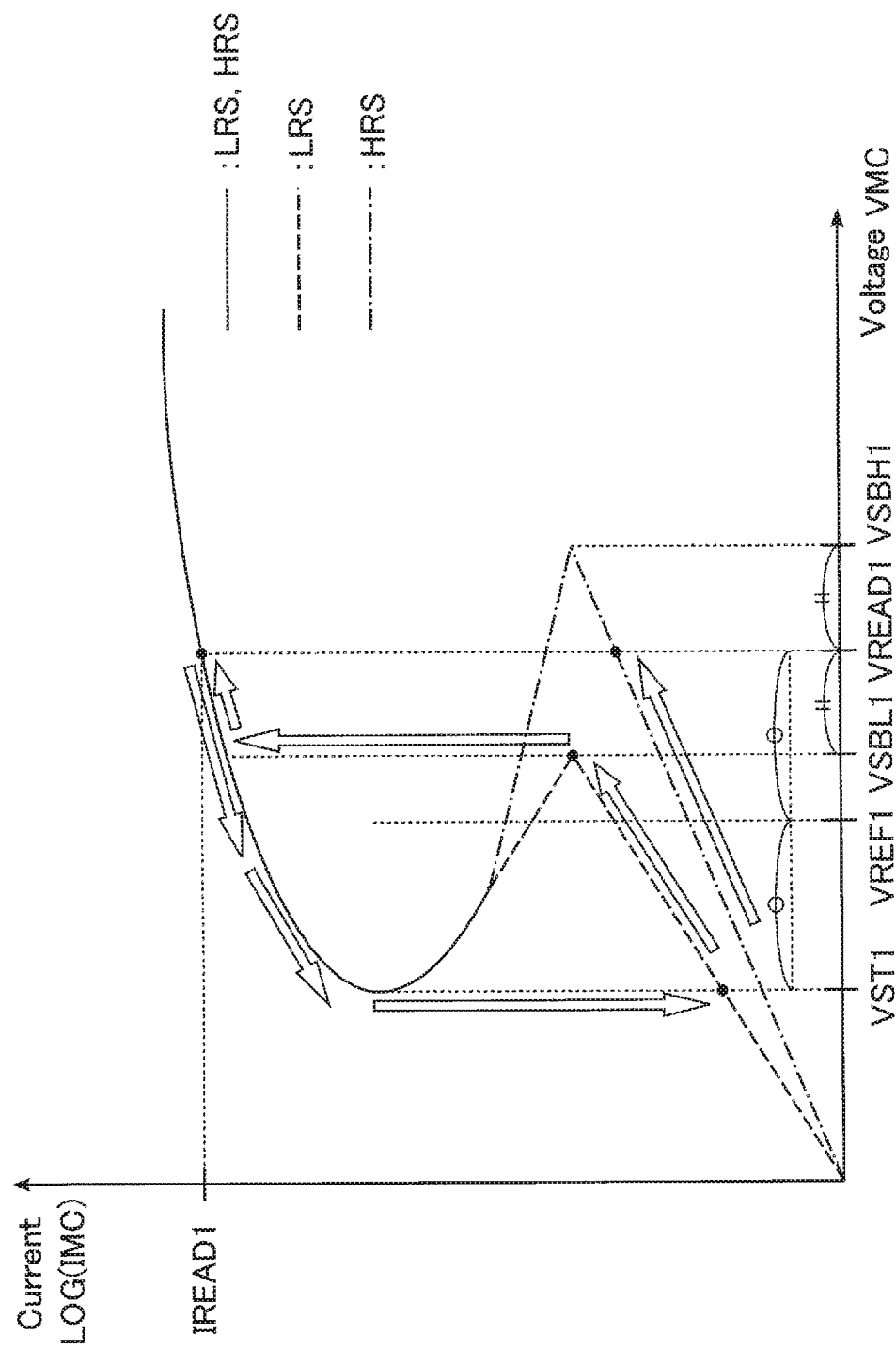
F I G. 18

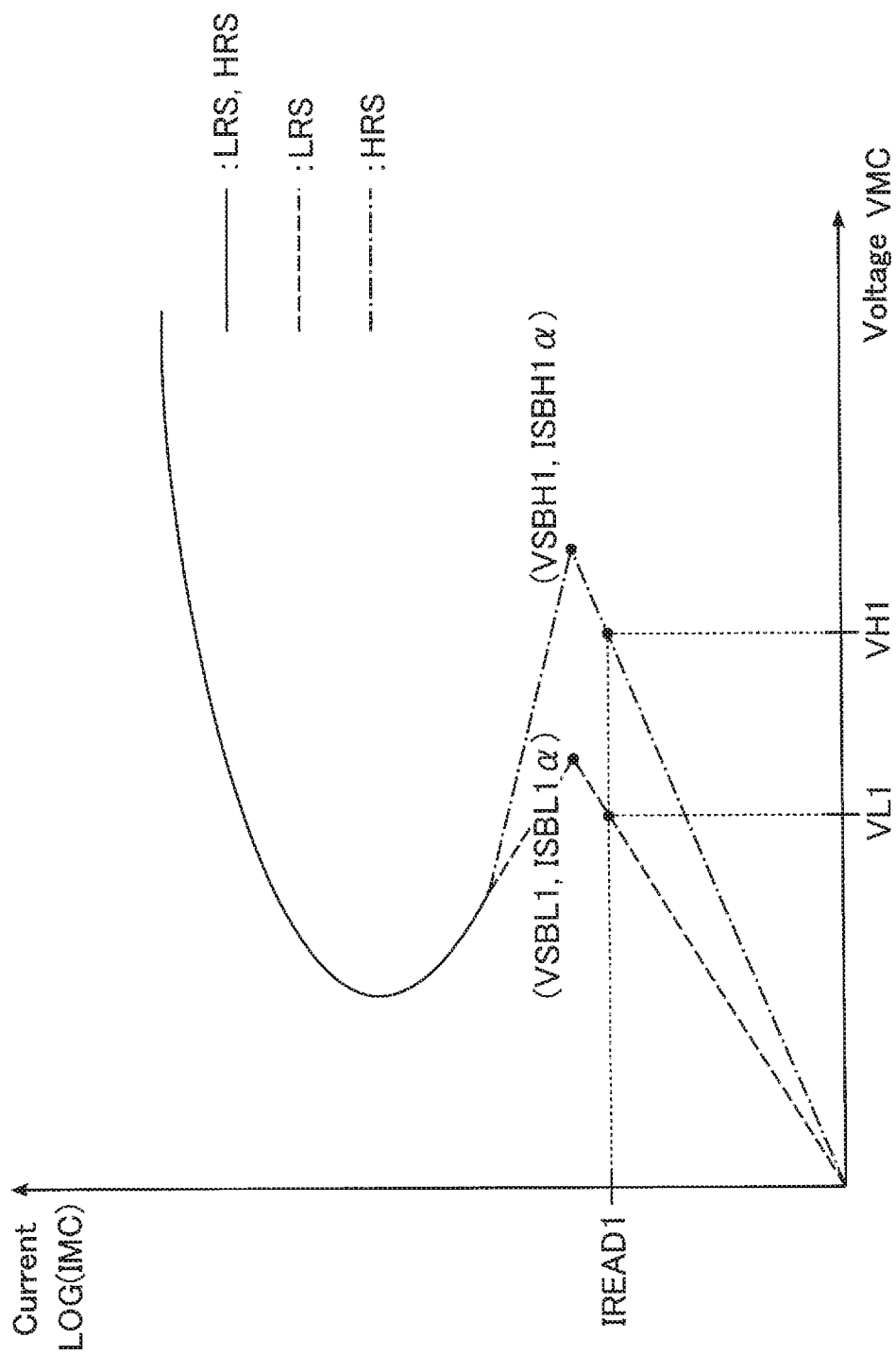
F I G. 21

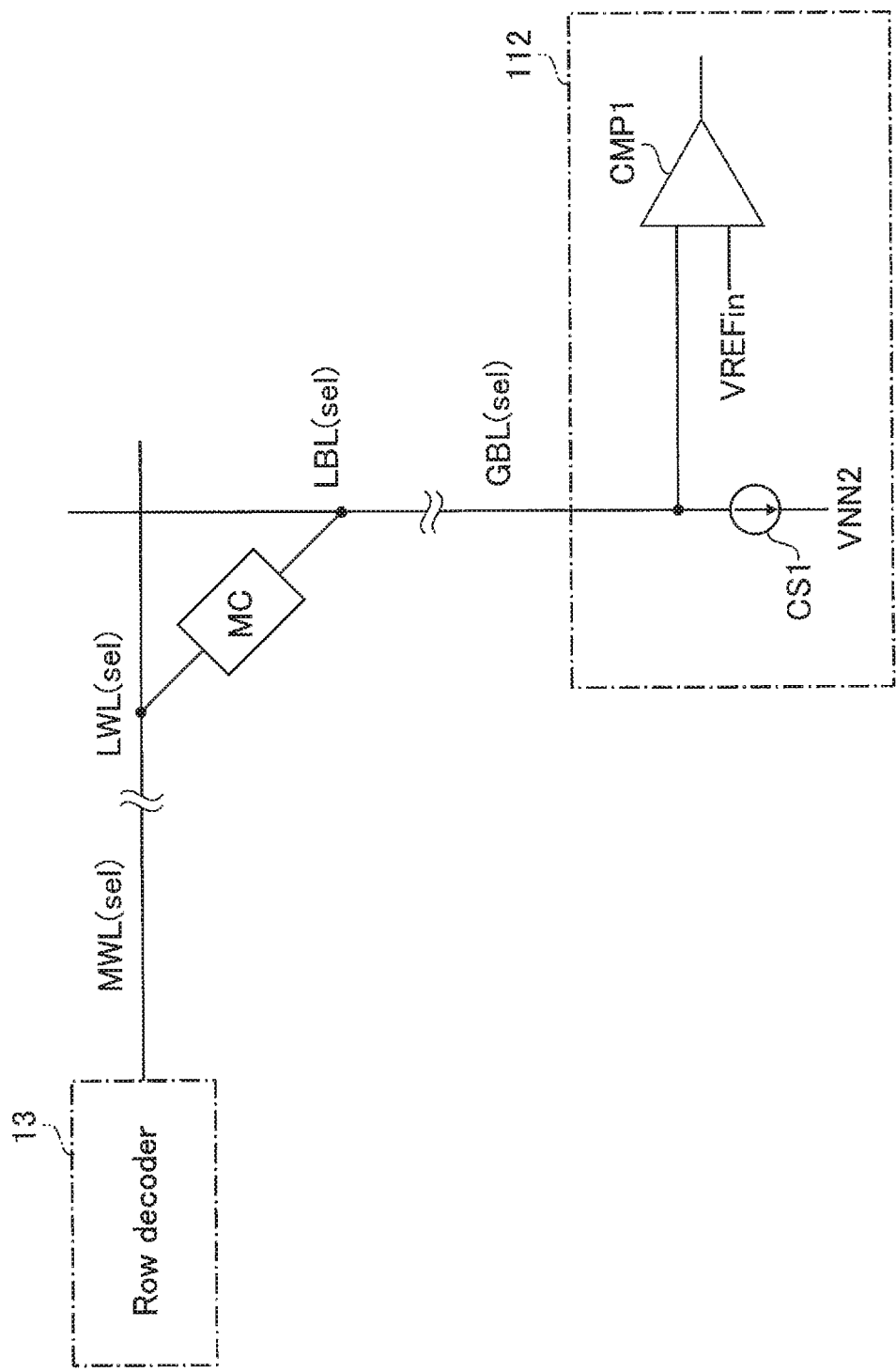
F I G. 22

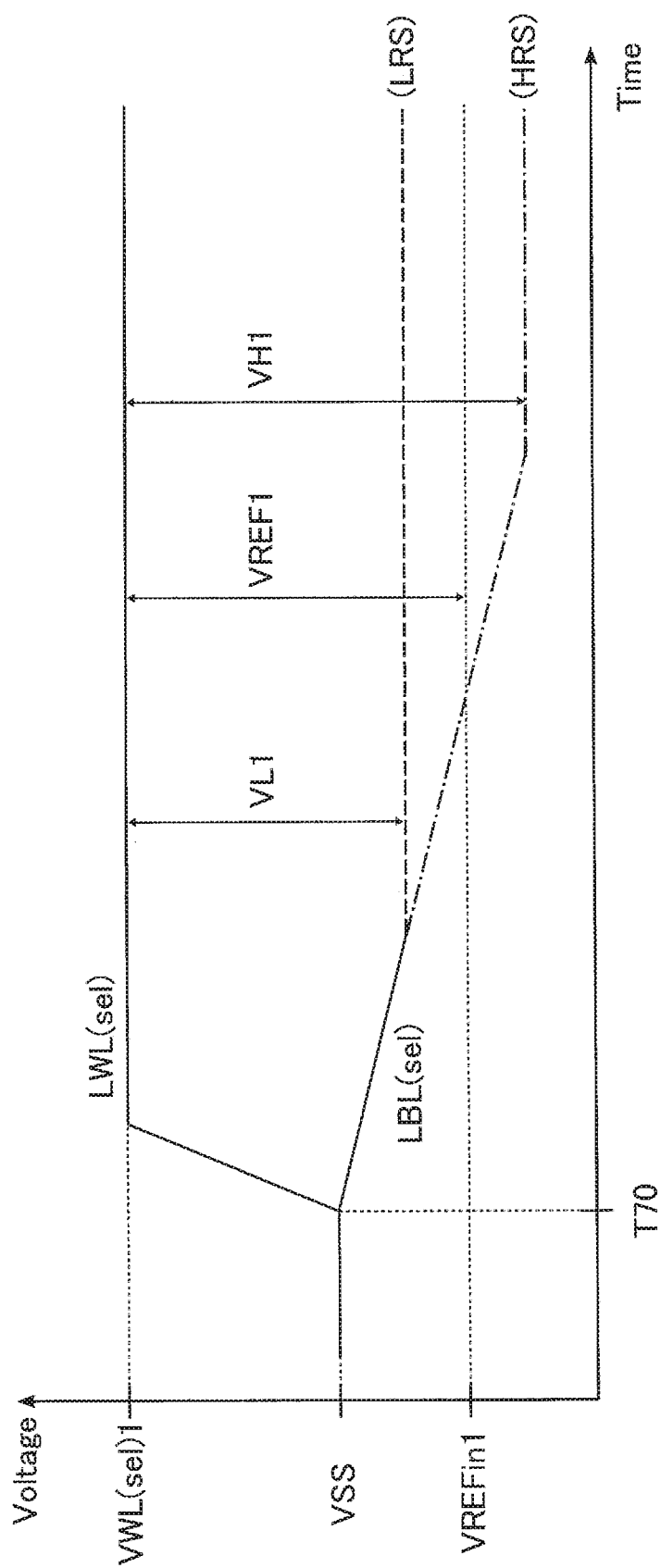
F I G. 23

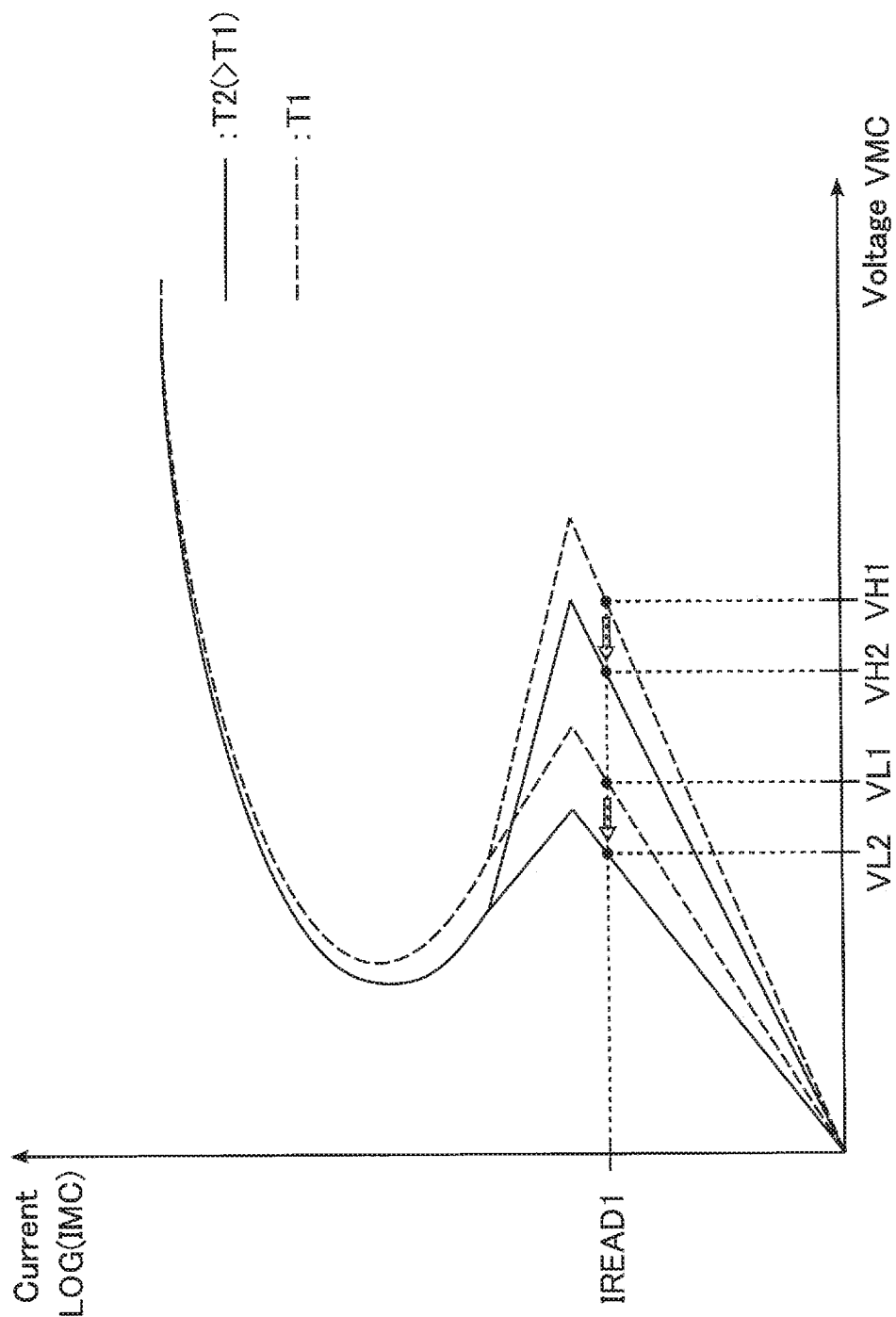
F I G. 25

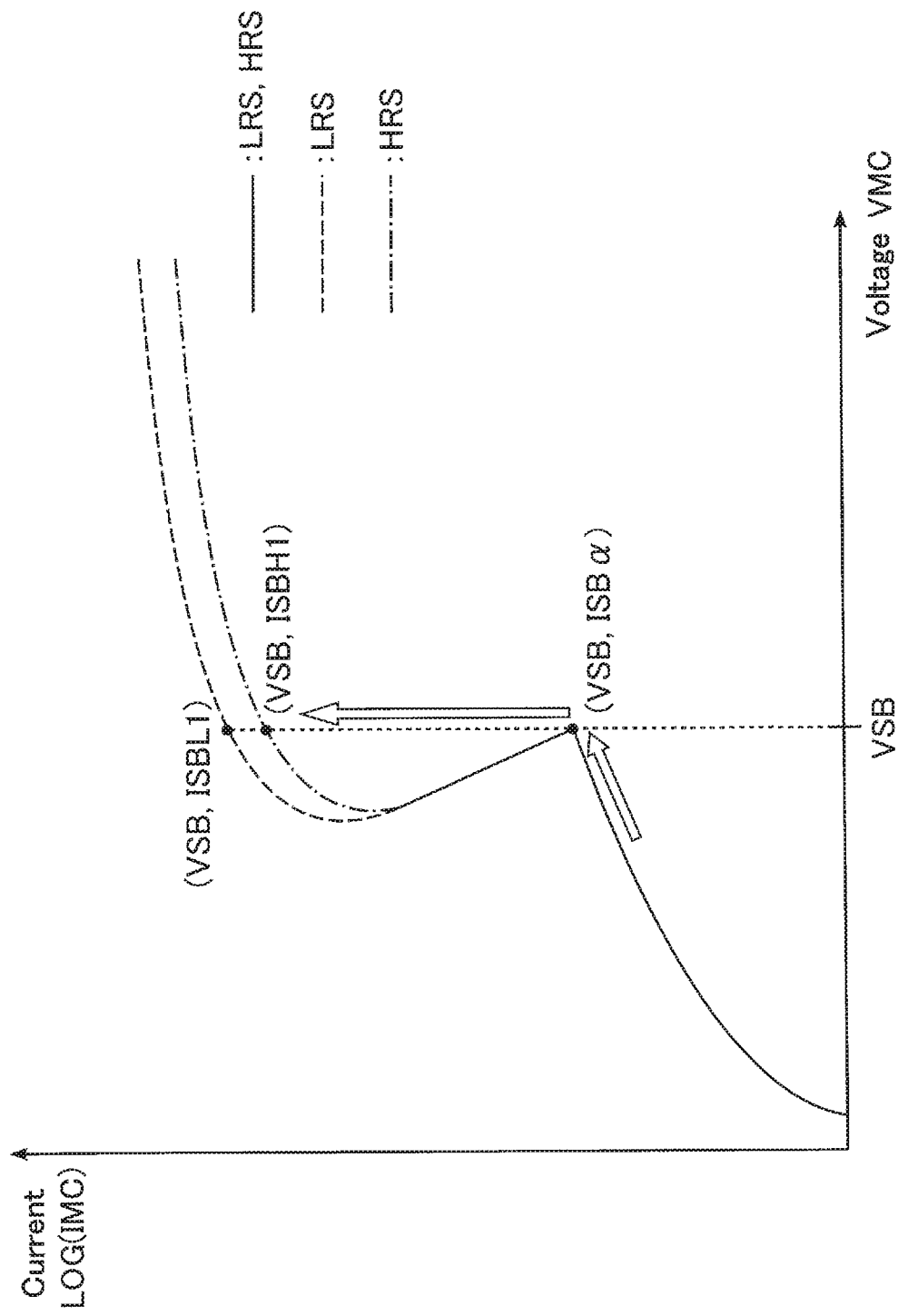
F I G. 28

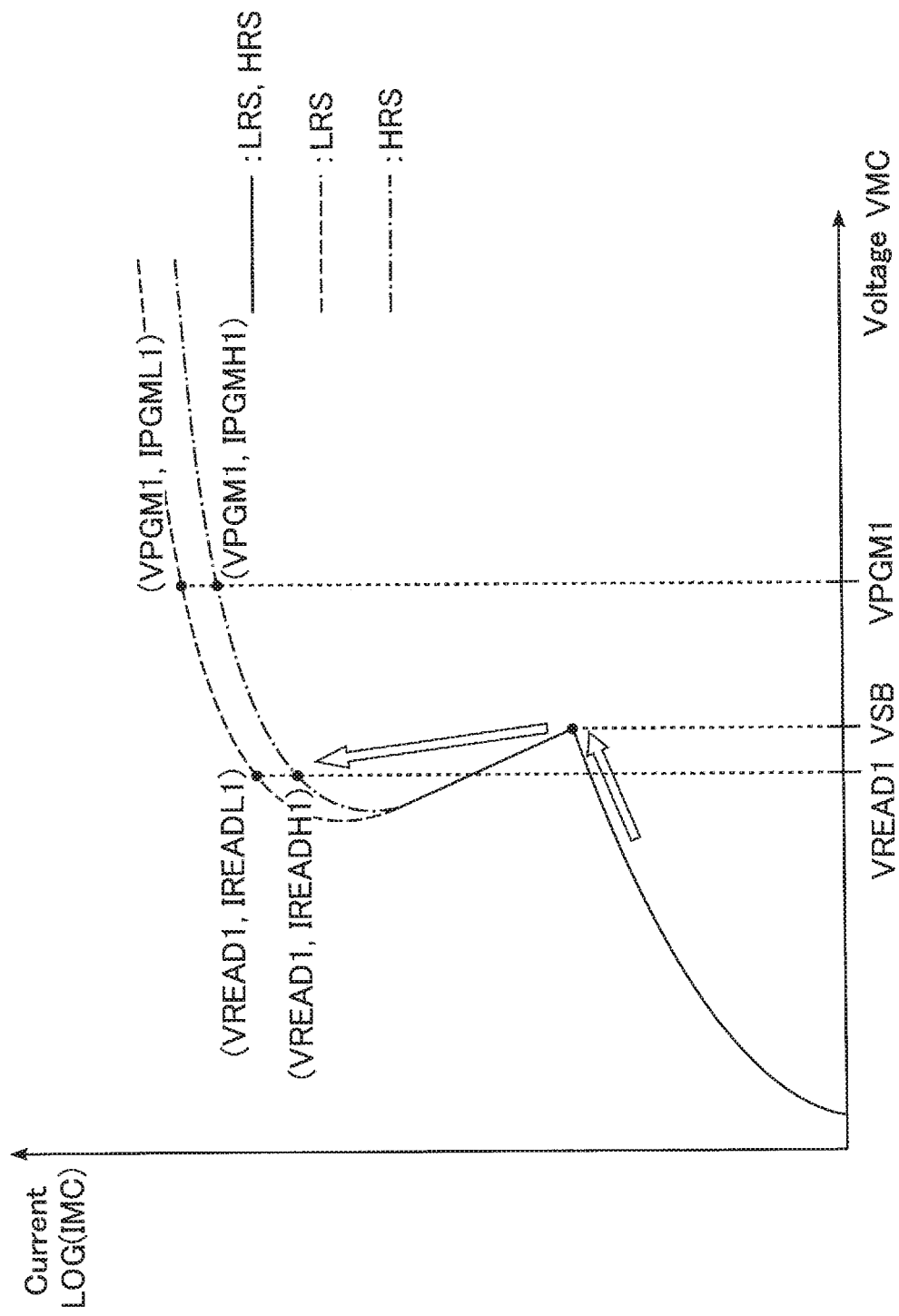
F I G. 29

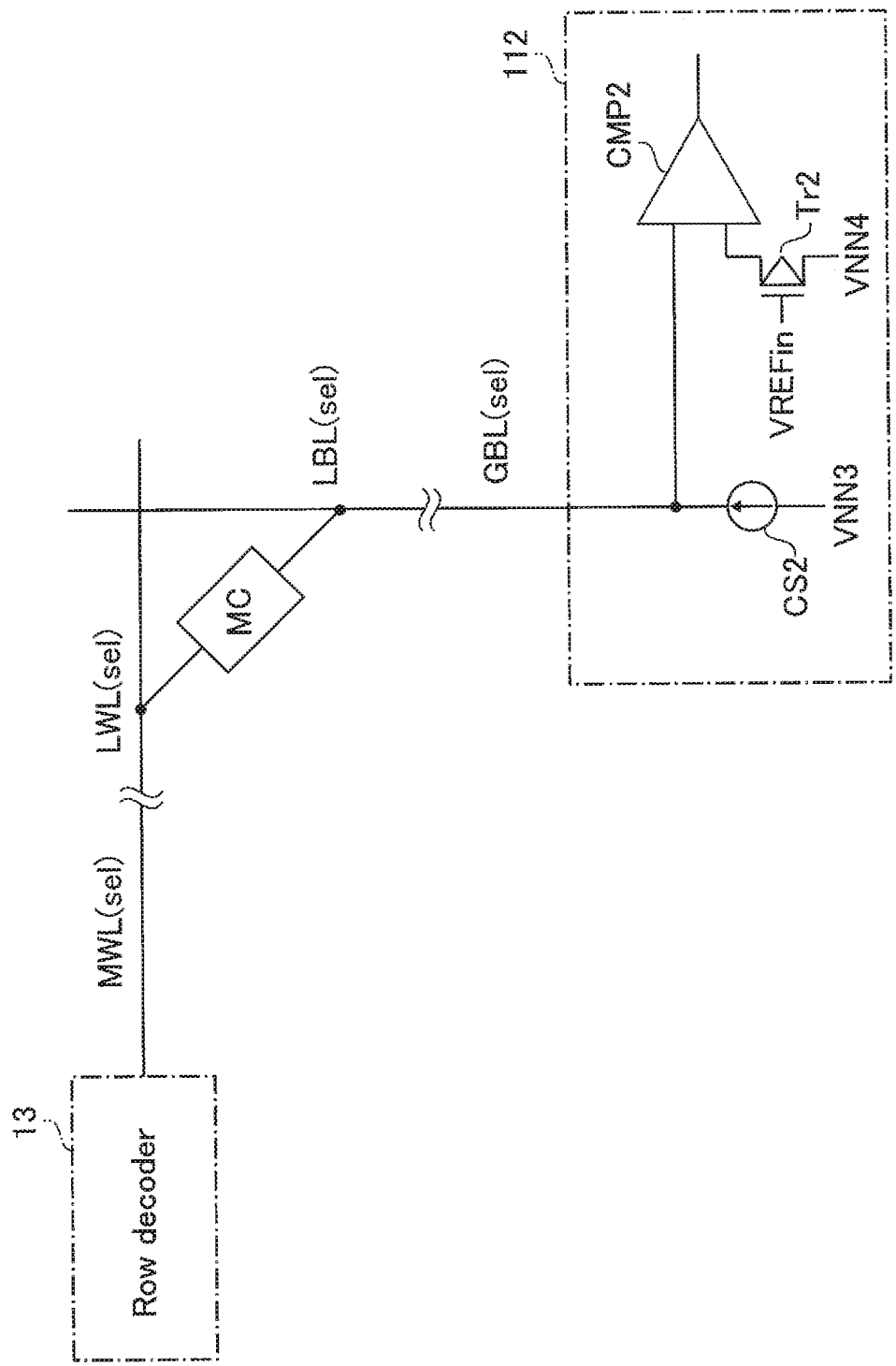
F I G. 30

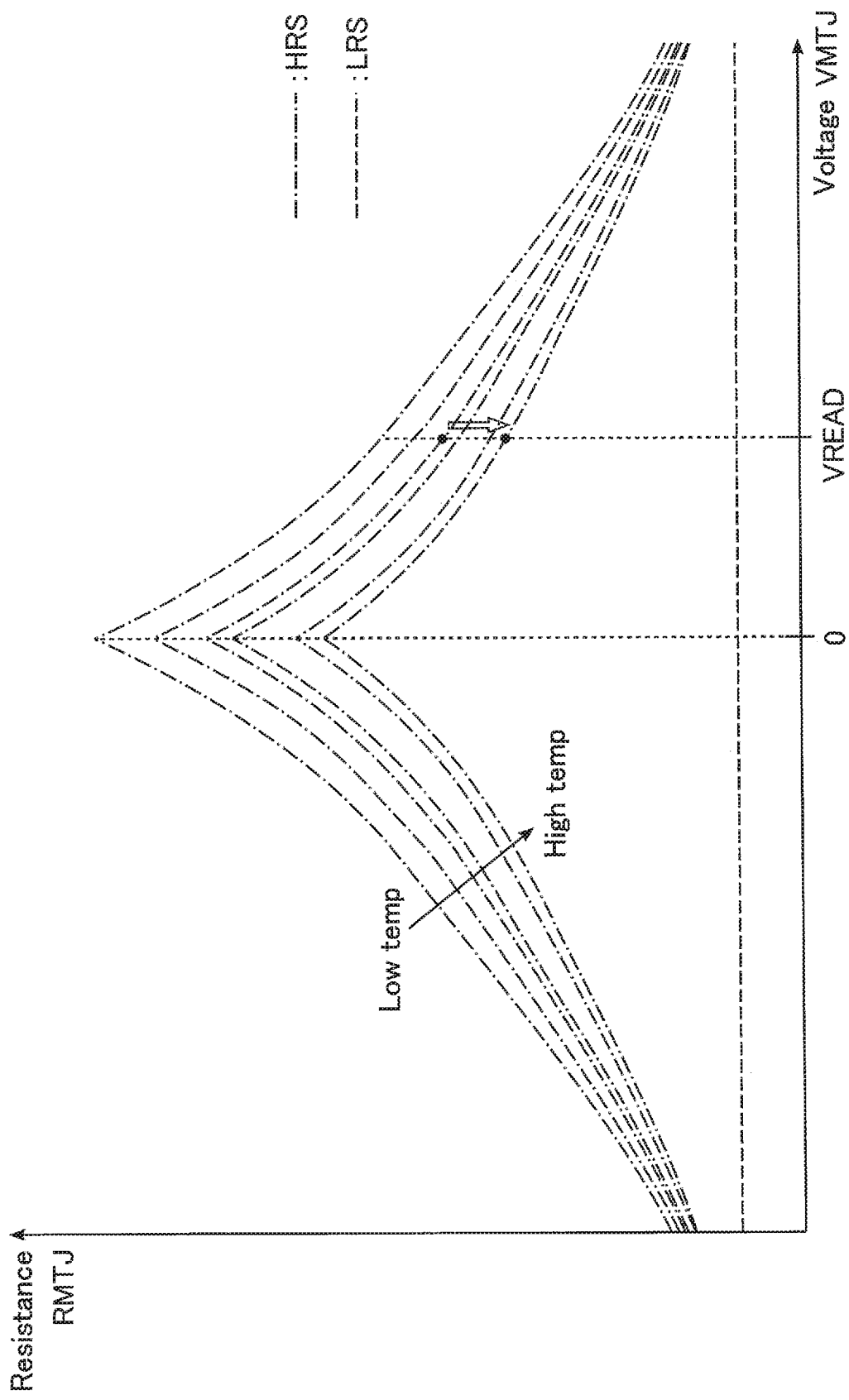
F I G. 31

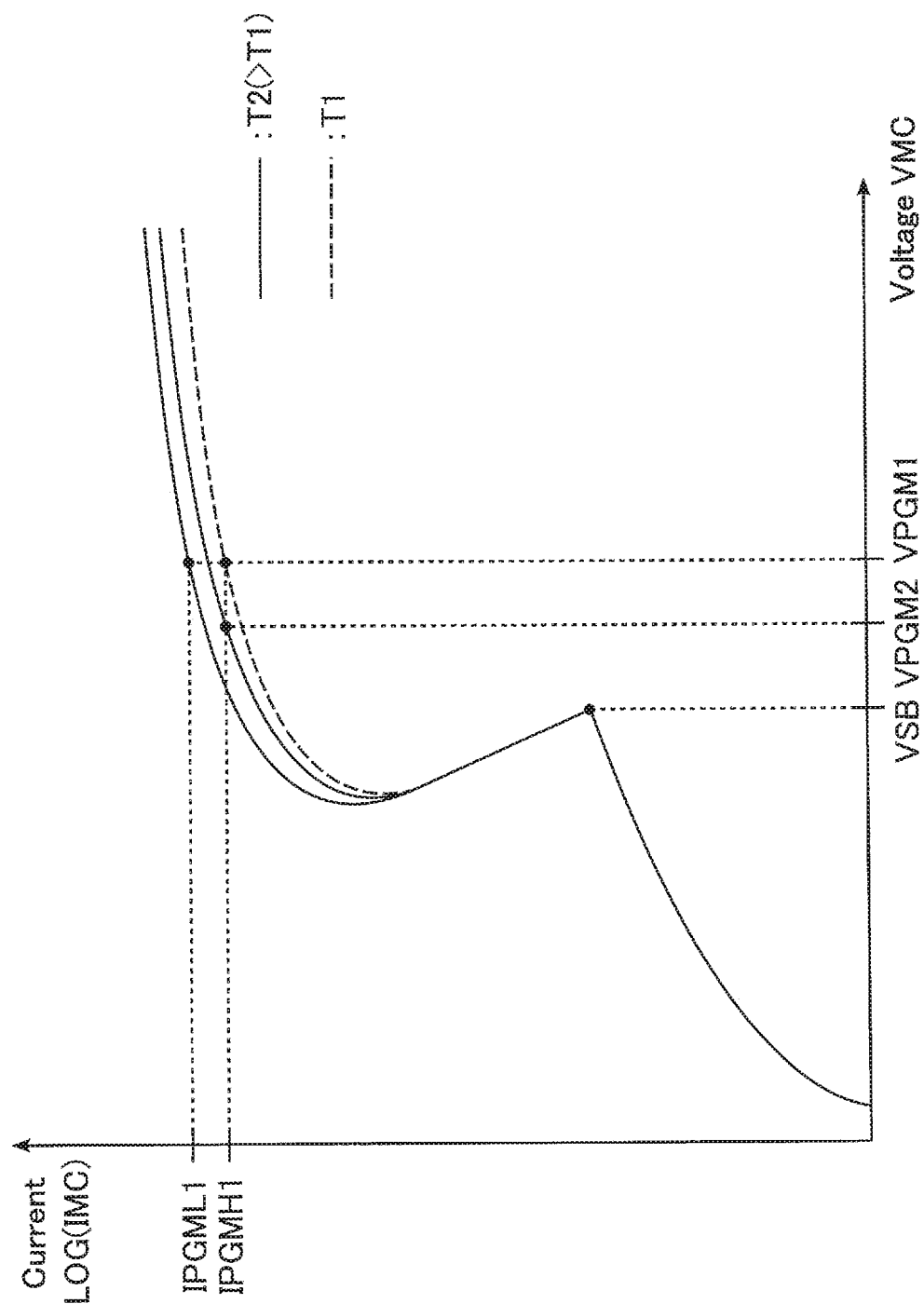
F I G. 32

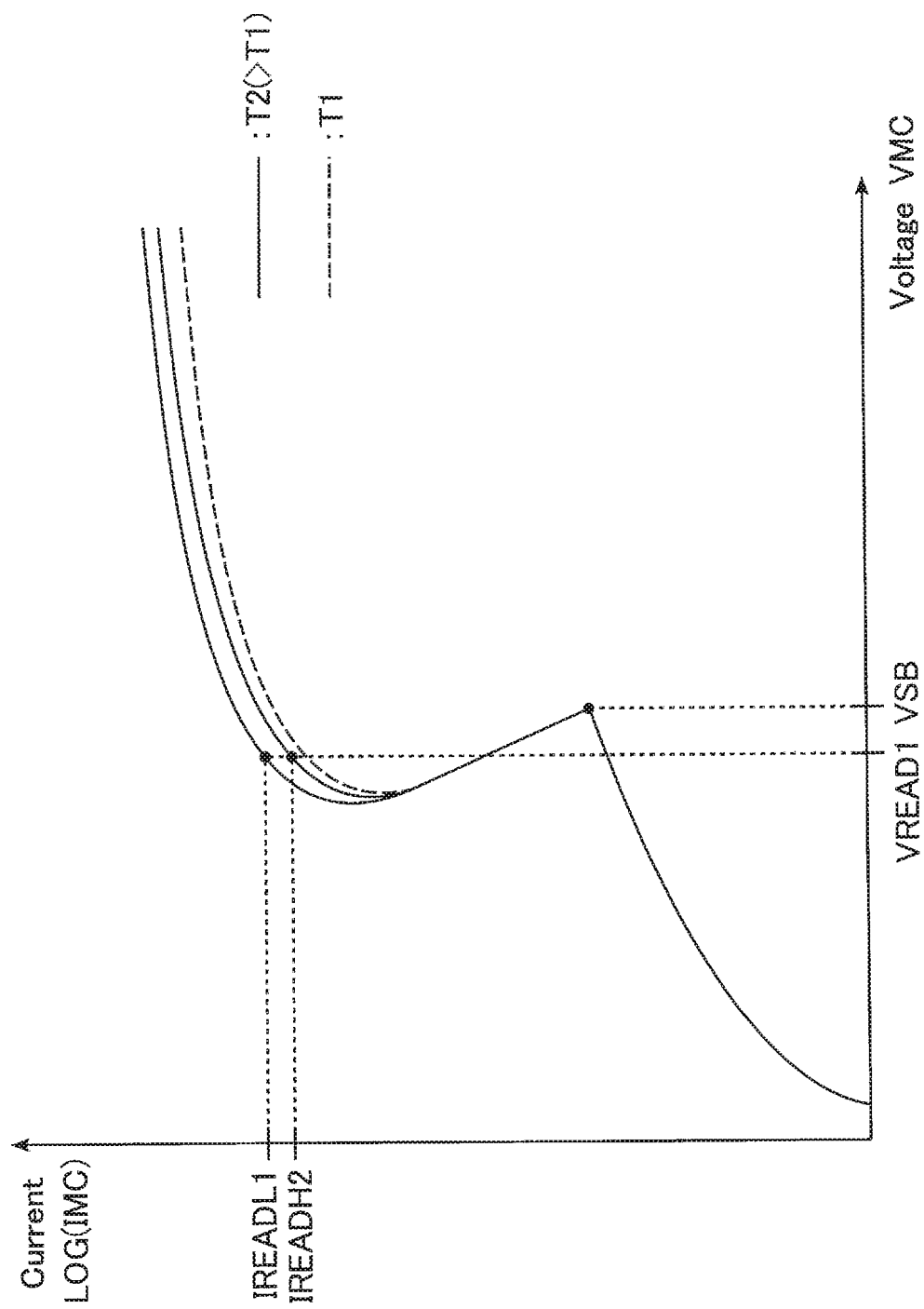
F I G. 34

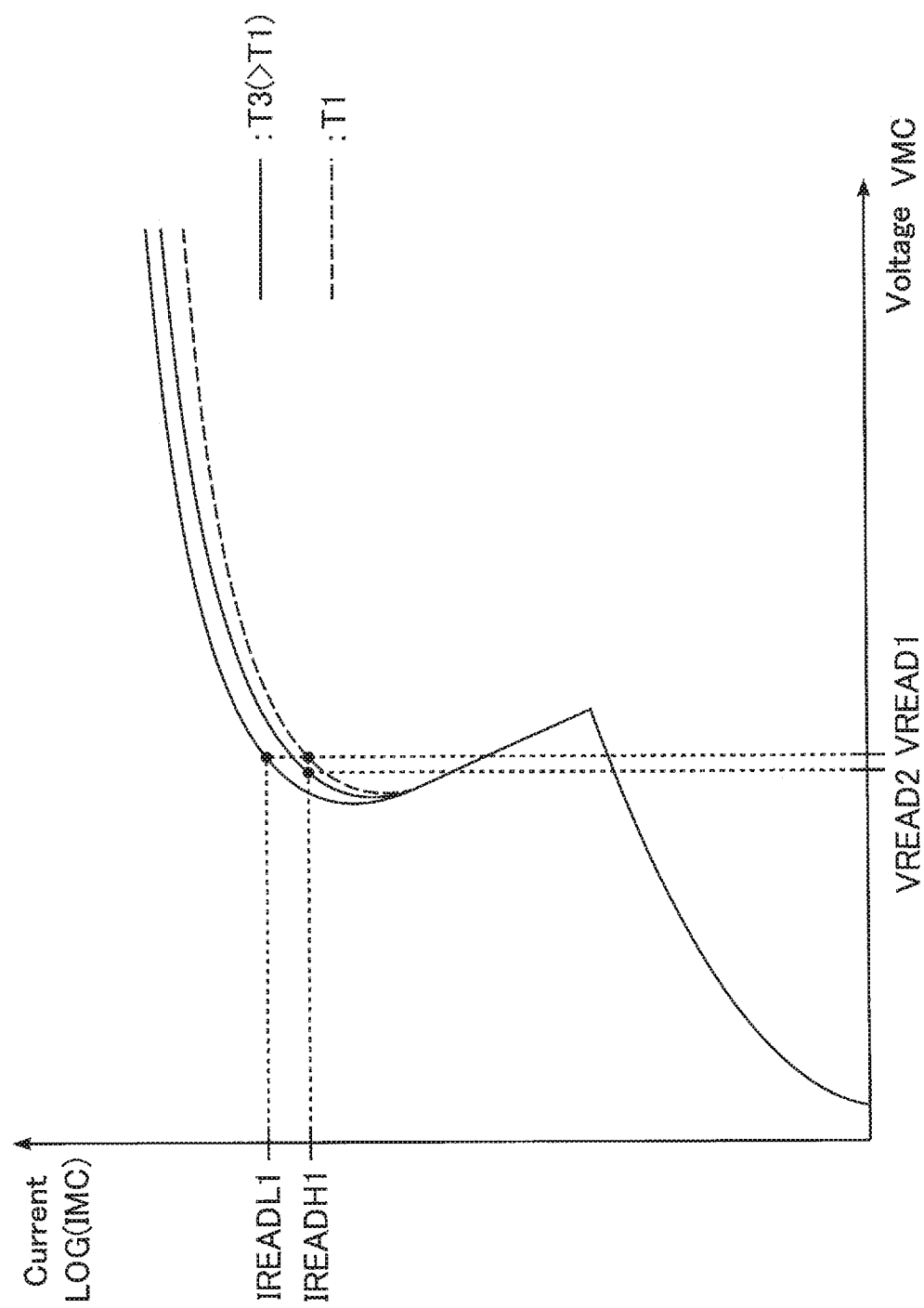
F I G. 35

MEMORY DEVICE

CROSS-REFERENCE TO RELATED APPLICATIONS

This application is based upon and claims the benefit of priority from Japanese Patent Application No. 2019-170699, filed Sep. 19, 2019, the entire contents of which are incorporated herein by reference.

FIELD

Embodiments described herein relate to a memory device.

BACKGROUND

As a memory device, phase-change memory (PCM) has been developed. A PCM includes a variable resistance element capable of transitioning between two solid phases, crystalline and amorphous, in response to application of a voltage thereto. The variable resistance element takes a low resistance state (LRS) in the crystalline phase, and takes a high resistance state (HRS) in the amorphous phase. A PCM stores data based on these two states.

BRIEF DESCRIPTION OF THE DRAWINGS

FIG. 2 is a block diagram showing an example of a configuration of the memory device according to the first embodiment.

FIG. 5 shows an example of a circuit configuration of a memory cell array of the memory device according to the first embodiment.

FIG. 6 shows an example of a graph representing current-voltage (I-V) characteristics of a memory cell of the memory device according to the first embodiment.

FIG. 7 is a timing chart showing an example of temporal changes of a write voltage used in a write operation as a first access in the memory device according to the first embodiment.

FIG. 10 is a timing chart showing an example of temporal changes of a voltage applied to a select memory cell in a read operation as a first access in the memory device according to the first embodiment.

FIG. 11 shows an example of the read operation as the first access in the memory device according to the first embodiment, on a graph representing I-V characteristics of a memory cell.

FIG. 14 is a timing chart showing another example of temporal changes of a voltage applied to a select memory cell in a write operation as a second access in the memory device according to the first embodiment.

FIG. 15 shows an example of variations with temperature of a graph representing I-V characteristics of a memory cell of the memory device according to the first embodiment.

FIG. 18 shows an example of the read operation as the first access in the memory device according to the first modification of the first embodiment, on a graph representing I-V characteristics of a memory cell.

FIG. 21 shows an example of a read current used in a read operation as a first access in the memory device according to a second modification of the first embodiment, on a graph representing I-V characteristics of a memory cell.

FIG. 22 shows an example of a circuit configuration relating to a read operation in the memory device according to the second modification of the first embodiment.

FIG. 23 is a timing chart showing an example of temporal changes of a voltage applied to a select memory cell in a read operation as a first access in the memory device according to the second modification of the first embodiment.

FIG. 25 shows another example of a read current used in a read operation as a second access in the memory device according to the second modification of the first embodiment, on a graph representing I-V characteristics of a memory cell.

FIG. 28 shows an example of a graph representing I-V characteristics of a memory cell of the memory device according to the second embodiment.

FIG. 29 shows an example of a write voltage and a read voltage used in a first access in the memory device according to the second embodiment, on a graph representing I-V characteristics of a memory cell.

FIG. 30 shows an example of a circuit configuration relating to a read operation in the memory device according to the second embodiment.

FIG. 31 shows an example of variations with temperature of a graph representing a relationship between a voltage and a resistance of an MTJ element of the memory device according to the second embodiment.

FIG. 32 shows an example of a write voltage used in a write operation as a second access in the memory device according to the second embodiment, on a graph representing I-V characteristics of a memory cell.

FIG. 34 shows an example of a read voltage used in a read operation as a second access in the memory device according to the second embodiment, on a graph representing I-V characteristics of a memory cell.

FIG. 35 shows an example of a read voltage used in a read operation in the memory device according to a modification of the second embodiment, on a graph representing I-V characteristics of a memory cell.

DETAILED DESCRIPTION

In general, according to an embodiment, a memory device includes a first memory cell and a second memory cell each including a variable resistance element and a switching element, and includes a read and write circuit. The circuit is configured to perform, as a first access, a write operation or a read operation on the first memory cell, and make a second access after the first access. As the second access, data is written into or read from the second memory cell, under a condition based on a type of the first access.

Hereinafter, embodiments will be described with reference to the accompanying drawings. In the description that follows, components having identical functions and configurations will be denoted by a common reference symbol. When multiple components with a common reference symbol need to be distinguished from one another, different suffixes are added to the common reference symbol to make such distinctions. When multiple components need not be particularly distinguished from one another, the multiple components are denoted only by the common reference symbol, without the addition of a suffix.

First Embodiment

Hereinafter, a memory device 1 according to a first embodiment will be described.

[Configuration Example]

(1) Memory System

Figure 1:
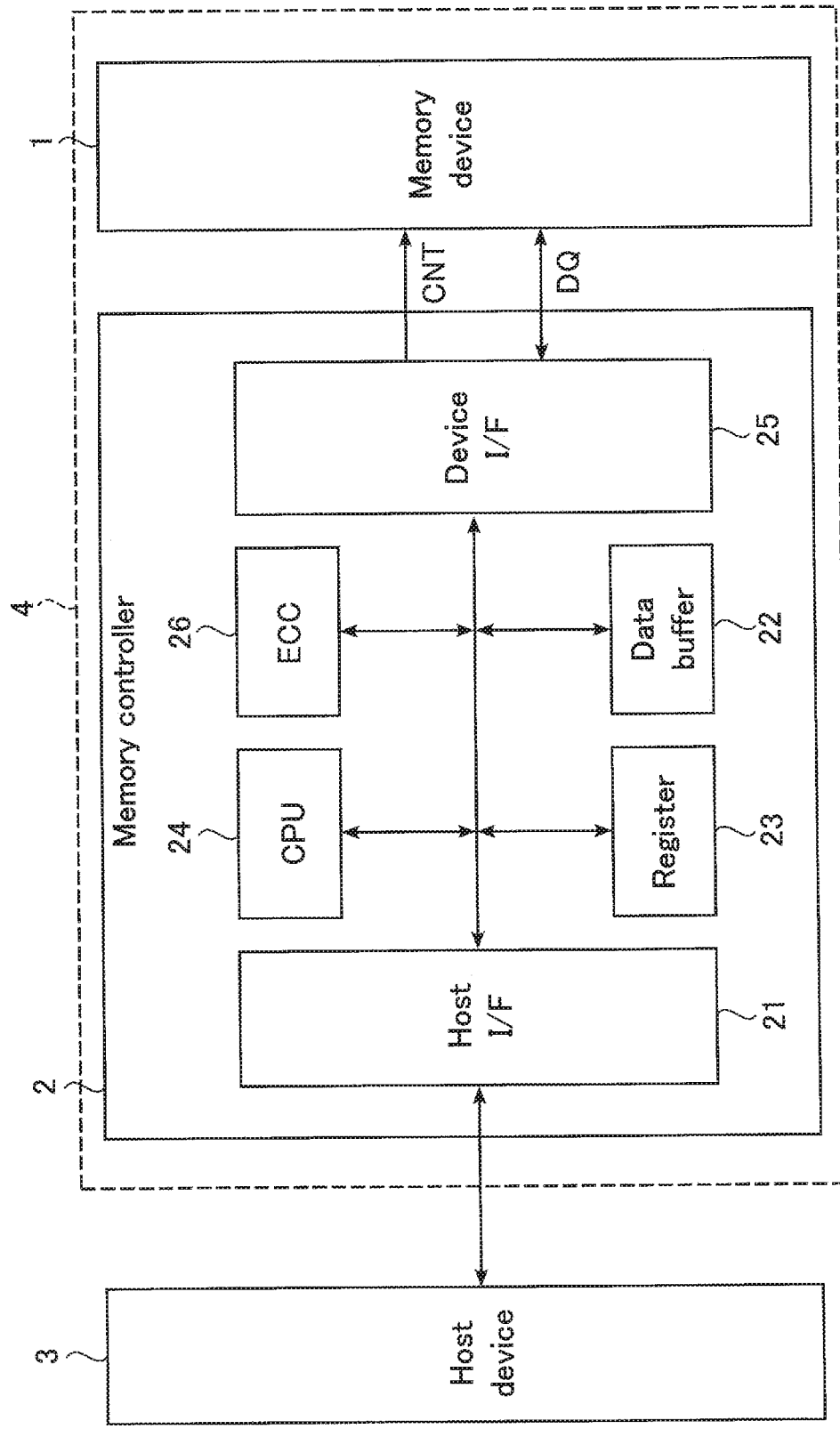
FIG. 1 is a block diagram showing an example of a configuration of a memory system including a memory device according to a first embodiment.

FIG. 1 is a block diagram showing an example of a configuration of a memory system 4 including a memory device 1 according to a first embodiment.

The memory system 4 includes a memory controller 2 as well as the memory device 1.

The memory controller 2 receives a host command from a host device (external device) 3 such as a personal computer, and controls the memory device 1 based on the received host command. In this control, various types of operations are performed, such as an operation to read data from the memory device 1 (hereinafter referred to as a "read operation") and an operation to write data to the memory device 1 (hereinafter referred to as a "write operation").

The memory controller 2 includes a host interface circuit 21, a data buffer 22, a register 23, a central processing unit (CPU) 24, a device interface circuit 25, and an error check and correction (ECC) circuit 26.

The host interface circuit 21 is coupled to the host device 3 via a bus, and controls communications between the host device 3 and the memory system 4.

The data buffer 22 receives data transmitted from the host device 3 via the host interface circuit 21, and temporarily stores the received data. The data buffer 22 temporarily stores data to be transmitted to the host device 3 via the host interface circuit 21. The data buffer 22 may be either a volatile memory or a nonvolatile memory.

The register 23 stores setting information of the memory system 4, a host command, status information, etc. The register 23 may be either a volatile memory or a nonvolatile memory.

The CPU 24 controls the operation of the entire memory system 4. The CPU 24 performs a process relating to control of the memory device 1 in accordance with the host command.

The device interface circuit 25 is coupled to the memory device 1 via a memory bus, and controls communications between the memory controller 2 and the memory device 1. The memory bus transmits, for example, a signal DQ and an external control signal CNT. The signal DQ contains write data or read data. The external control signal CNT contains, for example, a command and address information.

The ECC circuit 26 receives, via the data buffer 22, write data transmitted from the host device 3. The ECC circuit 26 adds an error correcting code to the received write data. The ECC circuit 26 supplies the write data with the error correcting code to, for example, the data buffer 22, the device interface circuit 25, or the like. The device interface circuit 25 transmits the write data with the error correcting code to the memory device 1.

The ECC circuit 26 receives, via the device interface circuit 25, read data transmitted from the memory device 1. The ECC circuit 26 determines whether or not the received read data contains an error, based on the error correcting code. Upon determining that the read data contains an error, the ECC circuit 26 performs an error correction process on the read data, based on the error correcting code. The ECC circuit 26 supplies the error-corrected read data to, for example, the data buffer 22, the device interface circuit 25, or the like.

(2) Memory Device

FIG. 2 is a block diagram showing an example of a configuration of the memory device 1 according to the first embodiment. The memory device 1 according to the first embodiment is, for example, a phase change memory capable of storing data in a non-volatile manner.

As shown in FIG. 2, the memory device 1 includes a peripheral circuit 10 and a core circuit 11.

The core circuit 11 includes a plurality of non-volatile memory cells respectively associated with word lines and bit lines. The word lines include main word lines and local word lines. The bit lines include global bit lines and local bit lines. In a write operation, write data is stored in memory cells in the core circuit 11. In a read operation, read data is read from memory cells in the core circuit 11.

The peripheral circuit 10 includes a column decoder 12, a row decoder 13, a command/address input circuit 14, a controller 15, and an input/output circuit 16.

The command/address input circuit 14 receives an external control signal CNT transmitted from the memory controller 2, and transfers a command and address information in the received external control signal CNT to the controller 15.

The controller 15 controls the memory device 1 based on the transferred command and address information. For example, the controller 15 controls the core circuit 11, the column decoder 12, the row decoder 13, the input/output circuit 16, etc., to perform various operations such as a write operation and a read operation.

The controller 15 includes a command/address detection circuit 151 and a voltage generation circuit 152.

The command/address detection circuit 151 detects the transferred command and address information. The voltage generation circuit 152 generates various voltages used for a write operation, a read operation, or the like, based on a result of the detection by the command/address detection circuit 151. The controller 15 supplies the voltages generated by the voltage generation circuit 152 to the row decoder 13 and the core circuit 11.

The input/output circuit 16 temporarily stores write data in the signal DQ transmitted from the memory controller 2, or read data read from the core circuit 11. The input/output circuit 16 transfers the write data to the core circuit 11, and transmits the read data to the memory controller 2.

The column decoder 12 receives the address information from the controller 15. The column decoder 12 generates a bit line selection signal based on the received address information, and transmits the generated signal to the core circuit 11.

The row decoder 13 receives the address information from the controller 15. The row decoder 13 controls transfer of the voltages supplied from the controller 15 to the core circuit 11, based on the received address information.

(3) Core Circuit

Figure 3:
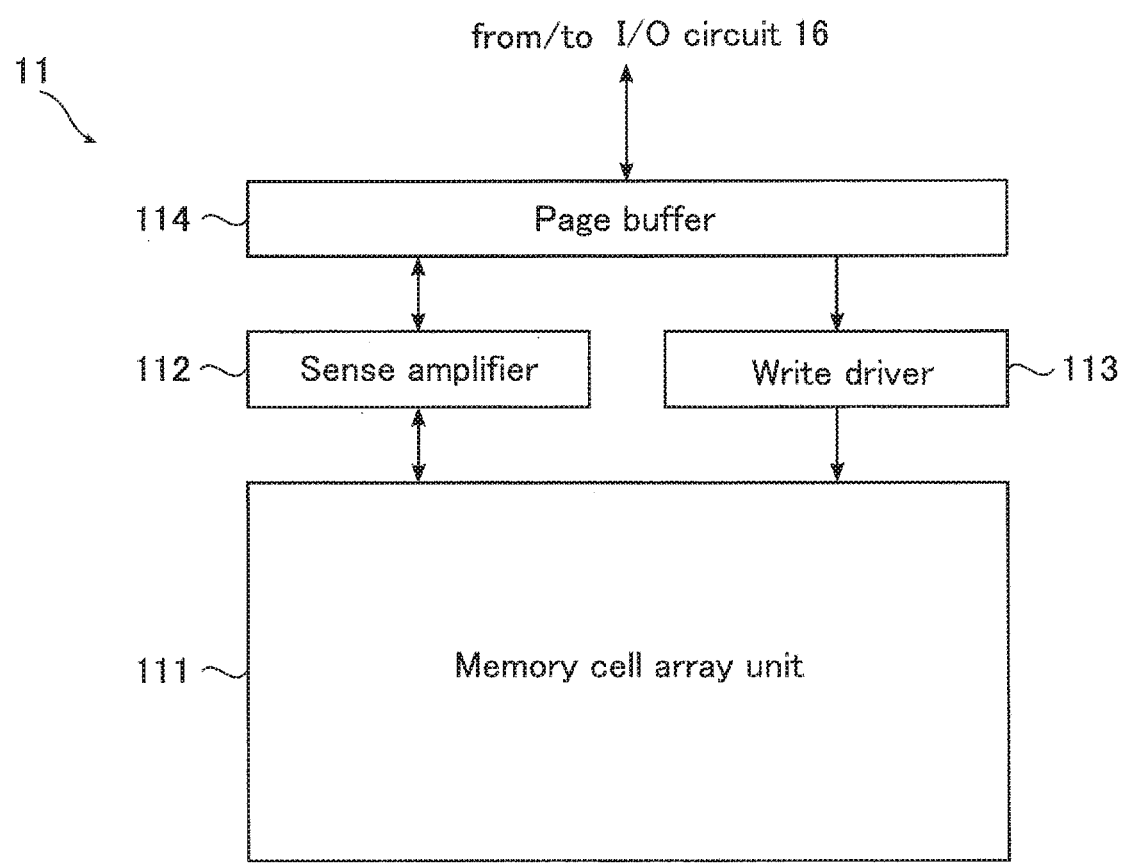
FIG. 3 is a block diagram showing an example of a configuration of a core circuit of the memory device according to the first embodiment.

FIG. 3 is a block diagram showing an example of a configuration of the core circuit 11 of the memory device 1 according to the first embodiment.

As shown in FIG. 3, the core circuit 11 includes a memory cell array unit 111, a sense amplifier 112, a write driver 113, and a page buffer 114.

The memory cell array unit 111 includes the memory cells.

The page buffer 114 receives write data from the memory controller 2 via the input/output circuit 16. The page buffer 114 receives read data from the sense amplifier 112, and transmits the received read data to the memory controller 2 via the input/output circuit 16. The page buffer 114 temporarily stores the write data or the read data.

The page buffer 114 receives the bit line selection signal from the column decoder 12. Reading of data by the sense amplifier 112 and writing of data by the write driver 113, to be described below, are performed based on the bit line selection signal.

The sense amplifier 112 is coupled to a global bit line, and the global bit line is coupled to a memory cell via a local bit line. The sense amplifier 112 applies a voltage supplied from the controller 15 to the global bit line. The sense amplifier 112 detects a current (hereinafter referred to as a "cell current") flowing through the memory cell via the global bit line, or detects a change in a potential of the global bit line. Thereby, the sense amplifier 112 reads data stored in the memory cell, and transmits the read data to the page buffer 114.

The write driver 113 is coupled to a global bit line, and the global bit line is coupled to a memory cell via a local bit line. The write driver 113 controls application of a voltage supplied from the controller 15 to the global bit line. Thereby, write data stored in the page buffer 114 can be written into the memory cell in the memory cell array unit 111.

A combination of the page buffer 114, the sense amplifier 112, and the write driver 113 is provided for, for example, each global bit line.

(4) Memory Cell Array Unit

Figure 4:
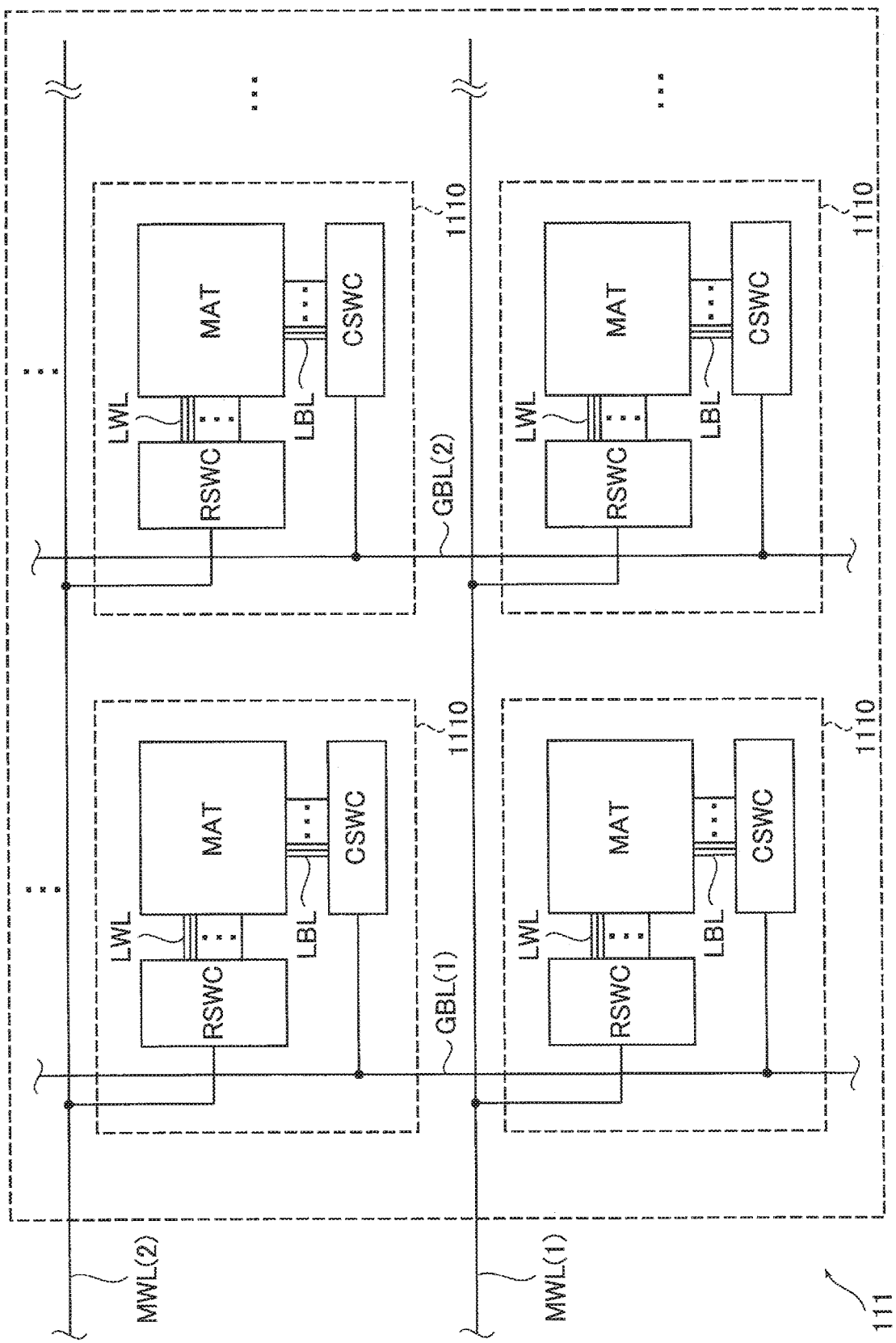
FIG. 4 is a block diagram showing an example of a configuration of a memory cell array unit of the memory device according to the first embodiment.

FIG. 4 is a block diagram showing an example of a configuration of the memory cell array unit 111 of the memory device 1 according to the first embodiment.

The memory cell array unit 111 includes a plurality of sub memory cell array units 1110. The coupling relationship of the sub memory cell array units 1110 will be described below. That is, a single sub memory cell array unit 1110 is coupled between each main word line MWL of multiple main word lines MWL(1), MWL(2) . . . and each global bit line GBL of multiple global bit lines GBL(1), GBL(2), . . . . The main word lines MWL are coupled to the row decoder 13, and each of the global bit lines GBL is coupled to a sense amplifier 112 and a write driver 113.

In the description that follows, one of the sub memory cell array units 1110 will be taken as an example. The sub memory cell array units 1110 other than the sub memory cell array unit 1110 to be described below may have the same configuration. Hereinafter, the main word line MWL and the global bit line GBL coupled to the sub memory cell array unit 1110 will be respectively referred to as a main word line MWL and a global bit line GBL corresponding to the sub memory cell array unit 1110.

The sub memory cell array unit 1110 includes a memory cell array MAT, a column switch circuit CSWC, and a row switch circuit RSWC.

The memory cell array MAT includes a plurality of memory cells each associated with a local word line LWL and a local bit line LBL.

The row switch circuit RSWC receives address information from the controller 15. Based on the received address information, the row switch circuit RSWC controls coupling between the local word lines LWL coupled to the respective memory cells and the corresponding main word line MWL.

Based on the bit line selection signal from the column decoder 12, the column switch circuit CSWC controls coupling between the local bit lines LBL coupled to the respective memory cells and the corresponding global bit line GBL.

(5) Memory Cell Array

FIG. 5 shows an example of a circuit configuration of the memory cell array MAT of the memory device according to the first embodiment.

The memory cell array MAT includes a plurality of memory cells MC. The coupling relationship of the memory cells MC will be described below. That is, a single memory cell MC is coupled between each local word line LWL of multiple local word lines LWL(1), LWL(2), . . . , and each local bit line LBL of multiple local bit lines LBL(1), LBL(2), . . . . Hereinafter, a local word line LWL and a local bit line LBL coupled to a memory cell MC will be respectively referred to as a local word line LWL and a local bit line LBL corresponding to the memory cell MC.

(6) Memory Cell

Each memory cell MC includes a PCM element and a switching element. In the coupling of the memory cells MC described with reference to FIG. 5, a PCM element and a switching element are coupled in series between a local word line LWL and a local bit line LBL.

A PCM element is a variable resistance element, and takes either a low resistance state LRS or a high resistance state HRS according to, for example, a phase transition between two solid phases, crystalline and amorphous. Based on which of the two states the PCM element takes, data to be stored in the memory cell MC including the PCM element is defined.

The switching element is, for example, a two-terminal switching element. When the voltage applied between the two terminals is smaller than a threshold value, the switching element is in an "off" state (hereinafter referred to as a "nonconductive-state"), e.g., an electrically high resistance state. When the voltage applied between the two terminals is equal to or larger than the threshold value, the switching element is turned to an "on" state (hereinafter referred to as a "conductive-state"), e.g., an electrically low resistance state. The switching element may have this function regardless of the polarity of the voltage. The switching element contains, for example, at least one type of chalcogen element selected from a group consisting of Te, Se and S. Alternatively, the switching element may contain a chalcogenide, which is a compound containing such a chalcogen element. Moreover, the switching element need not be a chalcogenide type, and may be As-doped $SiO_2$, a volatile CBRAM, or the like.

For simplicity of description, let us assume that, when a PCM element is in the low resistance state LRS, a memory cell MC including the PCM element is also in the low resistance state LRS, and when a PCM element is in the high resistance state HRS, a memory cell MC including the PCM element is also in the high resistance state HRS.

FIG. 6 shows an example of a graph representing current-voltage (I-V) characteristics of a memory cell MC. The horizontal axis of the graph represents the magnitude of a voltage VMC (corresponding to a potential difference between the corresponding local word line LWL and the corresponding local bit line LBL) applied to the memory cell MC. The vertical axis of the graph represents the magnitude of a cell current IMC flowing through the memory cell MC, and is represented on a log scale.

The memory cell MC exhibits different I-V characteristics according to whether the memory cell MC is in the low resistance state LRS or in the high resistance state HRS. Details will be described below.

First, a case will be described where the memory cell MC is in the high resistance state HRS.

As the voltage VMC is gradually increased, the cell current IMC continuously increases until the voltage VMC reaches a voltage VSBH1. When the voltage VMC is further increased, the I-V characteristics have a discontinuity at a point where the voltage VMC is the voltage VSBH1. That is, when the voltage VMC exceeds the voltage VSBH1, the cell current IMC rapidly increases from a current ISBH1α and reaches a current ISBH1β. As the voltage VMC is further increased, the cell current IMC continuously increases from the current ISBH1β. The sense amplifier 112 is, for example, capable of detecting the cell current IMC after the rapid increase.

A case will be described where the memory cell MC is in the low resistance state LRS.

As the voltage VMC is gradually increased, the cell current IMC continuously increases until the voltage VMC reaches a voltage VSBL1. When the voltage VMC is further increased, the I-V characteristics have a discontinuity at a point where the voltage VMC is the voltage VSBL1. That is, when the voltage VMC exceeds the voltage VSBL1, the cell current IMC rapidly increases from a current ISBL1α and reaches a current ISBL1β. The voltage VSBL1 is smaller than the voltage VSBH1. As the voltage VMC is further increased, the cell current IMC continuously increases from the current ISBL1β. The sense amplifier 112 is, for example, capable of detecting the cell current IMC after the rapid increase. After the voltage VMC reaches the voltage VSBH1, the relationship between the voltage VMC and the cell current IMC is, for example, identical to when the memory cell MC is in the high resistance state HRS.

When the memory cell MC is in the low resistance state LRS, the ratio of the increase of the cell current IMC to the increase of the voltage VMC is high, and the cell current IMC in relation to a certain voltage VMC is constantly large until the voltage VMC reaches the voltage VSBL1, in comparison with when the memory cell MC is in the high resistance state HRS.

For simplicity of description, let us also assume that the memory cell MC is turned on when the cell current IMC rapidly increases to a magnitude that can be detected by the sense amplifier 112, as described above. The phenomenon in which the cell current IMC rapidly increases is referred to as a "snapback phenomenon". In the description that follows, let us also assume that the snapback phenomenon is caused by the switching element in the memory cell MC taking the conductive-state. For simplicity of description, the I-V characteristics prior to an occurrence of the snapback phenomenon are referred to as "pre-snapback I-V characteristics", and the I-V characteristics after the occurrence of the snapback phenomenon, with the cell current IMC in a range that can be detected by the sense amplifier 112, are referred to as "post-snapback I-V characteristics". Moreover, voltages at which the snapback phenomenon occurs, such as the voltage VSBL1 and the voltage VSBH1, are also referred to as "snapback voltages".

[Operation Examples]

Hereinafter, a case will be described where the memory device 1 makes a first access to a memory cell MC, and, subsequent to the first access, starts a second access to a memory cell MC within a first period of time from the start of the first access. The first access is, for example, a write operation or a read operation, and the second access is also, for example, a write operation or a read operation. The memory cell MC to be the target of the first access and the memory cell MC to be the target of the second access only need to be included in an identical memory cell array MAT, and may be either identical or different.

For simplicity of description, a read operation performed by the memory device 1 according to the first embodiment will also be referred to as a "floating-type read operation".

In the description that follows, a voltage VMC during a write operation is also referred to as a "write voltage", and a cell current IMC during a write operation is also referred to as a "write current". The voltage VMC during a read operation is also referred to as a "read voltage", and the cell current IMC during a read operation is also referred to as a "read current".

In the description that follows, a memory cell MC to be a write target or a read target will be referred to as a "select memory cell MC". A local word line LWL and a local bit line LBL corresponding to the select memory cell MC will be respectively referred to as a "select local word line LWL" and a "select local bit line LBL". A main word line MWL coupled to the select local word line LWL will be referred to as a "select main word line MWL", and a global bit line GBL coupled to the select local bit line LBL will be referred to as a "select global bit line GBL". The write operation and the read operation that will be described in detail below are merely examples, and the write operation and the read operation according to the present embodiment are not limited thereto.

(1) First Access

The memory device 1 performs a write operation or a read operation as a first access.

(1-1) Write Operation

FIG. 7 is a timing chart showing an example of temporal changes of a write voltage used in a write operation as a first access.

In a write operation, voltages are respectively applied to a select local word line LWL and a select local bit line LBL under the control of the controller 15 over the row decoder 13, the column decoder 12, the page buffer 114, and the write driver 113. Consequently, a voltage VMC corresponding to a potential difference between the select local word line LWL and the select local bit line LBL is provided.

In the write operation, a voltage is applied to the select memory cell MC with a certain pulse width, and thereby a Joule heat is generated. The generated Joule heat causes the PCM element in the select memory cell MC to melt. Let us assume that the voltage required for the PCM element to melt is a voltage VRS01.

Before the start of the write operation, the voltage VMC is, for example, 0.

At time T00, the voltage VMC is brought to a voltage VRS1 that is larger than the voltage VRS01. While the voltage VRS1 is being applied to the select memory cell MC, the PCM element in the select memory cell MC melts.

Thereafter, at time T01, the voltage VMC is decreased. This decreases the temperature of the PCM element, causing the PCM element to transition from the liquid phase to the solid phase.

When the voltage VMC is decreased at, for example, a constant rate to reach 0 at time T02, the PCM element becomes amorphous and switches to the high resistance state HRS. On the other hand, when the voltage VMC is decreased at, for example, a constant rate to reach 0 at time T03 later than time T02, the PCM element becomes crystalline and switches to the low resistance state LRS.

Figure 8:
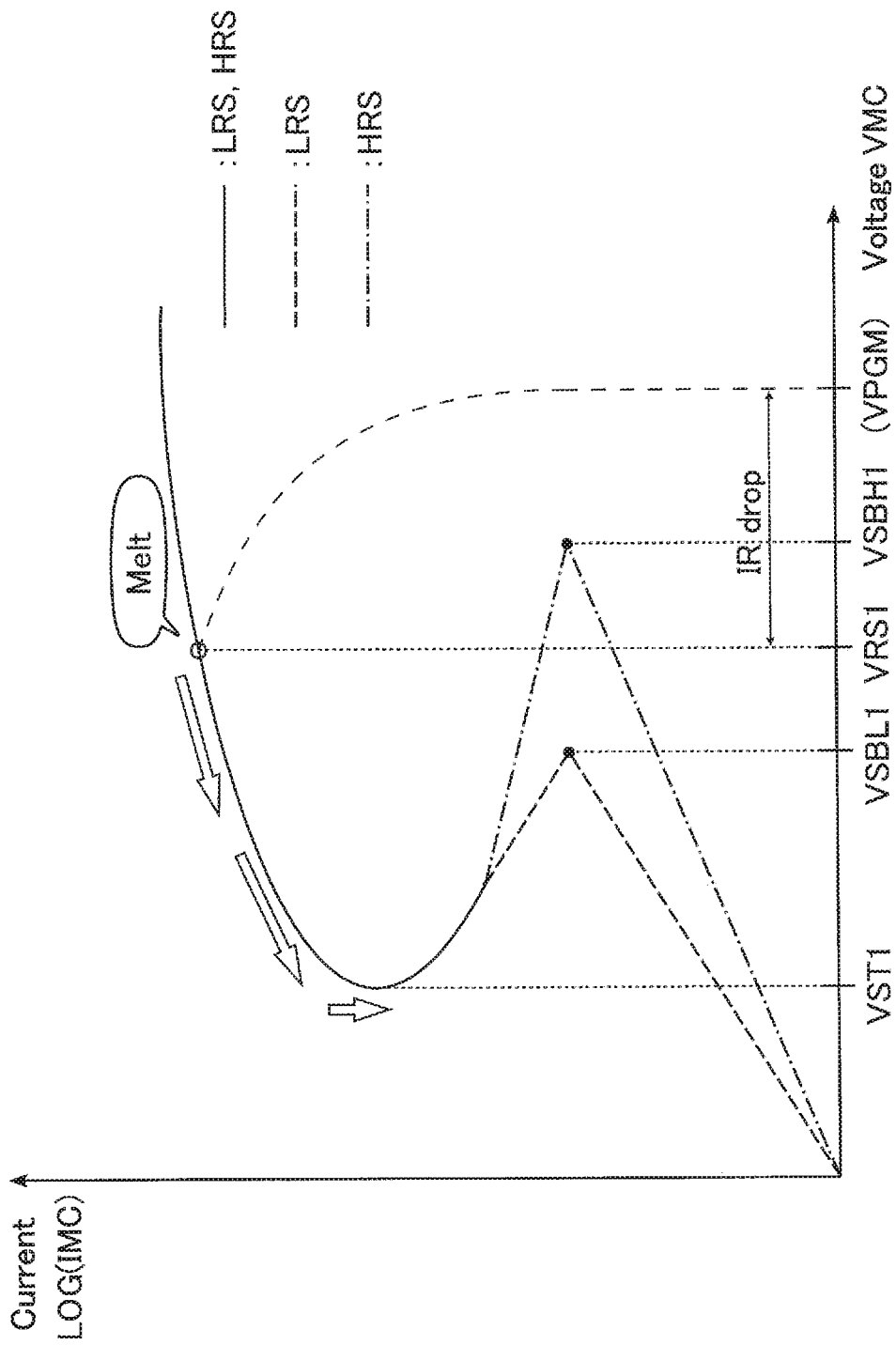
FIG. 8 shows an example of the write operation as the first access in the memory device according to the first embodiment, on a graph representing I-V characteristics of a memory cell.

FIG. 8 shows temporal changes of the voltage VMC and the cell current IMC in the write operation described with reference to FIG. 7, on a graph representing I-V characteristics of a memory cell MC.

At time T00, two voltages having a voltage difference equal to a program voltage VPGM are respectively applied to the select local word line LWL and the select local bit line LBL. The voltage VPGM is larger than the voltage VSBH1. Owning to the IR drop, the voltage VMC becomes the voltage VRS1 which is smaller than the voltage VPGM. At this time, the cell current IMC follows the post-snapback I-V characteristics.

When the voltage VMC is decreased at time T01, the cell current IMC continuously decreases in accordance with the post-snapback I-V characteristics. The cell current IMC continuously decreases even after the voltage VMC reaches the voltage VSBL1. When the voltage VMC falls below a voltage VST1, the cell current IMC rapidly decreases to, for example, a magnitude that cannot be detected by the sense amplifier 112.

When the voltage VMC is decreased at, for example, a constant rate to reach 0 at time T02, after the voltage VMC falls below the voltage VST1, the cell current IMC changes in accordance with the pre-snapback I-V characteristics in the case of the high resistance state HRS. On the other hand, when the voltage VMC is decreased at, for example, a constant rate to reach 0 at time T03, after the voltage VMC falls below the voltage VST1, the cell current IMC changes in accordance with the pre-snapback I-V characteristics in the case of the low resistance state LRS.

In the write operation described in detail above, the cell current IMC follows the post-snapback I-V characteristics, as described above, as a result of the occurrence of the snapback phenomenon. In the snapback phenomenon, the switching element in the select memory cell MC is in the conductive-state, thereby generating heat in accordance therewith. The generated heat causes a temperature increase at the periphery of the select memory cell MC.

(1-2) Read Operation

Figure 9:
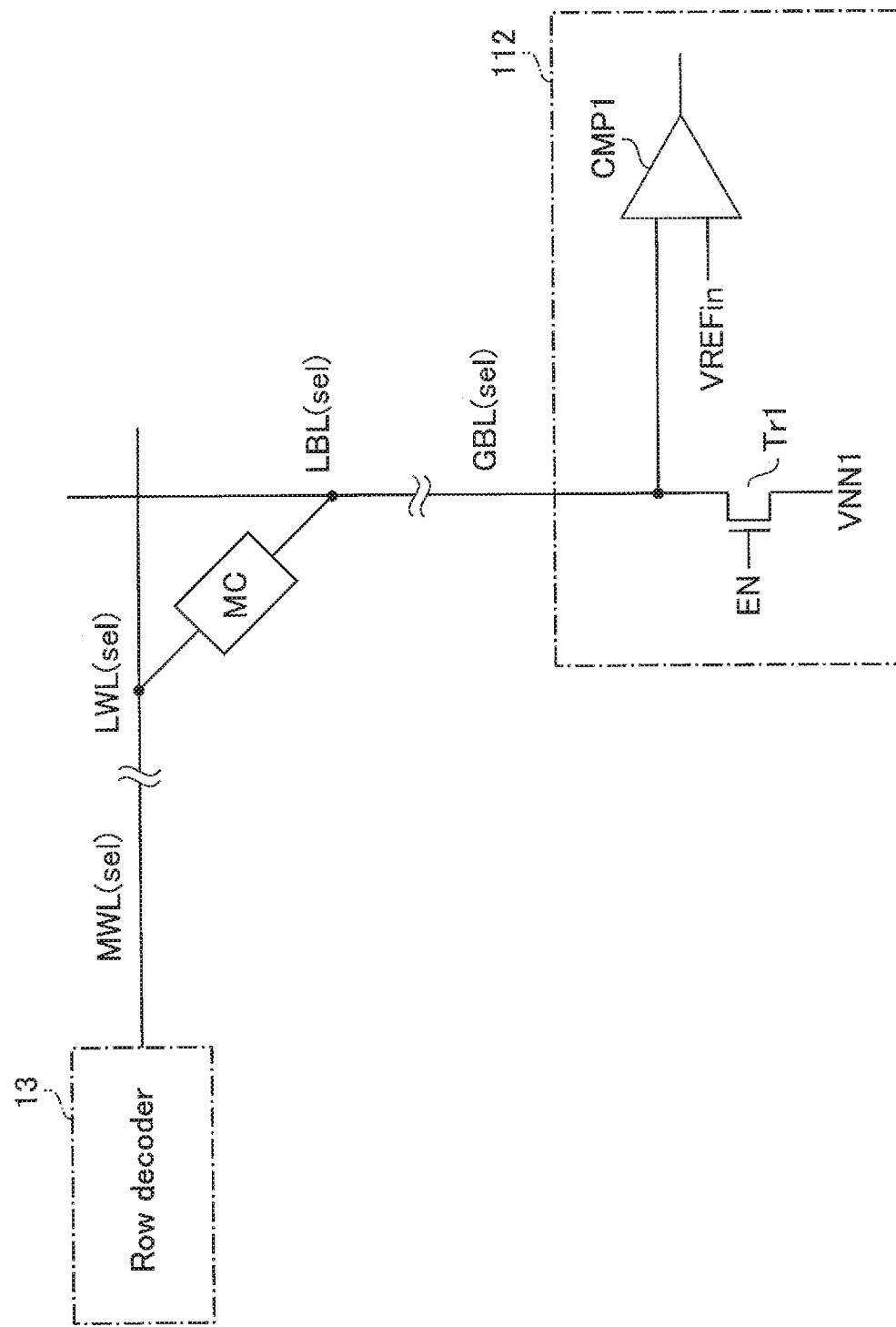
FIG. 9 shows an example of a circuit configuration relating to a read operation in the memory device according to the first embodiment.

FIG. 9 shows an example of a circuit configuration relating to a read operation in the memory device 1 according to the first embodiment. The circuit configuration shown in FIG. 9 is merely an example, and the present embodiment is not limited thereto. The same applies to the other circuit configurations that will be described below.

As described in detail above, a select memory cell MC is coupled between a select local word line LWL(sel) and a select local bit line LBL(sel). The select local word line LWL(sel) is coupled to the row decoder 13 via a select main word line MWL(sel). The select local bit line LBL(sel) is coupled to the sense amplifier 112 via a select global bit line GBL(sel).

The coupling of the sense amplifier 112 will be described in detail below.

The sense amplifier 112 includes an n-channel MOS transistor Tr1 and a comparator CMP1. A first terminal of the transistor Tr1 is coupled to the select global bit line GBL(sel), and a voltage VNN1 is applied to a second terminal of the transistor Tr1. The voltage VNN1 is, for example, a voltage supplied from the controller 15. A control signal EN is applied to a gate of the transistor Tr1. The control signal EN is supplied from the controller 15. A first input terminal of the comparator CMP1 is coupled to the select global bit line GBL(sel). A voltage applied to the select local bit line (sel) is transferred to the first input terminal. A voltage VREFin as a reference voltage is applied to a second input terminal of the comparator CMP1. A signal indicating a magnitude relationship between the voltage applied to the first input terminal and the voltage VREFin is output from the output terminal of the comparator CMP1.

FIG. 10 is a timing chart showing an example of temporal changes of a voltage VMC applied to a select memory cell MC in a read operation as a first access. In the description that follows, a voltage VREAD1 is a voltage that is larger than the voltage VSBL1 and smaller than the voltage VSBH1, and is, for example, a voltage of a magnitude that is an average between the voltage VSBL1 and the voltage VSBH1.

In a read operation, voltages are respectively applied to the select local word line LWL(sel) and the select local bit line LBL(sel) under the control of the controller 15 over the row decoder 13, the column decoder 12, the page buffer 114, and the sense amplifier 112.

Before the start of the read operation, a voltage VSS is applied to both the select local word line LWL(sel) and the select local bit line LBL(sel). The voltage VSS is, for example, a reference voltage.

At time T10, the voltage applied to the select local bit line LBL(sel) is decreased to a voltage VBL(sel)1 while the voltage VSS is being applied to the select local word line LWL(sel). The application of the voltage VBL(sel)1 to the select local bit line LBL(sel) is in response to a transfer of the voltage VNN1 to the select local bit line LBL(sel) based on the control signal EN.

After the potential of the select local bit line LBL(sel) becomes stable, the voltage of the control signal EN is decreased to be lower than a threshold voltage of the transistor Tr1, thus bringing the select local bit line LBL(sel) to a floating state. At this time, the potential difference between the select local word line LWL(sel) and the select local bit line LBL(sel) is smaller than the voltage VSBL1.

Subsequently, at time T11, the voltage applied to the select local word line LWL(sel) is increased to a voltage VWL(sel)1. The voltage VWL(sel)1 is a voltage that is higher than the voltage VBL(sel)1 by the voltage VREAD1. The average voltage of the voltage VWL(sel)1 and the voltage VBL(sel)1 is, for example, the voltage VSS.

Upon application of the voltage VWL(sel)1, the potential of the select local word line LWL(sel) increases, and at time T12, the potential difference between the select local word line LWL(sel) and the select local bit line LBL(sel) becomes the voltage VSBL1.

When the select memory cell MC is in the low resistance state LRS, a cell current IMC flows from the select local word line LWL(sel) to the select local bit line LBL(sel) at time T12. Thereby, the potential of the select local bit line LBL(sel) increases, thus reducing the potential difference between the select local bit line LBL(sel) and the select local word line LWL(sel). When the potential difference becomes the voltage VST1, the cell current IMC rapidly decreases, making the potential of the select local bit line LBL(sel) stable.

When the select memory cell MC is in the high resistance state HRS, the potential difference between the select local bit line LBL(sel) and the select local word line LWL(sel) does not exceed the voltage VSBH1 at time T12, allowing very little flow of the cell current IMC. Even when the potential of the select local word line LWL(sel) becomes stable after time T12, the above-described potential difference does not exceed the voltage VSBH1, thus allowing very little flow of the cell current IMC, and substantially maintaining the potential of the select local bit line LBL(sel).

In this manner, where the potential of the select local bit line LBL(sel) becomes stable depends on whether the select memory cell MC is in the low resistance state LRS or in the high resistance state HRS. Specifically, when the select memory cell MC is in the low resistance state LRS, the potential of the select local bit line LBL(sel) becomes stable at a lower value than that of the select local word line LWL(sel) by the voltage VST1. When the select memory cell MC is in the high resistance state HRS, the potential of the select local bit line LBL(sel) can be regarded as becoming stable at a lower value than that of the select local word line LWL(sel) by the voltage VREAD1.

The voltage VREFin applied to the second input terminal of the comparator CMP1 is a voltage VREFin1 that is lower than the voltage VWL(sel)1 by a voltage VREF1. Also, the voltage VREF1 is a voltage that is larger than the voltage VST1 and smaller than the voltage VREAD1, and is, for example, a voltage of a magnitude that is an average of the voltage VST1 and the voltage VREAD1. Thereby, it is possible to perceive which of the low resistance state LRS and the high resistance state HRS the select memory cell MC is in, based on at which the potential of the select local bit line LBL(sel) becomes stable after time T12. Specifically, when the above-described potential is high, compared to the lower potential than the potential of the select local word line LWL(sel) by the voltage VREF1, it is possible to perceive that the select memory cell MC is in the low resistance state LRS. On the other hand, when the above-described potential is low, compared to the lower potential than the potential of the select local word line LWL(sel) by the voltage VREF1, it is possible to perceive that the select memory cell MC is in the high resistance state HRS.

FIG. 11 shows temporal changes of the voltage VMC and the cell current IMC in the read operation described with reference to FIG. 10, on a graph representing I-V characteristics of a memory cell MC.

First, a case will be described where the select memory cell MC is in the high resistance state HRS.

With the decrease in the voltage applied to the select local bit line LBL(sel) at time T10 and the increase in the voltage applied to the select local word line LWL(sel) at time T11, the voltage VMC increases and reaches the proximity of the voltage VREAD1. During this period, since the voltage VMC does not reach the voltage VSBH1, the cell current IMC and the voltage VMC change according to the pre-snapback I-V characteristics.

Next, a case will be described where the select memory cell MC is in the low resistance state LRS.

With the decrease in the voltage applied to the select local bit line LBL(sel) at time T10 and the increase in the voltage applied to the select local word line LWL(sel) at time T11, the voltage VMC increases, and reaches the voltage VSBL1 at time T12. During the period until time T12, the cell current IMC and the voltage VMC change according to the pre-snapback I-V characteristics. Thereafter, when the voltage VMC exceeds the voltage VSBL1, the cell current IMC rapidly increases, as described with reference to FIG. 6. After that, the cell current IMC and the voltage VMC change according to the post-snapback I-V characteristics. With the cell current IMC flowing to the select local bit line LBL(sel) in a floating state, the potential of the select local bit line LBL(sel) increases, thus decreasing the voltage VMC. When the voltage VMC reaches the voltage VST1, the cell current IMC rapidly decreases, and the cell current IMC and the voltage VMC follow the pre-snapback I-V characteristics. With the rapid decrease in the cell current IMC, the potential of the select local bit line LBL(sel) becomes stable.

In the floating-type read operation described in detail above, the snapback phenomenon occurs when the select memory cell MC is in the low resistance state LRS, while the snapback phenomenon does not occur when the select memory cell MC is in the high resistance state HRS. Accordingly, when the select memory cell MC is in the low resistance state LRS, the switching element in the select memory cell MC is caused to take the conductive-state, thus generating heat. The generated heat causes a temperature increase at the periphery of the select memory cell MC.

(2) Second Access

Next, the memory device 1 performs a write operation or a read operation as a second access.

The controller 15 determines, for example, whether or not the period of time from the start of the first access to the start of the second access is within a first period of time, based on a command transferred from the command/address input circuit 14. The command/address detection circuit 151 determines, for example, whether or not a memory cell MC to be a target of the first access and a memory cell MC to be a target of the second access are included in an identical memory cell MAT, based on address information transferred from the command/address input circuit 14.

When, for example, the controller 15 determines that the period of time from the start of the first access to the start of the second access is within the first period of time, and the command/address detection circuit 151 determines that the memory cell MC to be the target of the first access and the memory cell MC to be the target of the second access are included in an identical memory cell array MAT, the memory device 1 performs control that will be described in detail below.

The first period of time may be, for example, a period of time during which an energy beyond the durability limit is applied to the PCM element due to a heat generated as a result of the performance of the first access when control relating to the second access, to be described below, is not performed. Alternatively, the first period of time may be a period of time during which erroneous reading beyond the permissible limit of the error correcting process by the ECC circuit 26 occurs in the memory device 1 due to the heat when control is not performed in the second access to be described below. Such a period of time may be, for example, made clear in advance by means of experiments, etc. The first period of time may be twice longer one of a period of time for a write operation to be performed as the first access and a period of time for a read operation to be performed as the first access.

As a result of the performance of the first access, heat may be generated by the switching element in the select memory cell MC taking the conductive-state. When such heat generation occurs, the temperature increase occurs at the periphery of the select memory cell MC. Specifically, the temperature increase occurs when a write operation is performed and when a read operation is performed on the select memory cell MC in the low resistance state LRS. On the other hand, when a read operation is performed on the select memory cell MC in the high resistance state HRS, such a temperature increase does not occur.

For simplicity of description, of the write operations and the read operations, operations that cause the temperature increase are classified into a "first access type", and operations other than such operations are classified into a "second access type". That is, in the first embodiment, a write operation and a read operation on a select memory cell MC in the low resistance state LRS are classified into the first access type, and a read operation on a select memory cell MC in the high resistance state HRS are classified into the second access type.

When the memory device 1 performs, as a first access, an operation classified into the first access type, the memory device 1 performs an operation as a second access using a voltage different from the voltage used in the same operation performed as a first access. On the other hand, when the memory device 1 performs, as a first access, an operation classified into the second access type, the memory device 1 performs an operation as a second access using a voltage identical to the voltage used in the same operation performed as a first access.

This is achieved when the command/address detection circuit 151 distinguishes, based on the commands, between an operation performed as a first access and an operation performed as a second access, and the voltage generation circuit 152 generates a voltage to be used in the second access based on the result of the distinction.

Hereinafter, the second access in the case where an operation classified into the first access type is performed as a first access will be described in detail.

(2-1) Write Operation

Figure 12:
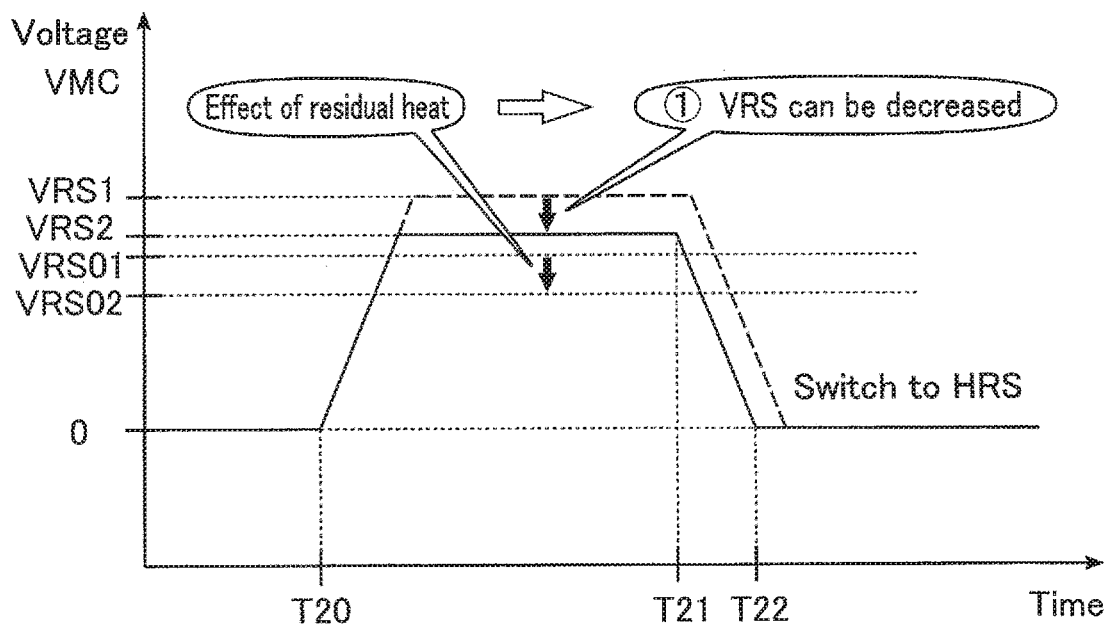
FIG. 12 is a timing chart showing an example of temporal changes of a voltage applied to a select memory cell in a write operation as a second access in the memory device according to the first embodiment.

FIG. 12 is a timing chart showing an example of temporal changes of a write voltage used in a write operation as a second access. For ease of reference, FIG. 12 shows only the case where a write operation to switch a select memory cell MC to the high resistance state HRS is performed. In FIG. 12, the voltage VMC in the example of FIG. 7 is shown by a dashed line for comparison. The same applies to FIGS. 13 to 14.

In the write operation, a write voltage is applied to the select memory cell MC with a certain pulse width, and the Joule heat generated thereby causes the PCM element in the select memory cell MC to melt. Let us assume that the voltage required for the PCM element to melt is a voltage VRS02. The pulse width of the write voltage is, for example, identical to the pulse width of the write voltage in the first access.

Since the residual heat of the generated heat as a result of the performance of the first access contributes to the melting of the PCM element, the energy required for the PCM element to melt decreases. Accordingly, the voltage VRS02 is smaller than the voltage VRS01.

Before the start of the write operation, the voltage VMC is, for example, 0.

At time T20, the voltage VMC is brought to a voltage VRS2 that is larger than the voltage VRS2. While the voltage VRS2 is being applied to the select memory cell MC, the PCM element in the select memory cell MC melts. Since the voltage VRS02 is smaller than the voltage VRS01, the voltage VRS2 can be made smaller than the voltage VRS1.

Thereafter, the voltage VMC is decreased at time T21. When the voltage VMC is decreased at, for example, a constant rate to reach 0 at time T22, the select memory cell MC becomes amorphous and switches to the high resistance state HRS.

Figure 13:
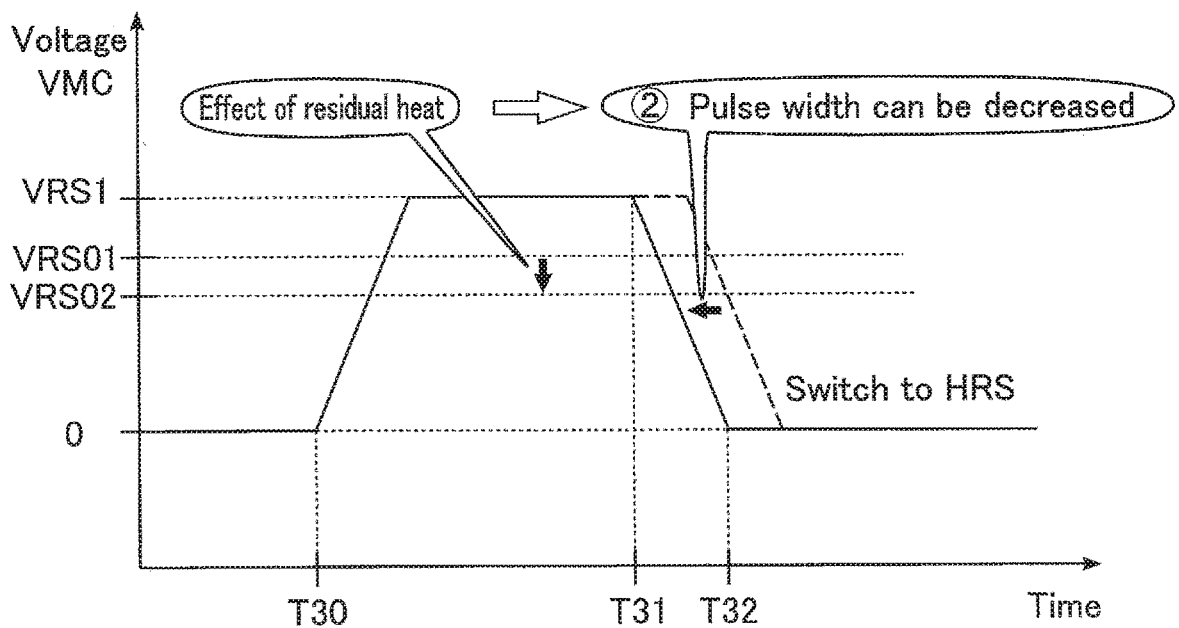
FIG. 13 is a timing chart showing another example of temporal changes of a voltage applied to a select memory cell in a write operation as a second access in the memory device according to the first embodiment.

FIG. 13 is a timing chart showing another example of temporal changes of a voltage VMC applied to a select memory cell MC in a write operation as a second access.

Before the start of the write operation, the voltage VMC is, for example, 0.

At time T30, the voltage VMC is brought to the voltage VRS1. While the voltage VRS1 is being applied to the select memory cell MC, the PCM element in the select memory cell MC melts.

Thereafter, the voltage VMC is decreased at time T31. When the voltage VMC is decreased at, for example, a constant rate to reach 0 at time T32, the select memory cell MC becomes amorphous and switches to the high resistance state HRS.

By virtue of the effect of the residual heat, the energy required for the PCM element to melt decreases. Accordingly, even when the pulse width of the write voltage is made narrower than the pulse width of the write voltage in the first access, it is possible for the PCM element to melt. It is thereby possible to make the period from time T30 to time T31 shorter than the period from time T00 to time T01.

FIG. 14 is a timing chart showing another example of temporal changes of a voltage VMC applied to a select memory cell MC in a write operation as a second access. In the timing chart shown in FIG. 14, the process by which the voltage VMC is decreased in a write operation to switch the select memory cell MC to the high resistance state HRS or the low resistance state LRS is focused on.

In a write operation to switch the select memory cell MC to the high resistance state HRS, the rate at which the voltage VMC is decreased is, for example, identical to that in a write operation performed as a first access.

In a write operation to switch the select memory cell MC to the low resistance state LRS, the period of time from the start to the completion of the decrease of the voltage VMC is long, making the effect of the residual heat large, in comparison with a write operation to switch the select memory cell MC to the high resistance state HRS. Accordingly, even when the rate at which the voltage VMC is decreased is increased, it is possible to maintain the speed at which the temperature of the PCM element decreases at a speed at which the PCM element can be crystallized. It is thus possible to increase the rate at which the voltage VMC is decreased, in comparison with the case where a write operation is performed as a first access.

For the write operation as the second access, the memory device 1 performs any one of or any combination of the methods of controlling the voltage VMC described with reference to FIGS. 12 to 14. Variations with temperature of the graph representing I-V characteristics of the memory cell MC will be described below; however, the effect caused by such variations on a write operation is smaller than the effect of the residual heat.

(2-2) Read Operation

FIG. 15 shows an example of variations with temperature of a graph representing I-V characteristics of a memory cell MC of the memory device 1 according to the first embodiment.

Let us assume that the temperature of the select memory cell MC at the start of the first access is T1, and that the temperature of the select memory cell MC at the start of the second access is T2. A graph representing I-V characteristics of a memory cell MC at temperature T1 is represented by a dashed line, and a graph representing I-V characteristics of a memory cell MC at temperature T2 is represented by a solid line.

As the temperature increases from temperature T1 to temperature T2, the snapback voltages decrease. That is, the snapback voltage of the memory cell MC in the low resistance state LRS is decreased from the voltage VSBL1 to a voltage VSBL2. Also, the snapback voltage of the memory cell MC in the high resistance state HRS is decreased from the voltage VSBH1 to a voltage VSBH2. In addition, the voltage at which the cell current IMC rapidly decreases is decreased from the voltage VST1 to a voltage VST2.

Figure 16:
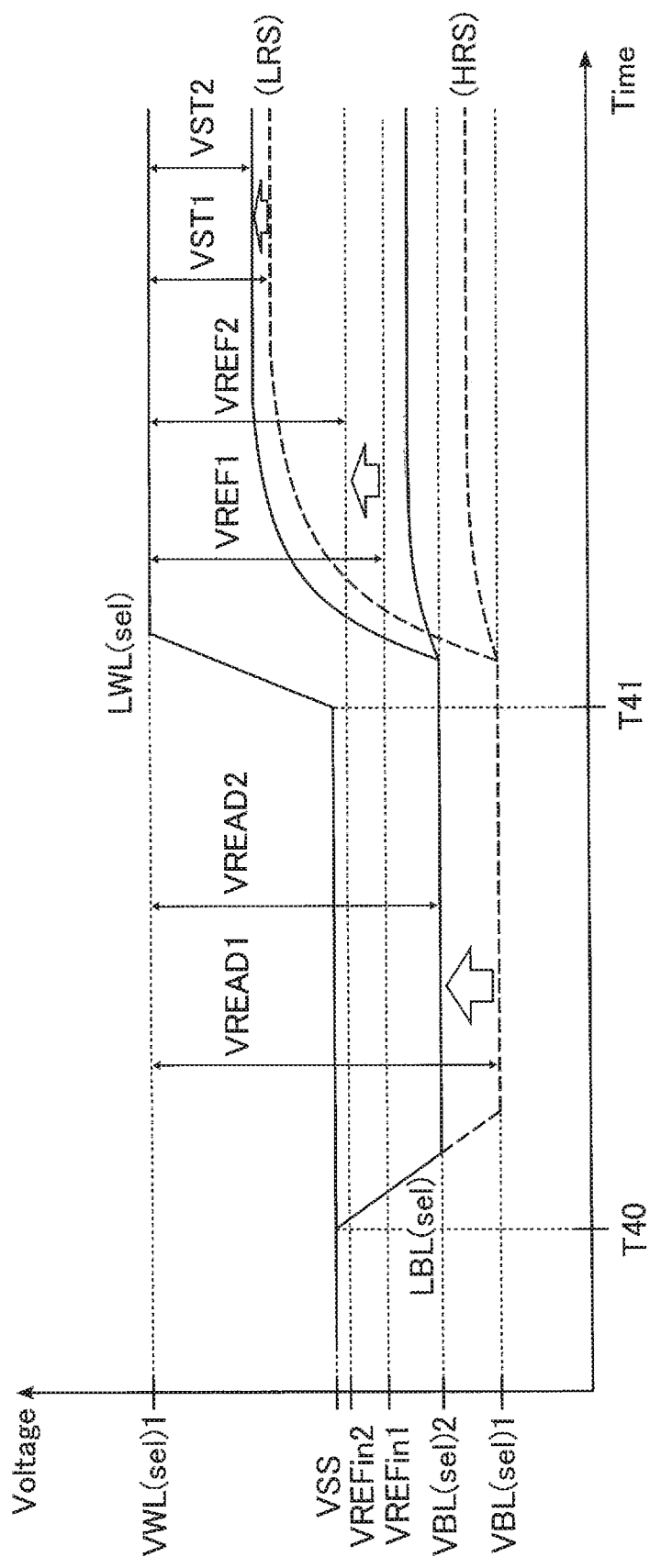
FIG. 16 is a timing chart showing an example of temporal changes of a voltage applied to a select memory cell in a read operation as a second access in the memory device according to the first embodiment.

FIG. 16 is a timing chart showing an example of temporal changes of a voltage VMC applied to a select memory cell MC in a read operation as a second access. In the description that follows, a voltage VREAD2 is larger than the voltage VSBL2 and smaller than the voltage VSBH2, and is, for example, a voltage of a magnitude that is an average of the voltage VSBL2 and the voltage VSBH2. The voltage VREAD2 is, for example, smaller than the voltage VREAD1.

In the example of FIG. 16, the voltage applied to the select local bit line LBL(sel) is decreased, and then the voltage applied to the select local word line LWL(sel) is increased, as in the example of FIG. 10. FIG. 16 shows an example in which the voltage applied to the select local word line LWL(sel) is increased to a voltage equal to that of the example of FIG. 10. In FIG. 16, the voltages in the example of FIG. 10 are shown by dashed lines for comparison; however, the timings of voltage variations shown by the dashed lines are not necessarily depicted with accuracy.

Before the start of the read operation, the voltage VSS is applied to both the select local word line LWL(sel) and the select local bit line LBL(sel).

At time T40, the voltage applied to the select local bit line LBL(sel) is decreased to a voltage VBL(sel)2. The voltage VBL(sel)2 is, for example, lower than the voltage VWL(sel)1 by the voltage VREAD2. The application of the voltage VBL(sel)2 to the select local bit line LBL(sel) is in response to transfer of the voltage VNN1 to the select local bit line LBL(sel) based on the control signal EN. For this purpose, the controller 15 increases, for example, the voltage of the control signal EN and/or the magnitude of the voltage VNN1, in comparison with the example of FIG. 10.

After the potential of the select local bit line LBL(sel) becomes stable, the voltage of the control signal EN is decreased to be lower than a threshold voltage of the transistor Tr1, thus bringing the select local bit line LBL(sel) to a floating state. At this time, the potential difference between the select local word line LWL(sel) and the select local bit line LBL(sel) is smaller than the voltage VSBL2.

Subsequently, at time T41, the voltage applied to the select local word line LWL(sel) is increased to the voltage VWL(sel)1. Upon application of the voltage VWL(sel)1, the potential of the select local word line LWL(sel) increases. This causes the potential of the select local bit line LBL(sel) to be changed and where the potential of the select local bit line LBL(sel) becomes stable depends on whether the select memory cell MC is in the low resistance state LRS or in the high resistance state HRS, as described with reference to FIG. 10. Specifically, when the select memory cell MC is in the low resistance state LRS, the potential of the select local bit line LBL(sel) becomes stable at a lower value than that of the select local word line LWL(sel) by the voltage VST2. When the select memory cell MC is in the high resistance state HRS, the potential of the select local bit line LBL (sel) can be regarded as becoming stable at a lower value than that of the select local word line LWL(sel) by the voltage VREAD2.

The voltage VREFin applied to the second input terminal of the comparator CMP1 is a voltage VREFin2 that is lower than the voltage VWL(sel)1 by a voltage VREF2. The voltage VREF2 is a voltage that is larger than the voltage VST2 and smaller than the voltage VREAD2, and is, for example, a voltage of a magnitude that is an average of the voltage VST2 and the voltage VREAD2. For example, the voltage VREF2 is smaller than the voltage VREF1. When the voltage VREF2 is smaller than the voltage VREF1, the voltage VREFin2 is higher than the voltage VREFin1. Thereby, it is possible to perceive which of the low resistance state LRS and the high resistance state HRS the select memory cell MC is in, based on the signal output from the comparator CMP1.

In this manner, when a read operation is performed as a second access, the voltage VREAD2 that is smaller than the voltage VREAD1 is used, instead of the voltage VREAD1 in a read operation performed as a first access. In accordance therewith, the voltage VREFin2 that is higher than the voltage VREFin1 is used as a reference voltage, instead of the voltage VREFin1 used in the first access.

The voltages used in the second access have been described in detail; however, the present embodiment is not limited thereto.

For example, the degree of the temperature increase at the periphery of the memory cell MC to be the target of the second access may be changed according to the period of time from the start of the first access to the start of the second access. Also, the degree of the temperature increase at the periphery of the memory cell MC to be the target of the second access may be changed according to the operation performed as the first access. For example, the degree of the temperature increase may vary between when a write operation to switch a select memory cell MC to the low resistance state LRS is performed and when a write operation to switch a select memory cell MC to the high resistance state HRS is performed. Moreover, when the memory cell MC to be the target of the first access and the memory cell MC to be the target of the second access are different, the degree of the temperature increase may vary according to the memory cell MC to be the target of the second access. The degree of the temperature increase is based on, for example, a distance along any direction between the memory cell MC to be the target of the first access and the memory cell MC to be the target of the second access. The degree of the temperature increase is also based on, for example, a thermal resistance between the memory cell MC to be the target of the first access and the memory cell MC to be the target of the second access.

Accordingly, the memory device 1 may be configured in such a manner that a voltage used in the second access varies, according to at least one of: the period of time from the start of the first access to the start of the second access; the operation performed as the first access; the distance between the memory cell MC to be the target of the first access and the memory cell MC to be the target of the second access along a certain direction; and a thermal resistance between the memory cell MC to be the target of the first access and the memory cell MC to be the target of the second access. Alternatively, the memory device 1 may be configured in such a manner that a voltage to be used in the second access is selected from multiple different voltages, according to at least one of: the period of time from the start of the first access to the start of the second access; the operation performed as the first access; the distance between the memory cell MC to be the target of the first access and the memory cell MC to be the target of the second access along a certain direction; and a thermal resistance between the memory cell MC to be the target of the first access and the memory cell MC to be the target of the second access.

A detailed description has been given above of control performed in the second access performed after performance of the first access; however, the memory device 1 may be configured in such a manner that similar control is performed when, for example, a third access to a memory cell MC is performed within the first period of time from the start of the second access. In addition, a description has been given above of a case where the second access is performed by the memory device 1 subsequent to the first access; however, the first access and the second access need not necessarily be performed in succession. For example, the memory device 1 may perform, between the first access and the second access, an access to a memory cell array MAT that is different from the memory cell array MAT to be the target of the first access and the second access. Alternatively, the memory device 1 may perform, between the first access and the second access, an operation that is other than a write operation and a read operation and does not cause the above-described heat generation.

[Advantageous Effects]

The memory device 1 according to the first embodiment makes a first access to a memory cell MC, and, subsequent to the first access, starts a second access to a memory cell MC within a first period of time from the start of the first access. A write operation or a read operation is performed as a first access. A write operation or a read operation is performed as a second access.

As a result of the performance of the first access, heat may be generated by the switching element in the select memory cell MC taking the conductive-state. When such heat generation occurs, the temperature increase occurs at the periphery of the select memory cell MC.

Of the write operations and the read operations, operations that cause the temperature increase are classified into a first access type, and operations other than such operations are classified into a second access type. In the first embodiment, a write operation and a read operation on a select memory cell MC in the low resistance state LRS are classified into the first access type, and a read operation on a select memory cell MC in the high resistance state HRS are classified into a second access type.

When the memory device 1 performs, as a first access, an operation classified into the first access type, the memory device 1 performs an operation as a second access using a voltage different from the voltage used in the same operation performed as a first access. On the other hand, when the memory device 1 performs, as a first access, an operation classified into the second access type, the memory device 1 performs an operation as a second access using a voltage identical to the voltage used in the same operation performed as a first access.

The second access in the case where an operation classified into the first access type is performed as a first access will be described.

When a write operation is performed as a first access, the voltage VRS1 is used. The voltage VRS1 is a voltage that allows, for example, a PCM element to melt. The above-described residual heat contributes to a melting of a PCM element. Accordingly, when a write operation is performed as a second access and the identical voltage VRS1 is applied to a select memory cell MC, an energy beyond the durability limit may be applied to the PCM element.

In the memory device 1 according to the first embodiment, when a write operation is performed as a second access, as described with reference to FIGS. 12 to 14, the voltage applied to the select memory cell MC is decreased, and/or the pulse width of the voltage is decreased, in comparison with the case where a write operation is performed as a first access. It is thereby possible to prevent an energy beyond the durability limit from being applied to the PCM element during the write operation.

When a read operation is performed as a first access, the voltage VREAD1 is used. When, for example, the voltage VREAD1 is applied to a select memory cell MC, the select memory cell MC in the low resistance state LRS is turned on, and the select memory cell MC in the high resistance state HRS is not turned on. It is possible to perceive which of the low resistance state LRS and the high resistance state HRS the select memory cell MC is in, based on whether or not the select memory cell MC is turned on. With the above-described temperature increase, the snapback voltage decreases both in the case where the memory cell MC is in the low resistance state LRS and the case where the memory cell MC is in the high resistance state HRS, as described with reference to FIG. 15. When a read operation is performed as a second access and the voltage VREAD1 is used, the select memory cell MC in the high resistance state HRS may be turned on when the voltage VREAD1 is applied to the select memory cell MC. This may cause erroneous reading.

In the memory device 1 according to the first embodiment, when a read operation is performed as a second access, as described with reference to FIG. 16, a voltage VREAD2 that is, for example, smaller than the voltage VREAD1 is used. In accordance therewith, a voltage VREFin2 that is higher than the voltage VREFin1 is used as a reference voltage, instead of the voltage VREFin1 used in a first access. This prevents an occurrence of erroneous reading.

[Modifications]

A read operation performed by the memory device 1 is not limited to the above-described one. The memory device 1 may perform, for example, a read operation that will be described below. Hereinafter, the description will focus mainly on matters that are different from the above-described configuration examples and operation examples, with respect to each of the modifications. Advantageous effects similar to those described in the first embodiment are produced by the modifications described below.

(1) First Modification

For simplicity of description, a read operation performed by the memory device 1 according to a first modification of the first embodiment will also be referred to as a "constant-voltage read operation".

Figure 17:
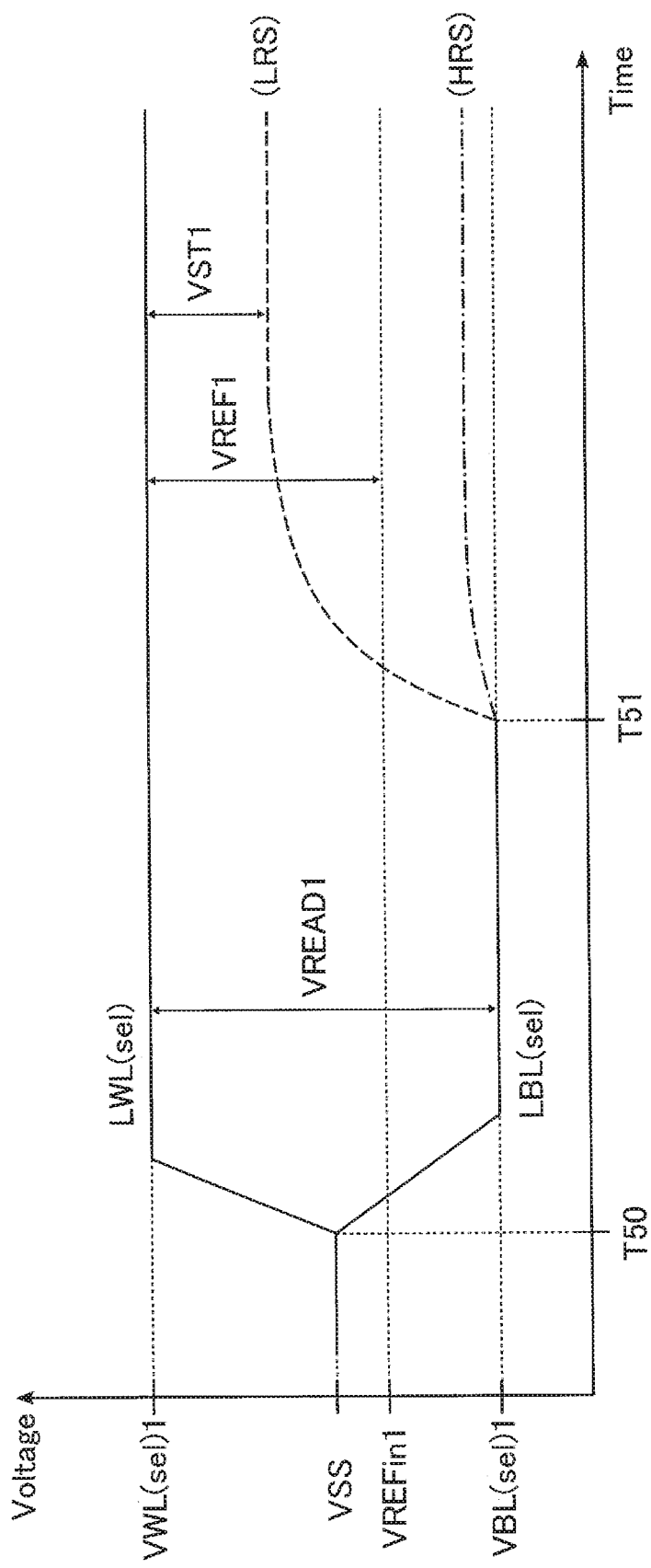
FIG. 17 is a timing chart showing an example of temporal changes of a voltage applied to a select memory cell in a read operation as a first access in the memory device according to a first modification of the first embodiment.

FIG. 17 is a timing chart showing an example of temporal changes of a voltage VMC applied to a select memory cell MC in a read operation as a first access in the memory device 1 according to the first modification of the first embodiment.

Before the start of the read operation, the voltage VSS is applied to both the select local word line LWL(sel) and the select local bit line LBL(sel).

At time T50, the voltage applied to the select local word line LWL(sel) is increased to a voltage VWL(sel)1, and the voltage applied to the select local bit line LBL(sel) is decreased to a voltage VBL(sel)1. The application of the voltage VBL(sel)1 to the select local bit line LBL(sel) is in response to a transfer of the voltage VNN1 to the select local bit line LBL(sel) based on the control signal EN. The voltage VWL(sel)1 is a voltage that is higher than the voltage VBL(sel)1 by the voltage VREAD1, as described with reference to FIG. 10. The average voltage of the voltage VWL(sel)1 and the voltage VBL(sel)1 is, for example, the voltage VSS.

After the potentials of the select local word line LWL(sel) and the select local bit line LBL(sel) become stable, the voltage of the control signal EN is decreased to be lower than the threshold voltage of the transistor Tr1 at time T51, thus bringing the select local bit line LBL(sel) to a floating state.

When the select memory cell MC is in the low resistance state LRS, the potential difference between the select local bit line LBL(sel) and the select local word line LWL(sel) exceeds the voltage VSBL1, and the cell current IMC flows from the select local word line LWL(sel) to the select local bit line LBL(sel). Thereby, the potential of the select local bit line LBL(sel) increases, thus reducing the potential difference between the select local bit line LBL(sel) and the select local word line LWL(sel). When the potential difference becomes the voltage VST1, the cell current IMC rapidly decreases, making the potential of the select local bit line LBL(sel) stable.

When the select memory cell MC is in the high resistance state HRS, the potential difference between the select local bit line LBL(sel) and the select local word line LWL(sel) does not exceed the voltage VSBH1, allowing very little flow of the cell current IMC. The potential of the select local bit line LBL(sel) is substantially maintained.

In this manner, the values at which the potential of the select local bit line LBL(sel) becomes stable when the select memory cell MC is in the low resistance state LRS and in the high resistance state HRS respectively are similar to those described with reference to FIG. 10. Accordingly, by using the voltages VREF1 and VREFin1 that are similar to those described with reference to FIG. 10, it is possible to perceive which of the low resistance state LRS and the high resistance state HRS the select memory cell MC is in, based on the signal output from the comparator CMP1.

FIG. 18 shows temporal changes of the voltage VMC and the cell current IMC in the read operation described with reference to FIG. 17, on a graph representing I-V characteristics of a memory cell MC.

First, a case will be described where the select memory cell MC is in the high resistance state HRS.

With the increase in the voltage applied to the select local word line LWL(sel) and the decrease in the voltage applied to the select local bit line LBL(sel) at time T50, the voltage VMC gradually increases and reaches the voltage VREAD1. During this period, since the voltage VMC does not reach the voltage VSBH1, the cell current IMC and the voltage VMC change according to the pre-snapback I-V characteristics. When the select local bit line LBL(sel) is brought to a floating state at time T51, the voltage VMC does not exceed the voltage VSBH1, and the cell current IMC flows very little. Accordingly, the cell current IMC and the voltage VMC continue to follow the pre-snapback I-V characteristics at time T51 and thereafter.

Next, a case will be described where the select memory cell MC is in the low resistance state LRS.

With the increase in the voltage applied to the select local word line LWL(sel) and the decrease in the voltage applied to the select local bit line LBL(sel) at time T50, the voltage VMC gradually increases and reaches the voltage VREAD1. During this period, the cell current IMC and the voltage VMC are as follows. That is, the cell current IMC and the voltage VMC change according to the pre-snapback I-V characteristics until the voltage VMC reaches the voltage VSBL1. When the voltage VMC exceeds the voltage VSBL1, the cell current IMC rapidly increases. After the voltage VMC exceeds the voltage VSBL1, the cell current IMC and the voltage VMC change according to the post-snapback I-V characteristics. When the voltage VMC reaches the voltage VREAD1, the current IMC becomes a current IREAD1.

When the select local bit line LBL(sel) is brought to a floating state at time T51, the cell current IMC flows to the select local bit line LBL(sel) in the floating state, causing the potential of the select local bit line LBL(sel) to increase, thus decreasing the voltage VMC. When the voltage VMC reaches the voltage VST1, the cell current IMC rapidly decreases, and the cell current IMC and the voltage VMC follow the pre-snapback I-V characteristics. With the rapid decrease in the cell current IMC, the potential of the select local bit line LBL(sel) becomes stable.

In the constant-voltage read operation described in detail above, the snapback phenomenon occurs when the select memory cell MC is in the low resistance state LRS, while the snapback phenomenon does not occur when the select memory cell MC is in the high resistance state HRS. Accordingly, when the select memory cell MC is in the low resistance state LRS, the switching element in the select memory cell MC is caused to take the conductive-state, thus generating heat. The generated heat causes a temperature increase at the periphery of the select memory cell MC.

In the first modification, too, a write operation and a read operation on a select memory cell MC in the low resistance state LRS are classified into the first access type, and a read operation on a select memory cell MC in the high resistance state HRS is classified into the second access type.

Hereinafter, a read operation performed by the memory device 1 as a second access when an operation classified into the first access type is performed by the memory device 1 as the first access will be described in detail.

Figure 19:
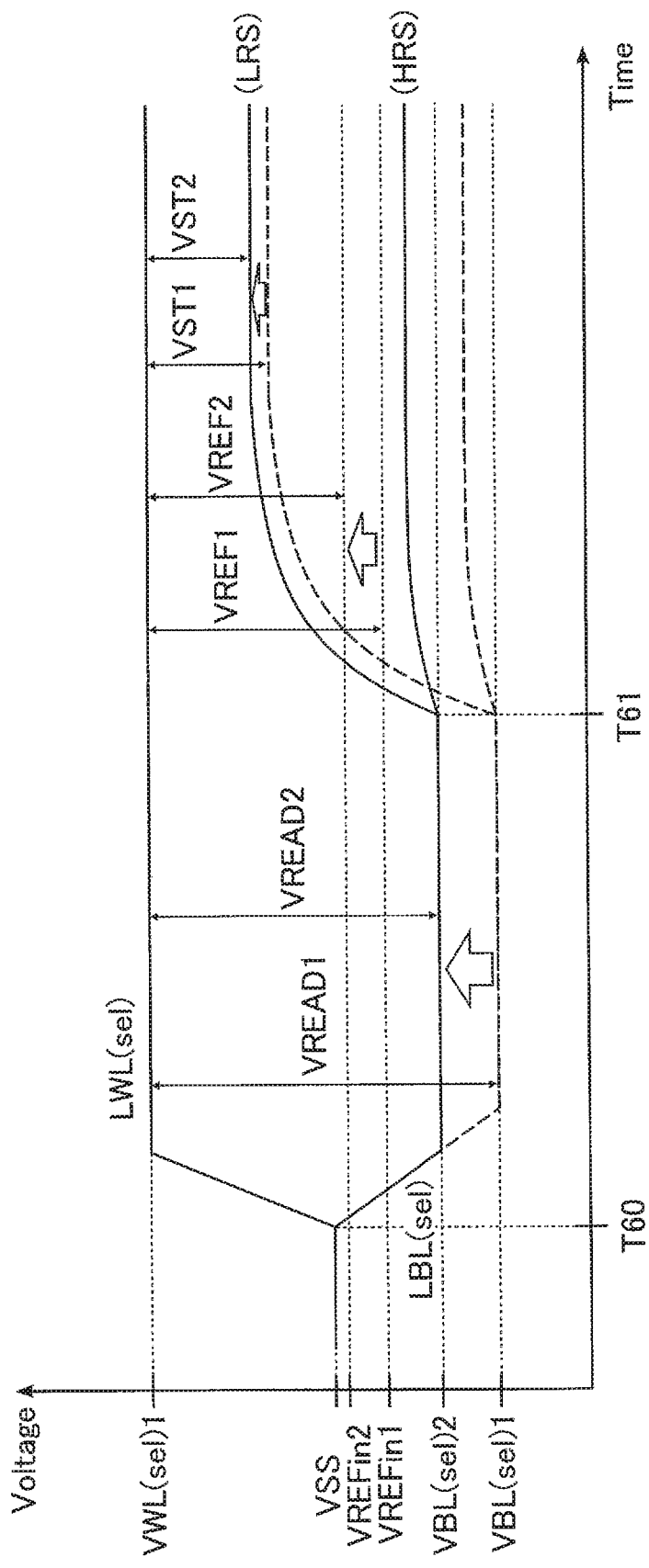
FIG. 19 is a timing chart showing an example of temporal changes of a voltage applied to a select memory cell in a read operation as a second access in the memory device according to the first modification of the first embodiment.

FIG. 19 is a timing chart showing an example of temporal changes of a voltage VMC applied to a select memory cell MC in a read operation as a second access in the memory device 1 according to the first modification of the first embodiment.

In the example of FIG. 19, the increase of the voltage applied to the select local word line LWL(sel) and the decrease of the voltage applied to the select local bit line LBL(sel) are performed, and then the select local bit line LBL(sel) is brought to a floating state, as in the example of FIG. 17. FIG. 19 shows an example in which the voltage applied to the select local word line LWL(sel) is increased to a voltage equal to that of the example of FIG. 17. In FIG. 19, the voltages in the example of FIG. 17 are shown by dashed lines for comparison; however, the timings of voltage variations shown by the dashed lines are not necessarily depicted with accuracy.

Before the start of the read operation, the voltage VSS is applied to both the select local word line LWL(sel) and the select local bit line LBL(sel).

At time T60, the voltage applied to the select local word line LWL(sel) is increased to the voltage VWL(sel)1, and the voltage applied to the select local bit line LBL(sel) is decreased to the voltage VBL(sel)2. The voltage VBL(sel)2 is, for example, a lower voltage than the voltage VWL(sel)1 by the voltage VREAD2, similarly to the configuration described with reference to FIG. 16. The application of the voltage VBL(sel)2 to the select local bit line LBL(sel) is in response to a transfer of the voltage VNN1 to the select local bit line LBL(sel) based on the control signal EN. For this purpose, the controller 15 increases, for example, the voltage of the control signal EN and/or increases the magnitude of the voltage VNN1, in comparison with the example of FIG. 17.

After the potentials of the select local word line LWL(sel) and the select local bit line LBL(sel) become stable, the voltage of the control signal EN is decreased to be lower than the threshold voltage of the transistor Tr1 at time T61, thus bringing the select local bit line LBL(sel) to a floating state. This causes the potential of the select local bit line LBL(sel) to be changed and where the potential of the select local bit line LBL(sel) becomes stable depends on whether the select memory cell MC is in the low resistance state LRS or in the high resistance state HRS, similarly to the configuration described with reference to FIG. 17. Specifically, when the select memory cell MC is in the low resistance state LRS, the potential of the select local bit line LBL(sel) becomes stable at a lower value than that of the select local word line LWL(sel) by the voltage VST2. When the select memory cell MC is in the high resistance state HRS, the potential of the select local bit line LBL (sel) can be regarded as becoming stable at a lower value than that of the select local word line LWL(sel) by the voltage VREAD2.

In this manner, the values at which the potential of the select local bit line LBL(sel) becomes stable when the select memory cell MC is in the low resistance state LRS and in the high resistance state HRS respectively are similar to those described with reference to FIG. 16. Accordingly, by using the voltages VREF2 and VREFin2 that are similar to those described with reference to FIG. 16, it is possible to perceive which of the low resistance state LRS and the high resistance state HRS the select memory cell MC is in, based on the signal output from the comparator CMP1.

Figure 20:
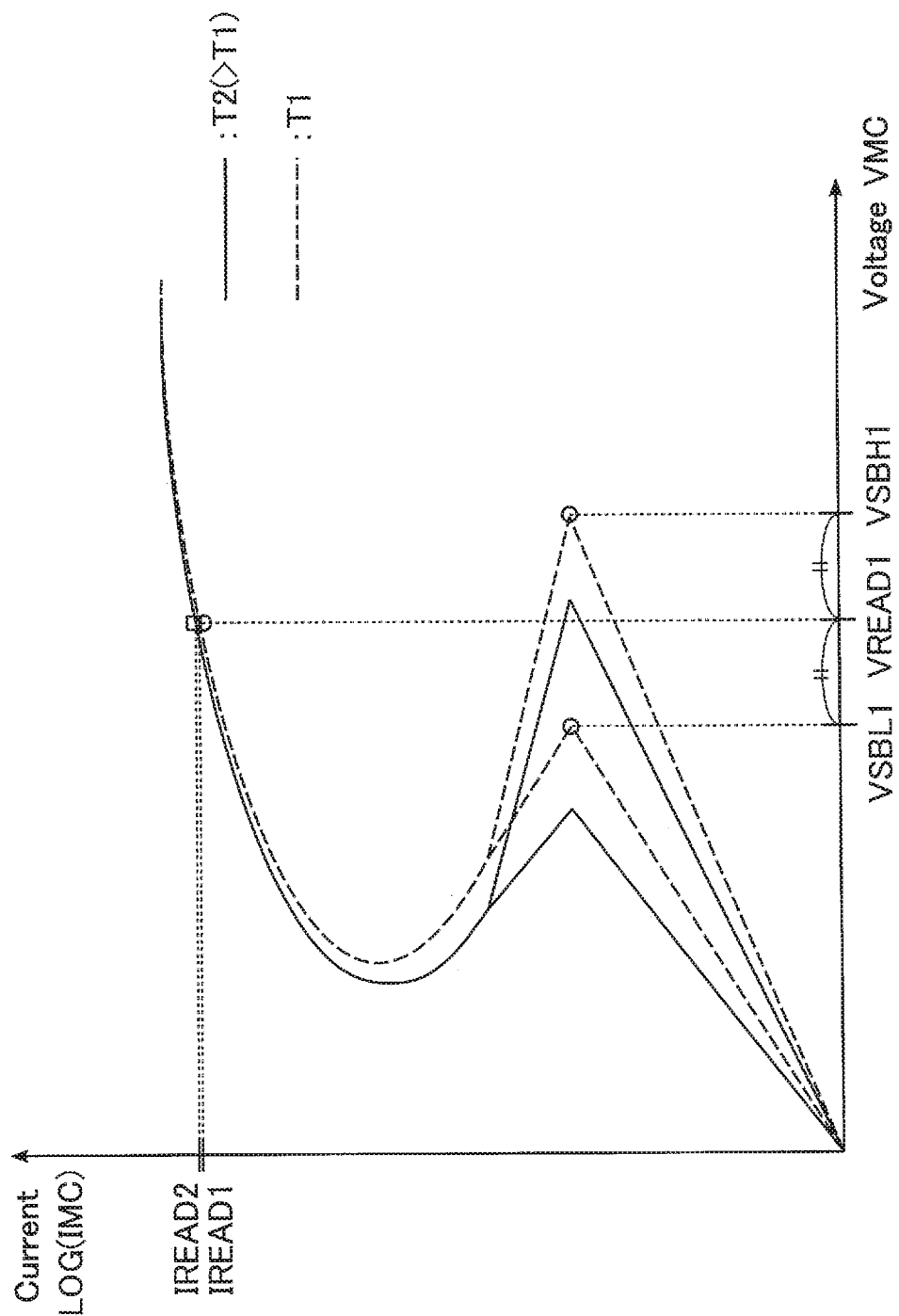
FIG. 20 shows another example of a read operation as a second access in the memory device according to the first modification of the first embodiment, on a graph representing I-V characteristics of a memory cell.

FIG. 20 shows another example of a read operation as a second access in the memory device 1 according to the first modification of the first embodiment, on a graph representing I-V characteristics of a memory cell.

In the read operation, the voltage VMC is brought to the voltage VREAD1, as in a read operation performed as a first access. At this time, when a select memory cell MC is in the low resistance state LRS, the cell current IMC is a current IREAD2 that is larger than the current IREAD1. On the other hand, when a select memory cell MC is in the high resistance state HRS, the cell current IMC flows very little when the voltage VREAD1 is smaller than the voltage VSBH2.

In the read operation, it is also possible to perceive which of the low resistance state LRS and the high resistance state HRS the select memory cell MC is in, based on, for example, a comparison between the magnitude of the cell current IMC and a certain reference current. Let us assume that the reference current is, for example, a current of a magnitude that is an average of the cell current IMC of the select memory cell MC in the high resistance state HRS and the cell current IMC of the select memory cell MC in the low resistance state LRS when the voltage VMC is brought to the voltage VREAD1.

In this manner, when a read operation is performed as a second access, the cell current IMC of the select memory cell MC in the low resistance state LRS when the voltage VMC is brought to the voltage VREAD1 is the current IREAD2, which is larger than the current IREAD1 in a first access. Thus, when a read operation is performed as a second access, the reference current is increased, in comparison with when a read operation is performed as a first access.

(2) Second Modification

For simplicity of description, a read operation performed by the memory device 1 according to a second modification of the first embodiment will also be referred to as a "constant-current read operation".

FIG. 21 shows an example of a read current used in a read operation as a first access in the memory device 1 according to the second modification of the first embodiment, on a graph representing I-V characteristics of a memory cell MC.

First, a case will be described where a memory cell MC is in the low resistance state LRS.

As the cell current IMC is gradually increased, the voltage VMC continuously increases until the cell current IMC reaches the current ISBL1α. When the cell current IMC reaches the current ISBL1α, the voltage VMC becomes the voltage VSBL1. As the cell current IMC is further increased to exceed the current ISBL1α, the voltage VMC continuously decreases.

The same applies to the case where the memory cell MC is in the high resistance state HRS.

As the cell current IMC is gradually increased, the voltage VMC continuously increases until the cell current IMC reaches the current ISBH1α. When the cell current IMC reaches the current ISBH1α, the voltage VMC becomes the voltage VSBH1. As the cell current IMC is further increased to exceed the current ISBH1α, the voltage VMC continuously decreases.

The rate of increase of the voltage VMC to the increase of the cell current IMC is high, for example, when the memory cell MC is in the high resistance state HRS, in comparison with when the memory cell MC is in the low resistance state LRS. At this time, as the cell current IMC increases within the range in which the voltage VMC increases, as described above, the difference between the voltage VMC of the memory cell MC in the high resistance state HRS and the voltage VMC of the memory cell MC in the low resistance state LRS increases.

A current IREAD1 that is smaller than the current ISBL1α and smaller than the current ISBH1α, for example, is used as a read current. When the current IREAD1 is supplied to the select memory cell MC, the voltage VMC when the memory cell MC is in the low resistance state LRS is a voltage VL1, and the voltage VMC when the memory cell MC is in the high resistance state HRS is a voltage VH1. The current IREAD1 is, for example, a cell current IMC of a largest magnitude that ensures a certain margin both between the voltage VL1 and the voltage VSBL1 and between the voltage VH1 and the voltage VSBH1.

FIG. 22 shows an example of a circuit configuration relating to a read operation in the memory device 1 according to the second modification of the first embodiment. The circuit configuration corresponds to the circuit configuration prepared by modifying the circuit configuration shown in FIG. 9 to change the configuration of the sense amplifier 112 coupled to the select global bit line GBL(sel).

The sense amplifier 112 includes a current source CS1 and a comparator CMP1. An input terminal of the current source CS1 is coupled to the select global bit line GBL(sel), and a voltage VNN2 is applied to an output terminal of the current source CS1. The voltage VNN2 is, for example, a voltage supplied from the controller 15. The coupling of the comparator CMP1 is similar to that of the example of FIG. 9. A first input terminal of the comparator CMP1 is coupled to the select global bit line GBL(sel). A voltage applied to the select local bit line (sel) is transferred to the first input terminal. A voltage VREFin as a reference voltage is applied to a second input terminal of the comparator CMP1. A signal indicating a magnitude relationship between the voltage applied to the first input terminal and the voltage VREFin is output from the output terminal of the comparator CMP1.

FIG. 23 is a timing chart showing an example of temporal changes of a voltage VMC applied to a select memory cell MC in a read operation as a first access in the memory device 1 according to the second modification of the first embodiment.

Before the start of the read operation, the voltage VSS is applied to both the select local word line LWL(sel) and the select local bit line LBL(sel).

At time T70, the voltage applied to the select local word line LWL(sel) is increased to a voltage VWL(sel)1. In the second modification, the voltage VWL(sel)1 is, for example, a voltage that is higher than the voltage VSS by half the magnitude of the voltage VH1.

At time T70, the current source CS1 is operated to bring the cell current IMC to the current IREAD1.

When the select memory cell MC is in the low resistance state LRS, the drop of the voltage VL1 occurs in the select memory cell MC. Thereby, the potential of the select local bit line LBL(sel) is decreased, allowing the potential difference between the select local bit line LBL(sel) and the select local word line LWL(sel) to be the voltage VL1.

When the select memory cell MC is in the high resistance state HRS, the drop of the voltage VH1 occurs in the select memory cell MC. Thereby, the potential of the select local bit line LBL(sel) is decreased, allowing the potential difference between the select local bit line LBL(sel) and the select local word line LWL(sel) to be the voltage VH1.

In this manner, where the potential of the select local bit line LBL(sel) becomes stable depends on whether the select memory cell MC is in the low resistance state LRS or in the high resistance state HRS. Specifically, when the select memory cell MC is in the low resistance state LRS, the potential of the select local bit line LBL(sel) becomes stable at a lower value than that of the select local word line LWL(sel) by the voltage VL1. When the select memory cell MC is in the high resistance state HRS, the potential of the select local bit line LBL (sel) becomes stable at a lower value than that of the select local word line LWL(sel) by the voltage VH1.

The voltage VREFin applied to the second input terminal of the comparator CMP1 is a voltage VREFin1 that is lower than the voltage VWL(sel)1 by a voltage VREF1. The voltage VREF1 is a voltage that is larger than the voltage VL1 and smaller than the voltage VH1, and is, for example, a voltage of a magnitude that is an average of the voltage VL1 and the voltage VH1. Thereby, it is possible to perceive which of the low resistance state LRS and the high resistance state HRS the select memory cell MC is in, based on the signal output from the comparator CMP1.

In the constant-current read operation described in detail above, the snapback phenomenon does not occur in either of the cases where the select memory cell MC is in the low resistance state LRS and the high resistance state HRS. Thus, the temperature increase does not occur.

Accordingly, in the second modification, a write operation is classified into a first access type, and a read operation is classified into a second access type.

Hereinafter, a read operation as a second access performed by the memory device 1 in the case where a write operation classified into the first access type is performed by the memory device 1 as the first access will be described in detail.

Figure 24:
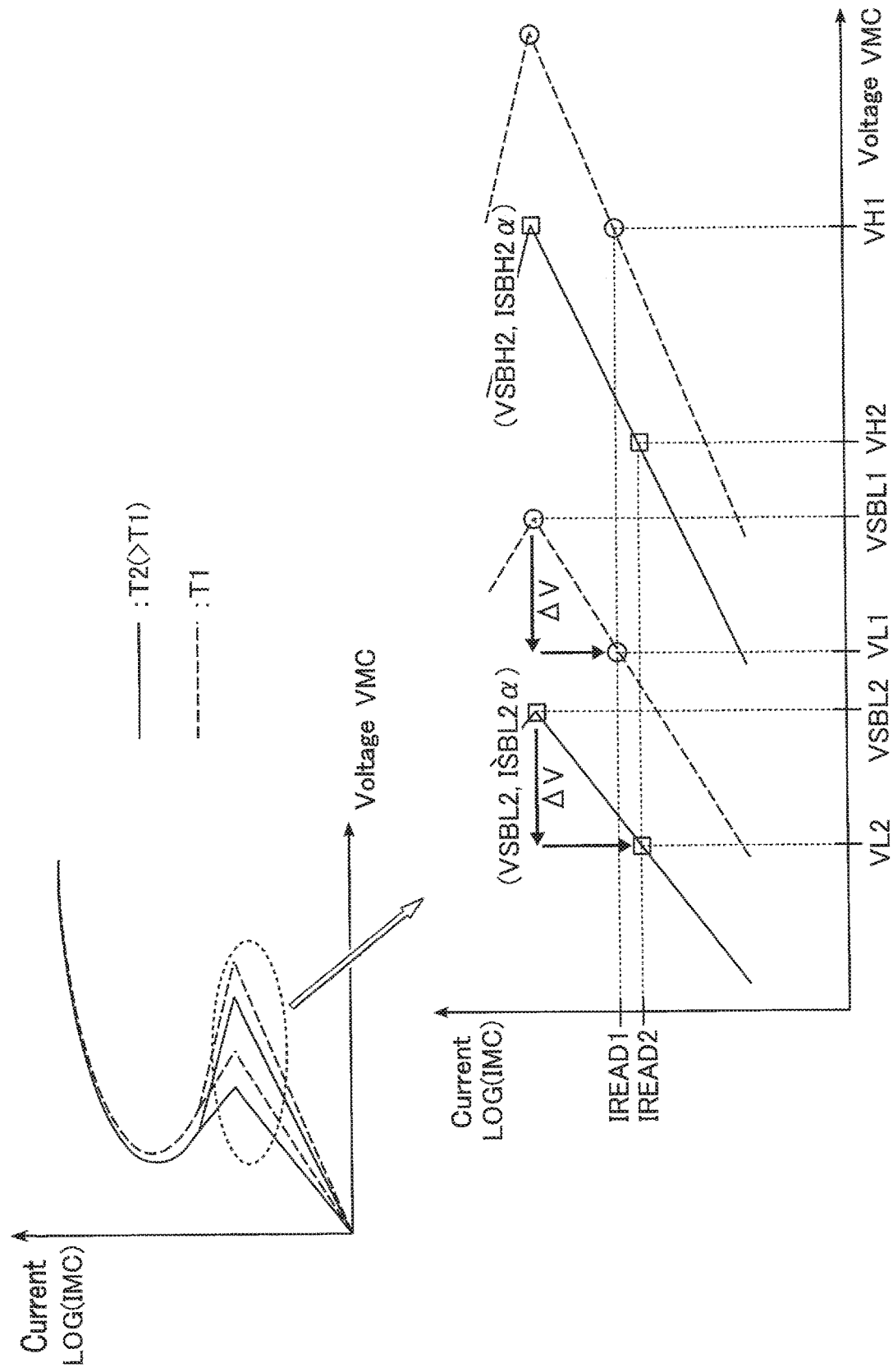
FIG. 24 shows an example of a read current used in a read operation as a second access in the memory device according to the second modification of the first embodiment, on a graph representing I-V characteristics of a memory cell.

FIG. 24 shows an example of a read current used in a read operation as a second access, on a graph representing I-V characteristics of a memory cell MC.

The graph representing I-V characteristics of the memory cell MC at temperature T2 will be described.

First, a case will be described where a memory cell MC is in the low resistance state LRS.

As the cell current IMC is gradually increased, the voltage VMC continuously increases until the cell current IMC reaches a current ISBL2α. When the cell current IMC reaches the current ISBL2α, the voltage VMC becomes the voltage VSBL2. As the cell current IMC is further increased to exceed the current ISBL2α, the voltage VMC continuously decreases.

The same applies to the case where the memory cell MC is in the high resistance state HRS.

As the cell current IMC is gradually increased, the voltage VMC continuously increases until the cell current IMC reaches a current ISBH2α. When the cell current IMC reaches the current ISBH2α, the voltage VMC becomes the voltage VSBH2. As the cell current IMC is further increased to exceed the current ISBH2α, the voltage VMC continuously decreases.

A current IREAD2 that is smaller than the current ISBL2α and smaller than the current ISBH2α, for example, is used as the read current. When the current IREAD2 is supplied to the select memory cell MC, the voltage VMC of the memory cell MC in the low resistance state LRS is a voltage VL2, and the voltage VMC of the memory cell MC in the high resistance state HRS is a voltage VH2. The current IREAD2 is, for example, a cell current IMC of a largest magnitude that ensures a certain margin (indicated as ΔV in FIG. 24) both between the voltage VL2 and the voltage VSBL2 and between the voltage VH2 and the voltage VSBH2.

In the example of FIG. 24, the voltage VL1 corresponding to the current IREAD1 is smaller than the voltage VSBL1 by a margin ΔV, and the voltage VL2 corresponding to the current IREAD2 is smaller than the voltage VSBL2 by the margin ΔV. At this time, for example, the current IREAD2 is smaller than the current IREAD1, the voltage VL2 is smaller than the voltage VL1, and the voltage VH2 is smaller than the voltage VH1.

FIG. 25 shows another example of a read current used in a read operation as a second access, on a graph representing I-V characteristics of a memory cell MC.

The current IREAD1 used in a first access is, for example, also used in a second access. At this time, the voltage VMC of the memory cell MC in the low resistance state LRS is a voltage VL2, and the voltage VMC of the memory cell MC in the high resistance state HRS is a voltage VH2. Similarly to the example of FIG. 24, the voltage VL2 is smaller than the voltage VL1, and the voltage VH2 is smaller than the voltage VH1.

Figure 26:
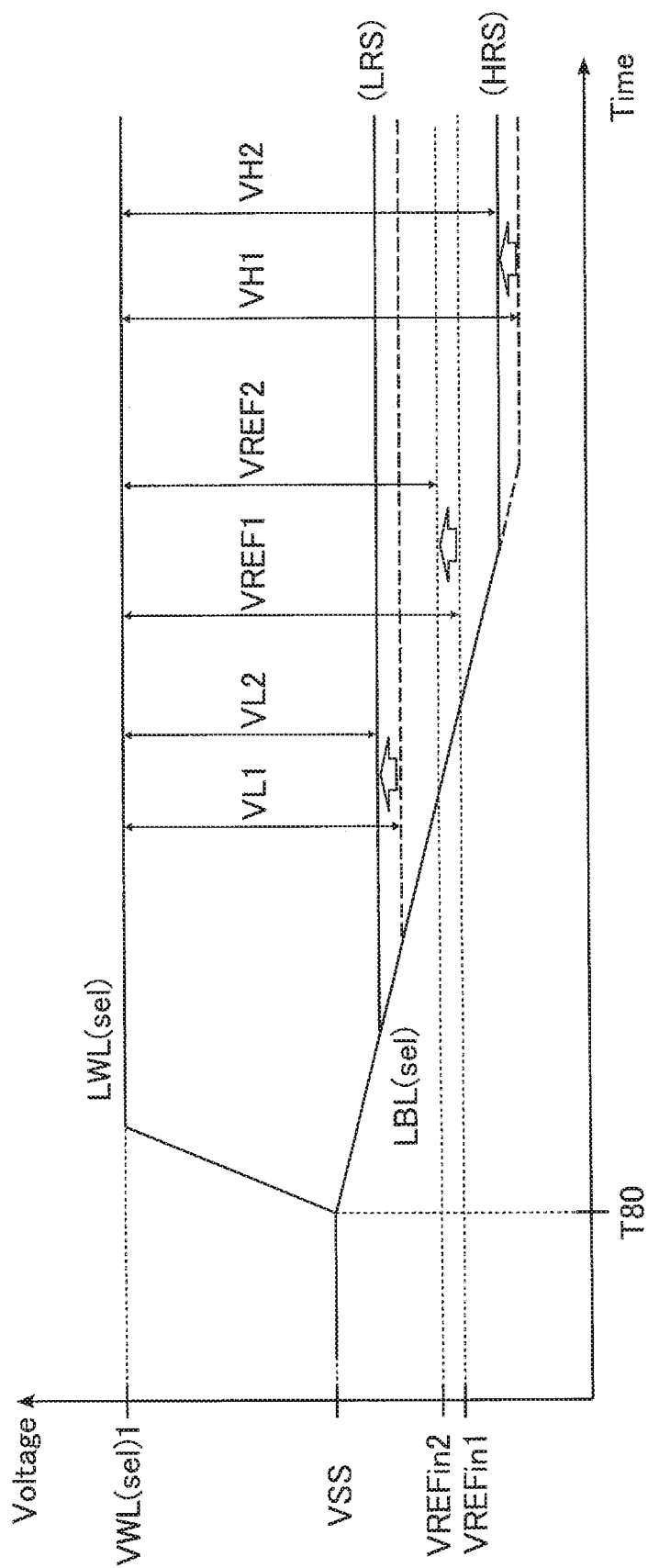
FIG. 26 is a timing chart showing an example of temporal changes of a voltage applied to a select memory cell in a read operation as a second access in the memory device according to the second modification of the first embodiment.

FIG. 26 is a timing chart showing an example of temporal changes of a voltage VMC applied to a select memory cell MC in a read operation as a second access in the memory device 1 according to the second modification of the first embodiment.

In the example of FIG. 26, the increase in the voltage applied to the select local word line LWL(sel) and the operation of the current source CS1 are performed, similarly to the example of FIG. 23. FIG. 26 shows an example in which the voltage applied to the select local word line LWL(sel) is increased to a voltage equal to that of the example of FIG. 23. In FIG. 26, the voltages in the example of FIG. 23 are shown by dashed lines for comparison; however, the timings of voltage variations shown by the dashed lines are not necessarily depicted with accuracy.

Before the start of the read operation, the voltage VSS is applied to both the select local word line LWL(sel) and the select local bit line LBL(sel).

At time T80, the voltage applied to the select local word line LWL(sel) is increased to the voltage VWL(sel)1.

At time T80, the current source CS1 is operated to bring the cell current IMC to the current IREAD described with reference to FIGS. 24 and 25. This causes the potential of the select local bit line LBL(sel) to be changed, as described with reference to FIG. 23, and where the potential of the select local bit line LBL(sel) becomes stable depends on whether the select memory cell MC is in the low resistance state LRS or in the high resistance state HRS. Specifically, when the select memory cell MC is in the low resistance state LRS, the potential of the select local bit line LBL(sel) becomes stable at a lower value than that of the select local word line LWL(sel) by the voltage VL2. When the select memory cell MC is in the high resistance state HRS, the potential of the select local bit line LBL (sel) becomes stable at a lower value than that of the select local word line LWL(sel) by the voltage VH2.

The voltage VREFin applied to the second input terminal of the comparator CMP1 is a voltage VREFin2 that is lower than the voltage VWL(sel)1 by a voltage VREF2. The voltage VREF2 is a voltage that is larger than the voltage VL2 and smaller than the voltage VH2, and is, for example, a voltage of a magnitude that is an average of the voltage VL2 and the voltage VH2. For example, the voltage VREF2 is smaller than the voltage VREF1. When the voltage VREF2 is smaller than the voltage VREF1, the voltage VREFin2 is higher than the voltage VREFin1. Thereby, it is possible to perceive which of the low resistance state LRS and the high resistance state HRS the select memory cell MC is in, based on the signal output from the comparator CMP1.

In this manner, when a read operation is performed as a second access, a current IREAD2 that is smaller than the current IREAD1, for example, is used, instead of the current IREAD1 used in a read operation performed as a first access. In accordance therewith, a voltage VREFin2 that is higher than the voltage VREFin1 is used as a reference voltage, instead of the voltage VREFin1 used in a first access.

In the memory device 1 according to the second modification of the first embodiment, since such a current and voltage are used in a read operation performed as a second access, it is possible to prevent an occurrence of erroneous reading.

Second Embodiment

Hereinafter, a memory device 1 according to a second embodiment will be described.

[Configuration Example]

A configuration of the memory device 1 according to the second embodiment will be described, focusing mainly on differences from the configuration of the memory device 1 according to the first embodiment.

The memory device 1 according to the second embodiment has a configuration similar to that of the memory device 1 according to the first embodiment, described with reference to FIGS. 1 to 5.

The memory device 1 according to the second embodiment is, for example, a magnetoresistive random access memory (MRAM) that is a magnetic memory device based on perpendicular magnetic technology, which uses, as memory elements, variable resistance elements that exhibit a tunneling magnetoresistance (TMR) effect through magnetic tunnel junctions (MTJs). The TMR effect is a phenomenon where the magnetization direction of a ferromagnet is changed by, for example, application of a magnetic field, causing a change in electric resistance when a tunnel current flows thereby.

Figure 27:
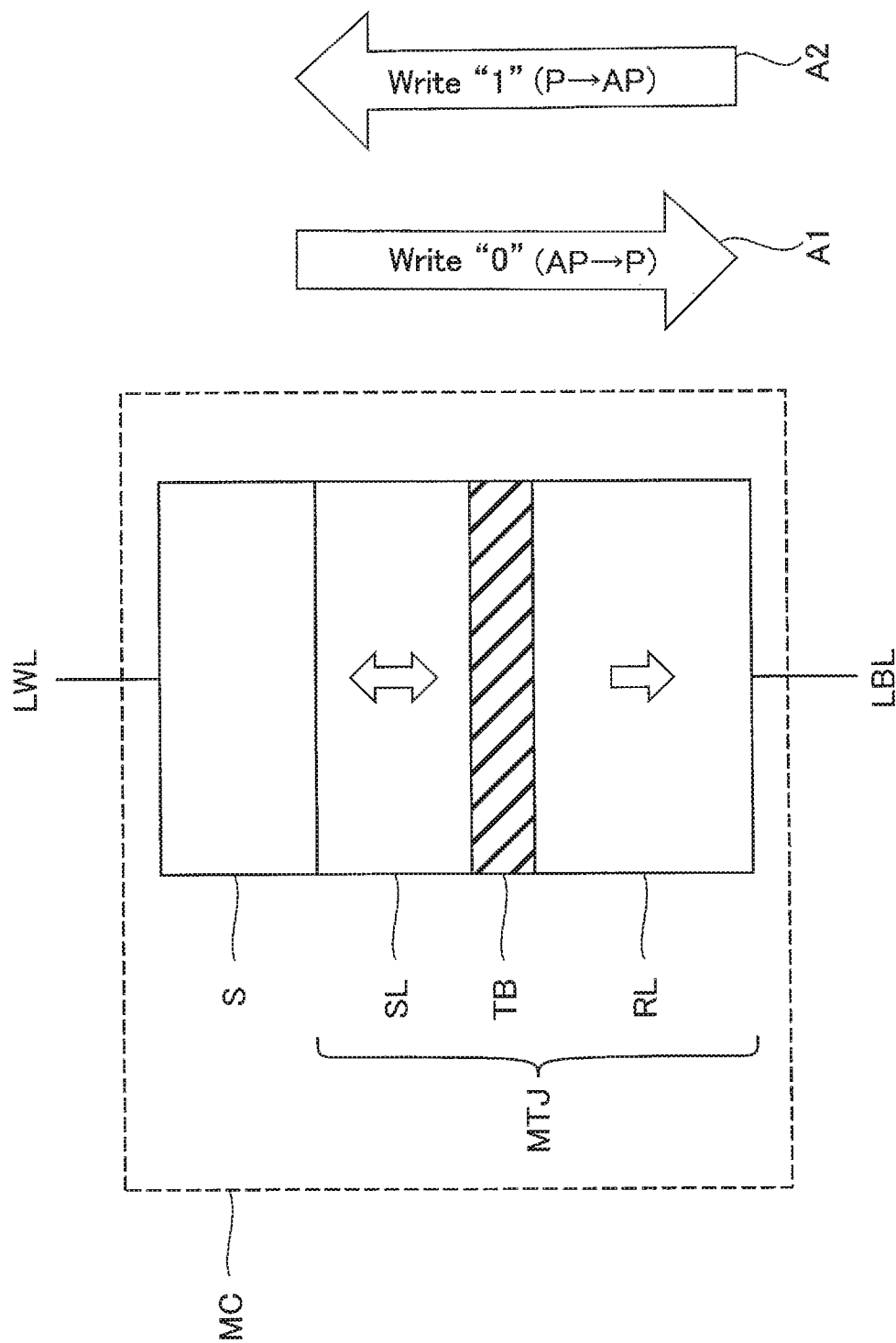
FIG. 27 is a cross-sectional view showing an example of a structure of a memory cell of a memory device according to a second embodiment.

FIG. 27 is a cross-sectional view showing an example of a structure of a memory cell MC of the memory device 1 according to the second embodiment.

The memory cell MC includes an MTJ element (assigned the symbol "MTJ" in FIG. 27) as a variable resistance element and a switching element S. In the coupling of the memory cells MC described with reference to FIG. 5, an MTJ element and a switching element S are coupled in series between a local word line LWL and a local bit line LBL.

For example, a first terminal of the switching element S is coupled to a local word line LWL, a second terminal of the switching element S is coupled to a first terminal of the MTJ element, and a second terminal of the MTJ element is coupled to a local bit line LBL.

The switching element S has a configuration, for example, similar to that of the switching element described in detail in the first embodiment.

The MTJ element includes a ferromagnet SL, a nonmagnet TB, and a ferromagnet RL. Three layers including the ferromagnet SL, the nonmagnet TB, and the ferromagnet RL are stacked in this order, for example, from the side of the first terminal to the side of the second terminal of the MTJ element.

The nonmagnet TB functions as, for example, a tunnel barrier layer. That is, the ferromagnet SL, the nonmagnet TB, and the ferromagnet RL form a magnetic tunnel junction. The ferromagnet RL has a magnetization fixed in a certain direction, and functions as, for example, a reference layer. The ferromagnet SL has, in a steady state, a variable magnetization along a certain direction, and functions as, for example, a storage layer. The steady state refers to a state in which the ferromagnet SL has no voltage applied, is not positioned in a magnetic field, and is stable after completion of the transition of the state of magnetization.

The set of the ferromagnet SL, the nonmagnet TB, and the ferromagnet RL exhibits a TMR effect. The TMR effect refers to a phenomenon in a structure including two ferromagnets with an insulator interposed therebetween, where the structure has the minimum resistance value when the orientations of the magnetizations of the two ferromagnets are parallel, and has the maximum resistance value when the orientations of the magnetizations of the two ferromagnets are antiparallel. The MTJ element may take either a low resistance state LRS or a high resistance state HRS, according to whether the magnetization direction of the ferromagnet SL is parallel or antiparallel to the magnetization direction of the ferromagnet RL.

When the magnetization direction of the ferromagnet RL and the magnetization direction of the ferromagnet SL are parallel to each other, the MTJ element has the lowest resistance value. That is, the MTJ element is set to the low resistance state LRS. This low resistance state LRS is also referred to as a "parallel (P) state". In a memory cell MC including an MTJ element in the low resistance state LRS, data "0", for example, is defined as being stored.

When the magnetization direction of the ferromagnet RL and the magnetization direction of the ferromagnet SL are antiparallel to each other, the MTJ element has the highest resistance value. That is, the MTJ element is set to the high resistance state HRS. This high resistance state HRS is also referred to as an "anti-parallel (AP) state". In a memory cell MC including an MTJ element in the high resistance state HRS, data "1", for example, is defined as being stored.

The MTJ element shown in FIG. 27 is merely an example, and may include one or more layers in addition to the above-described ones. Moreover, the coupling relationship relating to the MTJ element and the switching element S shown in FIG. 27 is merely an example, and the present embodiment is not limited thereto. For example, the ferromagnet SL, the nonmagnet TB, and the ferromagnet RL of the MTJ element may be stacked in an inverse order to the above-described one. Moreover, the switching element S and the MTJ element may be coupled between the local word line LWL and the local bit line LBL in an inverse order to the above-described one.

Next, the ferromagnet SL, the nonmagnet TB, and the ferromagnet RL will be described in more detail.

The nonmagnet TB has, for example, insulating properties, and contains a nonmagnetic material. The nonmagnet TB contains, for example, a magnesium oxide (MgO).

The ferromagnet SL has conductive properties, and contains a ferromagnetic material. The ferromagnet SL contains, for example, iron cobalt boron (FeCoB) or iron boron (FeB).

The ferromagnet RL has conductive properties, and contains a ferromagnetic material having a magnetization easy axis along a direction perpendicular to an interface between the ferromagnet RL and another layer. The ferromagnet RL contains, for example, iron cobalt boron (FeCoB) as a ferromagnet having perpendicular magnetization. The ferromagnet RL may contain at least one of cobalt platinum (CoPt), cobalt nickel (CoNi), and cobalt palladium (CoPd).

The magnetization direction of the ferromagnet RL is fixed, and is oriented toward either the ferromagnet SL side or the side opposite thereto (toward the side opposite to the ferromagnet SL side in the example of FIG. 27). The "magnetization direction" being "fixed" means that the magnetization direction is not varied by a magnetic field, a current, etc. of a magnitude that inverts the magnetization direction of the ferromagnet SL used in the present embodiment. On the other hand, the "magnetization direction" being "variable" means that the magnetization direction can be varied by a magnetic field, a current, etc. described above.

The magnetization direction of the ferromagnet SL is switchable along the magnetization easy axis, and data can be written into the memory cell MC by switching the magnetization direction of the ferromagnet SL. For that purpose, a spin injection write technique may be applied to the memory device 1. In the spin injection write technique, a write current is allowed to directly flow through the MTJ element, and the magnetization direction of the ferromagnet SL is controlled by the write current. That is, a spin transfer torque (STT) effect caused by the write current is utilized.

When a write current is allowed to flow through the MTJ element in the direction of the arrow A1 shown in FIG. 27, namely, the direction from the ferromagnet SL toward the ferromagnet RL, the magnetization direction of the ferromagnet SL becomes parallel to the magnetization direction of the ferromagnet RL. When a write current is allowed to flow through the MTJ element in the direction of the arrow A2 shown in FIG. 27, namely, the direction from the ferromagnet RL toward the ferromagnet SL, the magnetization direction of the ferromagnet SL becomes antiparallel to the magnetization direction of the ferromagnet RL.

For simplicity of description, let us assume that, when an MTJ element is in the low resistance state LRS, a memory cell MC including the MTJ element is also in the low resistance state LRS, and when an MTJ element is in the high resistance state HRS, a memory cell MC including the MTJ element is also in the high resistance state HRS.

FIG. 28 shows an example of a graph representing I-V characteristics of a memory cell MC. The horizontal axis of the graph represents the magnitude of a voltage VMC (corresponding to a potential difference between the corresponding local word line LWL and the corresponding local bit line LBL) applied to the memory cell MC. The vertical axis of the graph represents the magnitude of a cell current IMC flowing through the memory cell MC, and is represented on a log scale.

The memory cell MC exhibits different I-V characteristics according to whether the memory cell MC is in the low resistance state LRS or in the high resistance state HRS. Details will be described below.

First, a case will be described where the memory cell MC is in the high resistance state HRS.

As the voltage VMC is gradually increased, the cell current IMC continuously increases until the voltage VMC reaches a voltage VSB. When the voltage VMC is further increased, the I-V characteristics have a discontinuity at a point where the voltage VMC is the voltage VSB. That is, when the voltage VMC exceeds the voltage VSB, the cell current IMC rapidly increases from a current ISBα and reaches a current ISBH1. As the voltage VMC is further increased, the cell current IMC continuously increases from the current ISBH1. The sense amplifier 112 is, for example, capable of detecting the cell current IMC after the rapid increase.

A case will be described where the memory cell MC is in the low resistance state LRS.

As the voltage VMC is gradually increased, the cell current IMC continuously increases until the voltage VMC reaches the voltage VSB. When the voltage VMC is further increased, the I-V characteristics have a discontinuity at a point where the voltage VMC is the voltage VSB. That is, when the voltage VMC exceeds the voltage VSB, the cell current IMC rapidly increases from the current ISBα and reaches a current ISBL1. As the voltage VMC is further increased, the cell current IMC continuously increases from the current ISBL1. The sense amplifier 112 is, for example, capable of detecting the cell current IMC after the rapid increase.

The cell current IMC remains substantially the same no matter whether the memory cell MC is in the high resistance state HRS or in the low resistance state LRS, until the voltage VMC reaches the voltage VSB. Moreover, the current ISBL1 is larger than the current ISBH1. Furthermore, when the memory cell MC is in the low resistance state LRS, the cell current IMC is constantly large in relation to a certain voltage VMC after the voltage VMC exceeds the voltage VSB, in comparison with when the memory cell MC is in the high resistance state HRS.

For simplicity of description, let us assume that the phenomenon in which the cell current IMC rapidly increases to a magnitude that can be detected by the sense amplifier 112 is referred to as a "snapback phenomenon", as in the first embodiment. In the description that follows, let us also assume that the snapback phenomenon is caused by the switching element in the memory cell MC taking the conductive-state. For simplicity of description, the I-V characteristics prior to occurrence of the snapback phenomenon are referred to as "pre-snapback I-V characteristics", and the I-V characteristics after the occurrence of the snapback phenomenon within a range of the cell current IMC that can be detected by the sense amplifier 112 are referred to as "post-snapback I-V characteristics", as in the first embodiment. Moreover, the voltage VSB at which the snapback phenomenon occurs is also referred to as a "snapback voltage".

[Operation Examples]

Hereinafter, a case will be described where the memory device 1 according to the second embodiment makes a first access to a memory cell MC, and, subsequent to the first access, starts a second access to a memory cell MC within a first period of time from the start of the first access, as in the first embodiment. The memory cell MC to be the target of the first access and the memory cell MC to be the target of the second access only need to be included in an identical memory cell array MAT, and may be either identical or different, as in the first embodiment. The write operation and the read operation that will be described in detail below are merely examples, and the write operation and the read operation according to the present embodiment are not limited thereto.

(1) First Access

FIG. 29 shows an example of a write voltage and a read voltage used in a first access in the memory device 1 according to the second embodiment, on a graph representing I-V characteristics of a memory cell MC.

First, a write operation as a first access will be described.

In the write operation, the voltage VMC is brought to a voltage VPGM1 that is larger than the voltage VSB. At this time, when the select memory cell MC is in the high resistance state HRS, the cell current IMC as a write current is a current IPGMH1, and when the select memory cell MC is in the low resistance state LRS, the cell current IMC as a write current is a current IPGML1. The current IPGML1 is larger than the current IPGMH1.

In the example of FIG. 27, in a write operation to switch the select memory cell MC to the low resistance state LRS, the potential of the select local word line LWL(sel) is controlled to be higher than the potential of the select local bit line LBL(sel) by the voltage VPGM1. On the other hand, in a write operation to switch the select memory cell MC to the high resistance state HRS, the potential of the select local bit line LBL(sel) is controlled to be higher than the potential of the select local word line LWL(sel) by the voltage VPGM1. The same applies to the other write operations to be described below.

Since the cell current IMC is large when the select memory cell MC is in the low resistance state LRS compared to when the select memory cell MC is in the high resistance state HRS, the pulse width of the voltage VPGM1, for example, is decreased in a write operation to switch the select memory cell MC to the low resistance state LRS, in comparison with a write operation to switch the select memory cell MC to the high resistance state HRS.

In the write operation, the snapback phenomenon occurs, similarly to the first embodiment. In the snapback phenomenon, the switching element in the select memory cell MC is in the conductive-state, thereby generating heat in accordance therewith, similarly to the first embodiment. The generated heat causes a temperature increase at the periphery of the select memory cell MC.

Next, a read operation as a first access will be described.

In the read operation, the voltage VMC is raised to exceed the snapback voltage VSB, and then brought to a voltage VREAD1 that is smaller than the voltage VSB. At this time, when the select memory cell MC is in the high resistance state HRS, the cell current IMC is a current IREADH1, and when the select memory cell MC is in the low resistance state LRS, the cell current IMC is the current IREADL1. At this time, when the voltage VMC exceeds the voltage VSB, the cell current IMC rapidly increases, and then the cell current IMC becomes the current IREADH1 or the current IREADL1 of a magnitude that can be detected by the sense amplifier 112. The current IREADL1 is larger than the current IREADH1.

In the read operation, too, the snapback phenomenon occurs. Accordingly, the switching element in the select memory cell MC is caused to take the conductive-state, thereby generating heat in accordance therewith. The generated heat causes a temperature increase at the periphery of the select memory cell MC.

FIG. 30 shows an example of a circuit configuration relating to a read operation in the memory device 1 according to the second embodiment. The circuit configuration corresponds to the circuit configuration prepared by modifying the circuit configuration shown in FIG. 9 to change the configuration of the sense amplifier 112 coupled to the select global bit line GBL(sel).

The sense amplifier 112 includes a current source CS2, a comparator CMP2, and a p-channel MOS transistor Tr2. A voltage VNN3 is applied to an input terminal of the current source CS2, and an output terminal of the current source CS2 is coupled to the select global bit line GBL(sel). The voltage VNN3 is, for example, a voltage supplied from the controller 15. A first input terminal of the comparator CMP2 is coupled to the select global bit line GBL(sel), and a second input terminal of the comparator CMP2 is coupled to a first terminal of the transistor Tr2. A voltage VNN4 is applied to a second terminal of the transistor Tr2, and a voltage VREFin, which is a reference voltage, is applied to a gate of the transistor Tr2. The voltage VNN4 is, for example, a voltage supplied from the controller 15.

A current obtained by subtracting the cell current IMC flowing through the select memory cell MC from the constant current supplied from the current source CS2 is supplied to the first input terminal of the comparator CMP2. A Current based on the voltage VNN4 and the voltage VREFin is supplied to the second input terminal of the comparator CMP2. A signal indicating a magnitude relationship between the currents respectively supplied to the first and second input terminals of the comparator CMP2 is output from the output terminal of the comparator CMP2.

For example, the potential of the select local bit line LBL(sel) is made higher than the potential of the select local word line LWL(sel) by the voltage VREAD1. At this time, when the select memory cell MC is in the low resistance state LRS, the cell current IMC is the current IREADL1, and when the select memory cell MC is in the high resistance state HRS, the cell current IMC is the current IREADH1. Accordingly, the current supplied to the first input terminal of the comparator CMP2 is described as follows. That is, when the select memory cell MC is in the low resistance state LRS, the above-described current is a current obtained by subtracting the current IREADL1 from the constant current. When the select memory cell MC is in the high resistance state HRS, the above-described current is a current obtained by subtracting the current IREADH1 from the constant current.

A current that is larger than the above-described current when the select memory cell MC is in the low resistance state LRS and smaller than the above-described current when the select memory cell MC is in the high resistance state HRS is supplied to the second input terminal of the comparator CMP2 as a reference current. A current obtained by, for example, subtracting a current of a magnitude that is an average of the current IREADL1 and the current IREADH1 from the constant current is allowed to be supplied to the second input terminal of the comparator CMP2. This is achieved by, for example, controlling the magnitude of the voltage VREFin and/or the magnitude of the voltage VNN4. Let us assume that the voltage VREFin used in a read operation performed as a first access is a voltage VREFin1. Thereby, it is possible to perceive which of the low resistance state LRS and the high resistance state HRS the select memory cell MC is in, based on the signal output from the comparator CMP2.

(2) Second Access

In either of the cases where a write operation and a read operation are performed as a first access, a temperature increase occurs at the periphery of the select memory cell MC as a result of the performance of the first access, as described above.

FIG. 31 shows an example of variations with temperature of a graph representing a relationship between a voltage and a resistance of an MTJ element of the memory device 1 according to the second embodiment. The horizontal axis represents a voltage VMTJ applied to the MTJ element. The vertical axis of the graph represents a resistance RMTJ of the MTJ element.

When the MTJ element is in the low resistance state LRS, the resistance RMTJ is constant, regardless of the voltage VMTJ. The relationship between the voltage VMTJ and the resistance RMTJ does not change even when the temperature of the MTJ element changes.

When the MTJ element is in the high resistance state HRS, the resistance RMTJ continuously decreases, as the magnitude of the voltage VMTJ increases. As the temperature of the MTJ element increases with the voltage VMTJ kept constant, the resistance RMTJ decreases.

Next, a write operation as a second access will be described.

FIG. 32 shows an example of a write voltage used in a write operation as a second access, on a graph representing I-V characteristics of a memory cell MC.

As described with reference to FIG. 31, when the MTJ element is in the high resistance state HRS, the resistance RMTJ decreases according to the temperature increase in the MTJ element. Accordingly, as shown in FIG. 32, the post-snapback I-V characteristics of the memory cell MC in the high resistance state HRS shift to a side on which the cell current IMC increases. On the other hand, the post-snapback I-V characteristics of the memory cell MC in the low resistance state LRS do not change.

Accordingly, when the voltage VMC is brought to the voltage VPGM1, the cell current IMC as a write current of the select memory cell MC in the high resistance state HRS is larger than the current IPGMH1 in a first access. It is thus possible in a write operation to switch the select memory cell MC to the high resistance state HRS to bring the voltage VMC to a write voltage that is smaller than the voltage VPGM1, to make the write current equal to that in the case where a write operation is performed as a first access.

In the example of FIG. 32, the voltage VMC is brought to a voltage VPGM2 in a write operation to switch the select memory cell MC to the high resistance state HRS. The voltage VPGM2 is larger than the voltage VSB and smaller than the voltage VPGM1. The voltage VPGM2 is a voltage at which the cell current IMC reaches the current IPGMH1 when the voltage VMC is brought to the voltage VPGM2 in the select memory cell MC in the high resistance state HRS.

In a write operation performed as a second access to switch the select memory cell MC to the low resistance state LRS, the voltage VMC is brought to the voltage VPGM1, similarly to a write operation performed as a first access. At this time, the cell current IMC as a write current is the current IPGML1.

Figure 33:
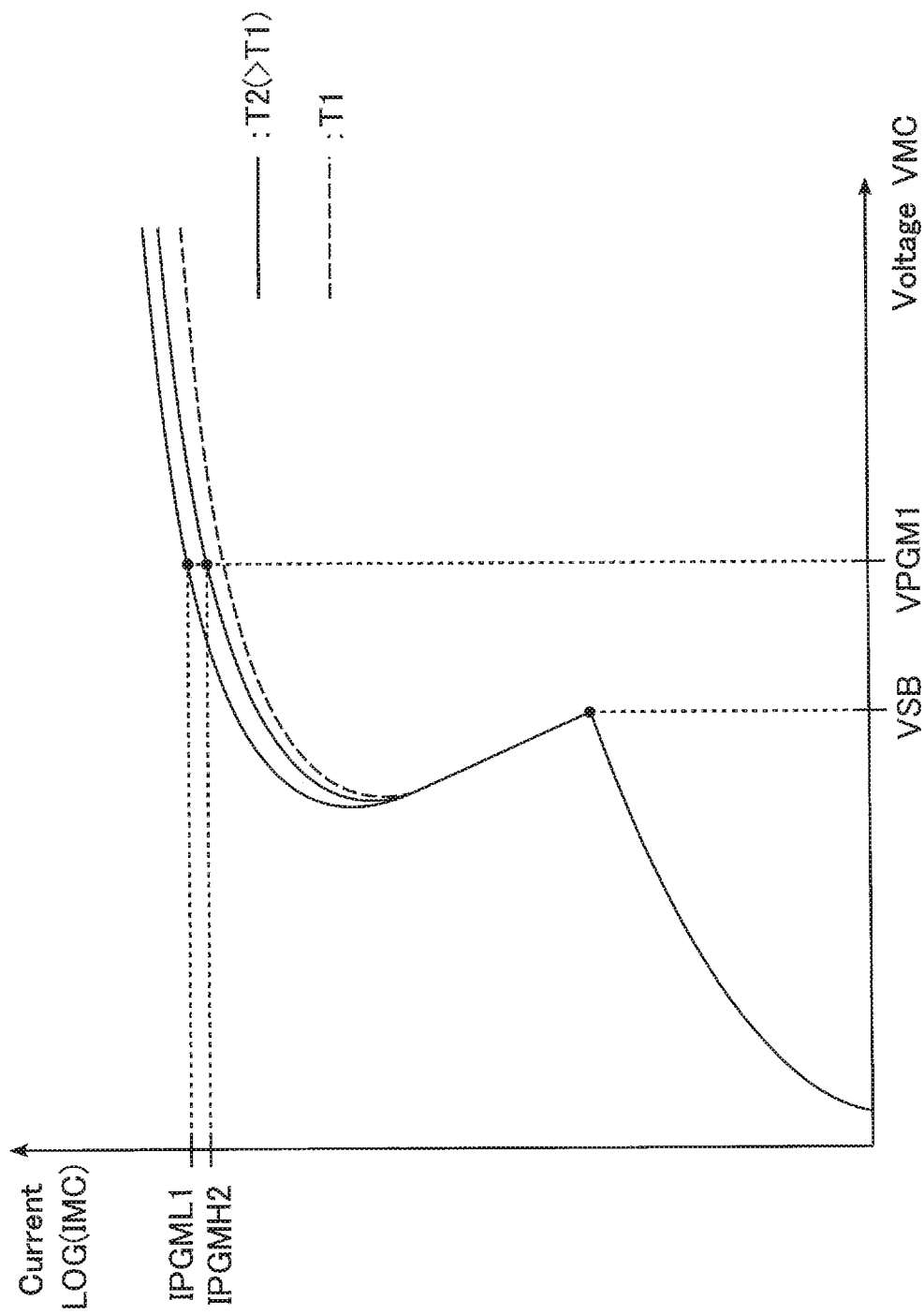
FIG. 33 shows another example of a write voltage used in a write operation as a second access in the memory device according to the second embodiment, on a graph representing I-V characteristics of a memory cell.

FIG. 33 shows another example of a write voltage used in a write operation as a second access, on a graph representing I-V characteristics of a memory cell MC.

In the write operation in the example of FIG. 33, the voltage VMC is brought to the voltage VPGM1, as in a write operation performed as a first access. At this time, the cell current IMC as a write current is a current IPGMH2 when the select memory cell MC is in the high resistance state HRS, and the cell current IMC as a write current is the current IPGML1 when the select memory cell MC is in the low resistance state LRS. The current IPGMH2 is larger than the current IPGMH1 and smaller than the current IPGML1.

In this manner, when the select memory cell MC is in the high resistance state HRS, the write current is larger than the current IPGMH1 which is the write current in a first access. Accordingly, in a write operation to switch the select memory cell MC to the high resistance state HRS, the pulse width of the voltage VPGM1, for example, can be made narrower than that in the case where a write operation is performed as a first access. On the other hand, in a write operation as a second access to switch the select memory cell MC to the low resistance state LRS, the pulse width of the voltage VPGM1 is identical to that in the case where a write operation is performed as a first access.

For the write operation as the second access, the memory device 1 performs any one of or any combination of the methods of controlling the voltage VMC described with reference to FIGS. 32 to 33.

FIG. 34 shows an example of a read voltage used in a read operation as a second access, on a graph representing I-V characteristics of a memory cell MC.

In the read operation, the voltage VMC is raised to exceed the snapback voltage VSB, and then brought to the voltage VREAD1 that is smaller than the voltage VSB, as in a read operation performed as a first access. At this time, the cell current IMC is a current IREADH2 when the select memory cell MC is in the high resistance state HRS, and the cell current IMC is the current IREADL1 when the select memory cell MC is in the low resistance state LRS. When the voltage VMC exceeds the voltage VSB, the cell current IMC rapidly increases, and then the cell current IMC becomes the current IREADH2 or the current IREADL1 of a magnitude that can be detected by the sense amplifier 112. The current IREADH2 is larger than the current IREADH1 and smaller than the current IREADL1.

At this time, the current supplied to the first input terminal of the comparator CMP2 is as follows. That is, when the select memory cell MC is in the low resistance state LRS, the above-described current is a current obtained by subtracting the current IREADL1 from the constant current. When the select memory cell MC is in the high resistance state HRS, the above-described current is a current obtained by subtracting the current IREADH2 from the constant current.

The current supplied to the second input terminal of the comparator CMP2 is made larger than the above-described current when the select memory cell MC is in the low resistance state LRS and smaller than the above-described current when the select memory cell MC is in the high resistance state HRS. The current supplied to the second input terminal of the comparator CMP2 is, for example, a current obtained by subtracting a current of a magnitude that is an average of the current IREADL1 and the current IREADH2 from the constant current. At this time, the current supplied to the second input terminal of the comparator CMP2 is, for example, smaller than the current supplied to the second input terminal when a read operation is performed as a first access. This is achieved, for example, by controlling the voltage VREFin to be a voltage VREFin2 that is higher than the voltage VREFin1 used in a read operation performed as a first access. Thereby, it is possible to perceive which of the low resistance state LRS and the high resistance state HRS the select memory cell MC is in, based on the signal output from the comparator CMP2.

In this manner, when a read operation is performed as a second access, a voltage VREFin2 that is higher than the voltage VREFin1 is used, instead of the voltage VREFin1 used in a read operation performed as a first access.

As described above, when the memory device 1 performs, as a second access, a write operation to switch the select memory cell MC to the high resistance state HRS or a read operation, a voltage different from the voltage used in the same operation performed as a first access is used. On the other hand, when the memory device 1 performs, as a second access, a write operation to switch the select memory cell MC to the low resistance state LRS, a voltage identical to the voltage used in the same operation performed as a first access is used.

In this manner, when a voltage used in a second access is made different from the voltage used in a first access, the memory device 1 may be configured in such a manner that the voltage used in the second access varies, according to at least one of: the period of time from the start of the first access to the start of the second access; the operation performed as the first access; the distance between the memory cell MC to be the target of the first access and the memory cell MC to be the target of the second access along a certain direction; and a thermal resistance between the memory cell MC to be the target of the first access and the memory cell MC to be the target of the second access, as in the configuration described in the first embodiment. Alternatively, the memory device 1 may be configured in such a manner that the voltage to be used in the second access is selected from multiple different voltages, according to at least one of: the period of time from the start of the first access to the start of the second access; the operation performed as the first access; the distance between the memory cell MC to be the target of the first access and the memory cell MC to be the target of the second access along a certain direction; and a thermal resistance between the memory cell MC to be the target of the first access and the memory cell MC to be the target of the second access.

[Advantageous Effects]

The memory device 1 according to the second embodiment makes a first access to a memory cell MC, and, subsequent to the first access, starts a second access to a memory cell MC within a first period of time from the start of the first access. A write operation or a read operation is performed as a first access. A write operation or a read operation is performed as a second access.

As a result of the performance of the first access, heat is generated by the switching element in the select memory cell MC taking the conductive-state, and the generated heat causes a temperature increase at the periphery of the select memory cell MC.

When the memory device 1 performs, as a second access, a write operation to switch the select memory cell MC to the high resistance state HRS or a read operation, a voltage different from the voltage used in the same operation performed as a first access is used. On the other hand, when the memory device 1 performs, as a second access, a write operation to switch the select memory cell MC to the low resistance state LRS, a voltage identical to the voltage used in the same operation performed as a first access is used.

When a write operation is performed as a first access, the voltage VPGM1 is used. The cell current IMC during application of the voltage VPGM1 to the select memory cell MC may allow the magnetization direction of the ferromagnet SL in the MTJ element to be inverted. As described with reference to FIG. 32, the above-described temperature increase causes the post-snapback I-V characteristics of the memory cell MC in the high resistance state HRS to shift to a side on which the cell current IMC increases. Accordingly, when the identical voltage VPGM1 is applied to the select memory cell MC in a write operation performed as a second access, the cell current IMC in the select memory cell MC in the high resistance state HRS becomes larger than the current IPGMH1, which is the cell current IMC in the first access. When the cell current IMC greatly exceeds the current necessary for inverting the magnetization direction, the magnetization direction of the ferromagnet SL may be inadvertently inverted from the intended direction. This may cause erroneous writing.

In the memory device 1 according to the second embodiment, when a write operation is performed as a second access, as described with reference to FIG. 32, a voltage VPGM2, for example, is applied to the select memory cell MC in a write operation to switch the select memory cell MC to the high resistance state HRS. The voltage VPGM2 is smaller than the voltage VPGM1. When the voltage VPGM2 is applied to the select memory cell MC in the high resistance state HRS, the cell current IMC becomes the current IPGMH1. This prevents the occurrence of erroneous writing.

In the memory device 1 according to the second embodiment, when a write operation is performed as a second access, as described with reference to FIG. 33, the voltage VPGM1 is applied to the select memory cell MC in a write operation to switch the select memory cell MC to the high resistance state HRS; however, the pulse width of the voltage, for example, is decreased compared to the first access. This achieves, for example, lower power consumption.

When a read operation is performed as a first access, the voltage VREAD1 is applied to the select memory cell MC. At this time, the cell current IMC in the select memory cell MC in the low resistance state LRS is the current IREADL1, and the cell current IMC in the select memory cell MC in the high resistance state HRS is the current IREADH1. Based on, for example, a comparison between the cell current IMC and a first comparison current, it is possible to perceive which of the low resistance state LRS and the high resistance state HRS the select memory cell MC is in. The first comparison current is a current that is larger than the current IREADH1 and smaller than the current IREADL1.

The above-described temperature increase causes the post-snapback I-V characteristics of the memory cell MC in the high resistance state HRS to shift to a side on which the cell current IMC increases. When a write operation is performed as a second access, the voltage VREAD1 is applied to the select memory cell MC. At this time, when the select memory cell MC is in the high resistance state HRS, the cell current IMC becomes a current IREADH2 that is larger than the current IREADH1. When a first comparison current identical to the above-described one is used, even when the select memory cell MC is in the high resistance state HRS, the cell current IMC when the voltage VREAD1 is applied to the select memory cell MC may become larger than the first comparison current. This may cause erroneous reading.

In the memory device 1 according to the second embodiment, when a read operation is performed as a second access, as described with reference to FIG. 34, a second comparison current which is different from the first comparison current and is larger than the current IREADH2 and smaller than the current IREADL1 is used. The second comparison current is, for example, larger than the first comparison current. This prevents the occurrence of erroneous reading.

A current obtained by subtracting the comparison current from the constant current is supplied to the second input terminal of the comparator CMP2. This comparison current is the first comparison current when a read operation is performed as a first access, and is the second comparison current when a read operation is performed as a second access. Accordingly, the current supplied to the second input terminal of the comparator CMP2 when a read operation is performed as a second access is, for example, smaller than the current supplied to the second input terminal when a read operation is performed as a first access. This is achieved by, for example, making the voltage VREFin to be a voltage VREFin2 that is higher than the voltage VREFin1 used in a read operation performed as a first access. This achieves, for example, lower power consumption.

[Modifications]

A read operation performed by the memory device 1 is not limited to the above-described one. The memory device 1 may perform, for example, a read operation that is also referred to as a "self-reference read operation". Such a read operation will be described below.

In this read operation, a first read operation, a first write operation, and a second read operation are sequentially performed on a select memory cell MC, and data stored in the select memory cell MC is determined. Based on the result of determination, a second write operation may also be performed.

(1) First Read Operation

In the first read operation, the voltage VMC is brought to the voltage VREAD1, as in a read operation as a first access described with reference to FIG. 29. At this time, the cell current IMC is the current IREADL1 when the select memory cell MC is in the low resistance state LRS, and the cell current IMC is the current IREADH1 when the select memory cell MC is in the high resistance state HRS. First read data is generated by the sense amplifier 112 based on the cell current IMC, which is the current IREADL1 or the current IREADH1.

As described with reference to FIG. 29, the temperature increase occurs at the periphery of the select memory cell MC as a result of the first read operation.

(2) First Write Operation and Second Read Operation

Next, a write operation to, for example, switch the select memory cell MC to the high resistance state HRS is performed as a first write operation. In the first write operation, similarly to the configuration described with reference to FIGS. 32 and 33, the voltage VMC is brought to a smaller voltage than the voltage VPGM1, and/or has a narrower pulse width than that in a write operation performed as a first access described with reference to FIG. 29.

As described with reference to FIG. 29, the temperature increase occurs at the periphery of the select memory cell MC as a result of the first write operation.

FIG. 35 shows an example of a read voltage applied to a select memory cell MC in a second read operation performed after a first write operation to switch the select memory cell MC to the high resistance state HRS, on a graph representing I-V characteristics of a memory cell MC.

Let us assume that the temperature of the select memory cell MC at the start of the first read operation is T1, and that the temperature of the select memory cell MC at the start of the second read operation is T3. A graph representing I-V characteristics of a memory cell MC at temperature T1 is represented by a dashed line, and a graph representing I-V characteristics of a memory cell MC at temperature T3 is represented by a solid line. As described with reference to FIG. 32, as the temperature increases from temperature T1 to temperature T3, the post-snapback I-V characteristics of the memory cell MC in the high resistance state HRS shift to a side on which the cell current IMC increases. On the other hand, the post-snapback I-V characteristics of the memory cell MC in the low resistance state LRS do not change.

In the second read operation, the voltage VMC is brought to a voltage VREAD2. The voltage VREAD2 is smaller than the voltage VREAD1. The voltage VREAD2 is a voltage at which the cell current IMC reaches the current IREADH1 when the voltage VMC is raised to the voltage VREAD2 in the select memory cell MC in the high resistance state HRS. Based on the current IREADH1, the second read data corresponding to the memory cell MC in the high resistance state HRS is generated by the sense amplifier 112.

As described with reference to FIG. 29, the temperature increase occurs at the periphery of the select memory cell MC as a result of the second read operation.

A write operation to switch the select memory cell MC to the low resistance state LRS may be performed as the first write operation. In this first write operation, similarly to the configuration described with reference to FIGS. 32 and 33, the voltage VMC is brought to the voltage VPGM1 which is equal to that in a write operation performed as a first access, described with reference to FIG. 29. In this case, too, the temperature increase occurs at the periphery of the select memory cell MC, as described with reference to FIG. 29.

In a second read operation performed after the first write operation to switch the select memory cell MC to the low resistance state LRS, the voltage VMC is brought to the voltage VREAD1. At this time, since the select memory cell MC is in the low resistance state LRS, the cell current IMC becomes the current IREADL1, as shown in FIG. 35. Based on the current IREADL1, the second read data corresponding to the memory cell MC in the low resistance state LRS is generated by the sense amplifier 112. In this case, too, the temperature increase occurs at the periphery of the select memory cell MC as a result of the second read operation, as described with reference to FIG. 29.

As described above, in a second read operation, second read data corresponding to the memory cell MC in the high resistance state HRS is generated based on the current IREADH1, or second read data corresponding to the memory cell MC in the low resistance state LRS is generated based on the current IREADL1. The current IREADH1 is a current used to generate first data when the select memory cell MC is in the high resistance state HRS during the first read operation. The current IREADL1 is a current used to generate first data when the select memory cell MC is in the low resistance sate LRS during the first read operation.

That is, during the second read operation, second read data is generated using a current that may be used in generation of the first read data.

(3) Determination of Data Stored in Select Memory Cell MC

The first read data and the second read data are compared by the sense amplifier 112. It is known in advance whether the second read data corresponds to the memory cell MC in the low resistance state LRS or the memory cell MC in the high resistance state HRS.

Based on the comparison, it is determined whether the first read data corresponds to the memory cell MC in the low resistance state LRS or the memory cell MC in the high resistance state HRS.

Since the second read data is generated by using a current that may be used to generate the first read data, the precision in the determination is high.

(4) Second Write Operation

When the second read data corresponds to the memory cell MC in the low resistance state LRS and the first read data is determined as corresponding to the memory cell MC in the high resistance state HRS, a second write operation is performed. When the second read data corresponds to the memory cell MC in the high resistance state HRS and the first read data is determined as corresponding to the memory cell MC in the low resistance state LRS, a second write operation is performed.

When the first read data is determined to correspond to the memory cell MC in the high resistance state HRS, a write operation to switch the select memory cell MC to the high resistance state HRS is performed as a second write operation. When the first read data is determined to correspond to the memory cell MC in the low resistance state LRS, a write operation to switch the select memory cell MC to the low resistance state LRS is performed as a second write operation.

When a write operation to switch the select memory cell MC to the high resistance state HRS is performed as the second write operation, similarly to the configuration described with reference to FIGS. 32 and 33, the voltage VMC is brought to a smaller voltage than the voltage VPGM1, and/or has a narrower pulse width than that in a write operation performed as a first access, described with reference to FIG. 29.

When a write operation to switch the select memory cell MC to the low resistance state LRS is performed as the second write operation, similarly to the configuration described with reference to FIGS. 32 and 33, the voltage VMC is brought to the voltage VPGM1 which is equal to that in a write operation performed as a first access, described with reference to FIG. 29.

In these cases, too, the temperature increase occurs at the periphery of the select memory cell MC as a result of the second write operation, as described with reference to FIG. 29.

Other Embodiments

The description has been given above with respect to a case where the memory device is a PCM or an MRAM; however, the memory device is not necessarily limited thereto. The technique described in detail above may be applicable to, for example, any memory device including memory cells each including a variable resistance element and a switching element, such as a resistive random access memory (ReRAM), a conductive bridge random access memory (CBRAM), etc.

If the specification uses terms such as "identical", "equal", "constant", and "maintain", variations within the design range may be tolerated.

Also, the term "applying" or "supplying" of a voltage encompasses both performing control to apply or supply the voltage, and actually applying or supplying the voltage. In addition, applying or supplying of a voltage may include, for example, applying or supplying a voltage of 0V.

In the specification of the present application, the term "couple" refers to electrical coupling, and does not exclude intervention of another component.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A memory device comprising:
a first memory cell including a variable resistance element and a switching element;
a second memory cell including a variable resistance element and a switching element; and
a read and write circuit configured to perform, as a first access, a write operation or a read operation on the first memory cell, and make a second access after the first access, wherein
data is written into or read from the second memory cell as the second access, under a condition based on a type of the first access.

2. The device according to claim 1, wherein
the condition varies depending on whether the type is a first access type or a second access type, and
when the switching element in the first memory cell takes a conductive-state in the first access, the type is the first access type, and when the switching element in the first memory cell is in a nonconductive-state in the first access, the type is the second access type.

3. The device according to claim 2, wherein
the read and write circuit is configured to use a voltage or current based on the condition in the second access, and
the voltage or current varies depending on whether the type is the first access type or the second access type.

4. The device according to claim 3, wherein
when the type is the first access type, a magnitude of the voltage or current is smaller than a magnitude of the voltage or current when the type is the second access type.

5. The device according to claim 3, wherein
when the data is read from the second memory cell as the second access, the voltage or current is used as a reference voltage or a reference current of a sense amplifier coupled to the second memory cell.

6. The device according to claim 4, wherein
when the data is written into the second memory cell as the second access, the voltage or current is a write voltage or write current applied to or supplied to the second memory cell.

7. The device according to claim 3, wherein
when the type is the first access type, a pulse width of the voltage or current is narrower than a pulse width of the voltage or current when the type is the second access type.

8. The device according to claim 3, wherein
the condition is further based on a distance or a thermal resistance between the first memory cell and the second memory cell.

9. The device according to claim 1, wherein
the first memory cell is identical to the second memory cell.

10. The device according to claim 1, wherein
the first memory cell is different from the second memory cell.

11. The device according to claim 1, wherein
the second access is started within a first period of time from a start of the first access.

12. The device according to claim 11, wherein
the first period of time is twice longer one of a period of time for the write operation to be performed as the first access and a period of time for the read operation to be performed as the first access.

13. A memory device comprising:
a first memory cell including a variable resistance element and a switching element;
a second memory cell including a variable resistance element and a switching element; and
a read and write circuit configured to perform, as a first access, a write operation or a read operation on the first memory cell, and make a second access after the first access, wherein
data is written into or read from the second memory cell, as the second access, under a condition based on or not based on a distance or a thermal resistance between the first memory cell and the second memory cell, and
whether the condition is based on or not based on the distance or the thermal resistance depends on a type of the second access.

14. The device according to claim 13, wherein
the switching element in the first memory cell takes a conductive-state in the first access.

15. The device according to claim 14, wherein
when the second access is a read operation, the condition is based on the distance or the thermal resistance.

16. The device according to claim 14, wherein
when the second access is a write operation to switch the variable resistance element in the second memory cell to a high resistance state, the condition is based on the distance or the thermal resistance, and
when the second access is a write operation to switch the variable resistance element in the second memory cell to a low resistance state, the condition is not based on the distance or the thermal resistance.

17. The device according to claim 14, wherein
when the second access is a write operation to switch the variable resistance element in the second memory cell to a high resistance state, the condition is not based on the distance or the thermal resistance, and
when the second access is a write operation to switch the variable resistance element in the second memory cell to a low resistance state, the condition is based on the distance or the thermal resistance.

18. The device according to claim 14, wherein
the first memory cell is identical to the second memory cell.

19. The device according to claim 14, wherein
the first memory cell is different from the second memory cell.

20. The device according to claim 13, wherein
the second access is started within a first period of time from a start of the first access.

21. The device according to claim 20, wherein
the first period of time is twice longer one of a period of time for the write operation to be performed as the first access and a period of time for the read operation to be performed as the first access.

* * * * *